United States Patent
Cui et al.

(10) Patent No.: US 10,135,207 B2
(45) Date of Patent: Nov. 20, 2018

(54) HIGH-SPEED DATA COMMUNICATIONS CONNECTOR

(71) Applicant: Leviton Manufacturing Co., Inc., Melville, NY (US)

(72) Inventors: Wenbo Cui, Bothell, WA (US); Jon Clark Riley, Redmond, WA (US); Bret Taylor, Seattle, WA (US); Kenn Peterson, Bothell, WA (US); Stephen M. Morton, Bothell, WA (US); Phil R. Mansur, Bothell, WA (US); Ryan C. Moore, Mill Creek, WA (US)

(73) Assignee: LEVITON MANUFACTURING CO., INC., Melville, NY (US)

( * ) Notice: Subject to any disclaimer, the term of this patent is extended or adjusted under 35 U.S.C. 154(b) by 0 days.

(21) Appl. No.: 15/419,987

(22) Filed: Jan. 30, 2017

(65) Prior Publication Data
US 2017/0222375 A1    Aug. 3, 2017

Related U.S. Application Data

(60) Provisional application No. 62/289,320, filed on Jan. 31, 2016.

(51) Int. Cl.
*H01R 24/00* (2011.01)
*H01R 24/62* (2011.01)
(Continued)

(52) U.S. Cl.
CPC .............. *H01R 24/62* (2013.01); *H01G 4/38* (2013.01); *H01G 4/40* (2013.01);
(Continued)

(58) Field of Classification Search
CPC .......................... H01R 13/6461; H01R 23/005
See application file for complete search history.

(56) References Cited

U.S. PATENT DOCUMENTS

| 3,636,500 A | 1/1972 | Sedlacek |
|---|---|---|
| 3,763,461 A | 10/1973 | Kotski |

(Continued)

FOREIGN PATENT DOCUMENTS

| CN | 101142757 | 3/2008 |
|---|---|---|
| EP | 1 443 608 | 8/2004 |

(Continued)

OTHER PUBLICATIONS

Notice of Allowance, dated Jun. 5, 2017, received in U.S. Appl. No. 15/052,630.

(Continued)

*Primary Examiner* — Tho D Ta
(74) *Attorney, Agent, or Firm* — Davis Wright Tremaine LLP; George C. Rondeau, Jr.; Heather M. Colburn

(57) ABSTRACT

A communication plug configured to be mated with a communication outlet. The plug has first contacts configured to physically contact and form electrical connections with second contacts of the outlet. The plug also includes a substrate with wire contacts and first, second, third, and fourth layers. The first layer includes first conductors connecting a first portion of the first contacts with a first portion of the wire contacts. The fourth layer includes second conductors connecting a second portion of the first contacts with a second portion of the wire contacts. The second layer includes a first plurality of capacitor plates electrically connected to first selected ones of the first contacts. The third layer includes a second plurality of capacitor plates electrically connected to second selected ones of the first contacts. Each of the first plurality of capacitor plates forms a capacitor with at least one of the second plurality of capacitor plates.

26 Claims, 39 Drawing Sheets

(51) Int. Cl.
*H01G 4/38* (2006.01)
*H01R 13/6466* (2011.01)
*H01R 13/66* (2006.01)
*H05K 1/02* (2006.01)
*H05K 1/11* (2006.01)
*H05K 1/18* (2006.01)
*H01G 4/40* (2006.01)
*H01R 13/6461* (2011.01)
*H01R 12/58* (2011.01)
*H01R 24/64* (2011.01)
*H01R 107/00* (2006.01)

(52) U.S. Cl.
CPC ....... *H01R 13/6466* (2013.01); *H01R 13/665* (2013.01); *H05K 1/0245* (2013.01); *H05K 1/116* (2013.01); *H05K 1/181* (2013.01); *H01R 12/585* (2013.01); *H01R 13/6461* (2013.01); *H01R 23/005* (2013.01); *H01R 24/64* (2013.01); *H01R 2107/00* (2013.01); *H05K 2201/10015* (2013.01)

(56) References Cited

U.S. PATENT DOCUMENTS

| | | | |
|---|---|---|---|
| 3,845,455 A | 10/1974 | Shoemaker | |
| 3,975,076 A | 8/1976 | Shida et al. | |
| 4,682,835 A | 7/1987 | Aujla et al. | |
| 4,749,366 A | 6/1988 | McCaffery | |
| 4,847,711 A | 7/1989 | Inoue | |
| 4,870,227 A | 9/1989 | Saen et al. | |
| 4,897,040 A | 1/1990 | Gerke et al. | |
| 4,909,754 A | 3/1990 | Paradis | |
| 4,973,258 A | 11/1990 | Fusselman | |
| 4,973,261 A | 11/1990 | Hatagishi | |
| 5,131,863 A | 7/1992 | Gerke et al. | |
| 5,230,632 A | 7/1993 | Baumberger et al. | |
| 5,281,176 A | 1/1994 | Yahagi et al. | |
| 5,501,607 A | 3/1996 | Yoshioka et al. | |
| 5,533,910 A | 7/1996 | Korner et al. | |
| 5,547,405 A | 8/1996 | Pinney | |
| 5,836,782 A | 11/1998 | Odley et al. | |
| 5,848,911 A | 12/1998 | Garcin | |
| 6,142,817 A | 11/2000 | Lee | |
| 6,371,793 B1 | 4/2002 | Doorhy et al. | |
| 6,379,157 B1 | 4/2002 | Curry et al. | |
| 6,431,903 B1 | 8/2002 | Dittmann et al. | |
| 6,595,696 B1 | 7/2003 | Zallak | |
| 6,764,222 B1 | 7/2004 | Szilagyi et al. | |
| 6,786,776 B2 | 9/2004 | Itano et al. | |
| 6,796,806 B2 | 9/2004 | Boutros et al. | |
| 6,957,970 B2 | 10/2005 | Weigel et al. | |
| 7,077,670 B2 | 7/2006 | Suwa et al. | |
| 7,086,909 B2 | 8/2006 | Colantuono et al. | |
| 7,201,618 B2 * | 4/2007 | Ellis | H01R 13/6477 439/676 |
| 7,220,149 B2 | 5/2007 | Pharney | |
| 7,249,974 B2 | 7/2007 | Gordon et al. | |
| D565,443 S | 4/2008 | Frake | |
| 7,413,464 B1 | 8/2008 | Chen | |
| D587,201 S | 2/2009 | Allwood | |
| 7,597,568 B1 | 10/2009 | Lu | |
| 7,604,515 B2 * | 10/2009 | Siemon | H01R 13/6463 439/676 |
| D603,341 S | 11/2009 | Kawakami | |
| 7,686,642 B2 | 3/2010 | Pearson et al. | |
| 7,704,093 B2 | 4/2010 | Turkekole et al. | |
| 7,713,094 B1 | 5/2010 | Sparrowhawk | |
| 7,736,173 B2 | 6/2010 | Chen | |
| 7,736,195 B1 | 6/2010 | Poulsen et al. | |
| RE41,699 E | 9/2010 | Itano et al. | |
| 7,821,370 B1 | 10/2010 | Shu et al. | |
| 7,824,231 B2 | 11/2010 | Marti et al. | |
| 7,857,655 B2 | 12/2010 | Gyagang et al. | |
| 7,909,656 B1 | 3/2011 | Erickson et al. | |
| 7,967,645 B2 | 6/2011 | Marti et al. | |
| 7,976,334 B2 | 7/2011 | Bishop | |
| 8,038,482 B2 | 10/2011 | Erickson et al. | |
| D649,971 S | 12/2011 | Lyford | |
| 8,100,705 B2 | 1/2012 | Chen et al. | |
| 8,128,436 B2 | 3/2012 | Bopp et al. | |
| 8,137,141 B2 | 3/2012 | Straka et al. | |
| 8,198,536 B2 | 6/2012 | Clark | |
| D663,273 S | 7/2012 | Lyford | |
| D668,226 S | 10/2012 | Lyford | |
| 8,475,201 B2 | 7/2013 | Pirlo | |
| 8,690,459 B2 | 4/2014 | Lin et al. | |
| D714,293 S | 9/2014 | Kelly | |
| D721,036 S | 1/2015 | Kreitzer | |
| 8,968,035 B2 * | 3/2015 | Hashim | H01B 11/04 439/676 |
| D729,806 S | 5/2015 | Park | |
| D731,489 S | 6/2015 | Langhammer | |
| D732,536 S | 6/2015 | Kang | |
| D733,142 S | 6/2015 | Solomon | |
| 9,147,977 B2 | 9/2015 | Poulsen et al. | |
| D743,398 S | 11/2015 | Smith | |
| D745,523 S | 12/2015 | Magi | |
| D746,291 S | 12/2015 | Solomon | |
| 9,251,930 B1 | 2/2016 | McNutt | |
| 9,257,805 B2 | 2/2016 | Wang | |
| D752,590 S | 3/2016 | Bragg et al. | |
| 2001/0049214 A1 | 12/2001 | Billman | |
| 2004/0142589 A1 | 7/2004 | Caveney | |
| 2005/0245125 A1 | 11/2005 | Colantuono | |
| 2005/0277340 A1 | 12/2005 | Gordon et al. | |
| 2006/0030184 A1 | 2/2006 | Sakaki | |
| 2006/0094273 A1 | 5/2006 | Mine et al. | |
| 2007/0049079 A1 | 3/2007 | Nalwad et al. | |
| 2008/0105449 A1 | 5/2008 | Kenny et al. | |
| 2008/0311797 A1 | 12/2008 | Aekins | |
| 2009/0017656 A1 | 1/2009 | Lee | |
| 2009/0104821 A1 | 4/2009 | Marti et al. | |
| 2010/0009567 A1 | 1/2010 | Gyagang et al. | |
| 2010/0029122 A1 | 2/2010 | Ferrus et al. | |
| 2010/0035471 A1 | 2/2010 | Gaidosch | |
| 2010/0041527 A1 | 2/2010 | Miller | |
| 2010/0206609 A1 | 8/2010 | Glew | |
| 2012/0015536 A1 | 1/2012 | Huang et al. | |
| 2012/0094525 A1 | 4/2012 | Maranto et al. | |
| 2012/0184118 A1 | 7/2012 | Lee et al. | |
| 2012/0202389 A1 | 8/2012 | Erickson | |
| 2013/0164967 A1 | 6/2013 | Lu | |
| 2013/0248221 A1 | 9/2013 | Booth et al. | |
| 2013/0260581 A1 | 10/2013 | Kuo et al. | |
| 2014/0057485 A1 | 2/2014 | Huang | |
| 2014/0273626 A1 | 9/2014 | Sparrowhawk | |
| 2015/0229078 A1 | 8/2015 | Caveney et al. | |
| 2015/0295350 A1 | 10/2015 | Bragg | |
| 2016/0036179 A1 | 2/2016 | Bragg et al. | |
| 2016/0172794 A1 | 6/2016 | Sparrowhawk et al. | |
| 2016/0240986 A1 | 8/2016 | Bragg | |

FOREIGN PATENT DOCUMENTS

| | | |
|---|---|---|
| EP | 1 753 093 | 2/2007 |
| FR | 2 982 431 | 5/2013 |
| GB | 2343558 | 5/2000 |
| JP | 2006-318801 | 11/2006 |
| WO | 2000051206 | 8/2000 |
| WO | 2005025007 | 3/2005 |
| WO | 2011087480 | 7/2011 |
| WO | 2013063233 | 5/2013 |
| WO | 2015056246 | 4/2015 |

OTHER PUBLICATIONS

Extended European Search Report, dated Aug. 28, 2017, received in European Application No. 15 780 127.

English Abstract of Japanese Patent Publication No. 2006-318801, published Nov. 24, 2006.

(56) References Cited

OTHER PUBLICATIONS

PCT International Search Report and Written Opinion in International application No. PCT/US2015/025621, dated Aug. 10, 2015.
PCT International Search Report and Written Opinion in International application No. PCT/US2016/056374, dated Jan. 24, 2017.
PCT International Search Report and Written Opinion in International application No. PCT/US2016/056499, dated Jan. 29, 2017.
Non-Final Office Action, dated Apr. 13, 2016, received in U.S. Appl. No. 14/883,267.
Non-Final Office Action, dated Apr. 13, 2016, received in U.S. Appl. No. 14/685,379.
Non-Final Office Action, dated Jul. 21, 2016, received in U.S. Appl. No. 14/883,415.
Notice of Allowance, dated Dec. 13, 2016, received in U.S. Appl. No. 15/135,870.
Information Disclosure Statement Transmittal filed herewith.
PCT International Search Report and Written Opinion in International application No. PCT/US2017/015709, dated May 17, 2017.
Non-Final Office Action, dated Apr. 26, 2017, received in U.S. Appl. No. 15/341,933.
Office Action, dated Jul. 11, 2018, received in European Application No. 15 780 127.

* cited by examiner

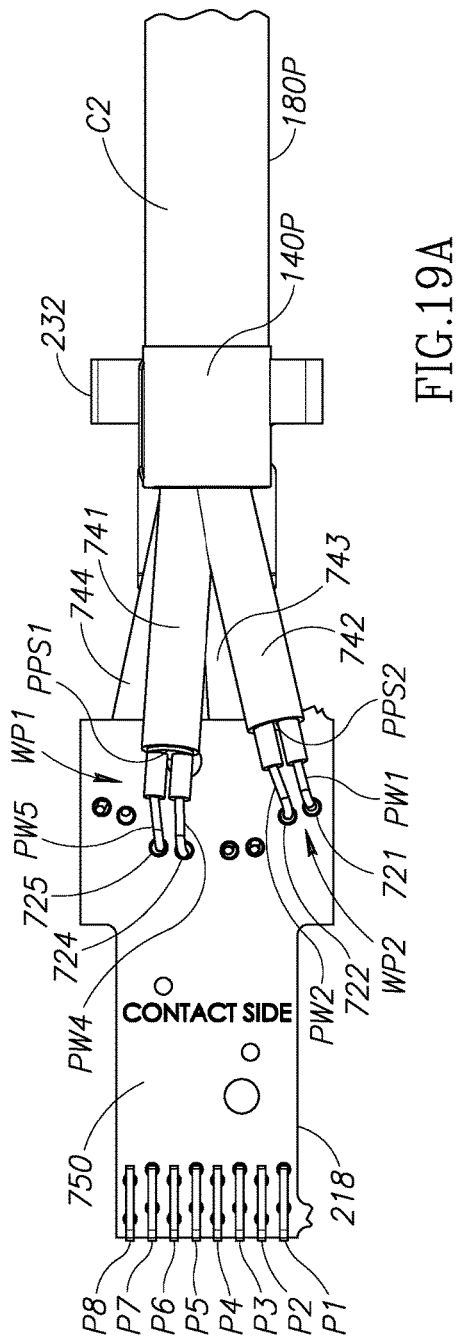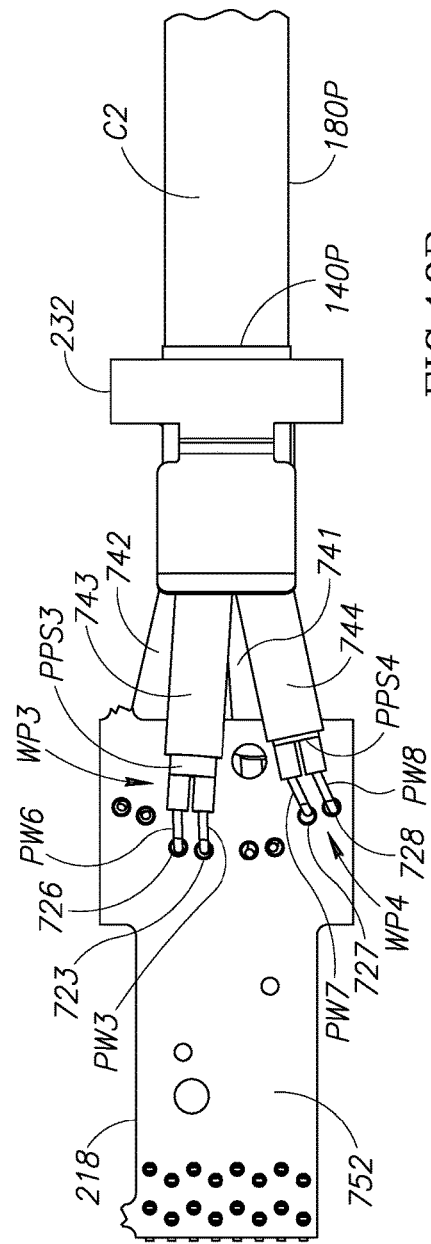
FIG.19A
FIG.19B

HIGH-SPEED DATA COMMUNICATIONS CONNECTOR

CROSS REFERENCE TO RELATED APPLICATION(S)

This application claims the benefit of U.S. Provisional Application No. 62/289,320, filed on Jan. 31, 2016, which is incorporated herein by reference in its entirety.

BACKGROUND OF THE INVENTION

Field of the Invention

The present invention is directed generally to communication connectors configured to transmit high-speed data.

Description of the Related Art

As demand for higher data transmission rates increases, new standards are developed to meet that need. For example, a standard for category 8 cabling was under development by the TR42.7 Engineering Subcommittee within the Telecommunication Industry Association (TIA) for approximately three years. As expected, the TIA Subcommittee published the standard for category 8 cabling in the first half of 2016 as ANSI/TIA 568-C.2-1. The standard specifies cabling and component requirements to support data transmission rates of greater than 10 Gigabits per second with a signal bandwidth of 2 Gigahertz. Therefore, a need exists for new communication connectors configured to operate at high-speed date rates. Communication connectors in compliance with category 8 or similar standards are particularly desirable. The present application provides these and other advantages as will be apparent from the following detailed description and accompanying figures.

BRIEF DESCRIPTION OF THE SEVERAL VIEWS OF THE DRAWING(S)

FIG. 19A is a top plan view of tube sections connected to the communication cable, which is connected to the substrate of FIG. 17A.

FIG. 19B is a bottom plan view of the tube sections connected to the communication cable, which is connected to the substrate of FIG. 17A.

Like reference numerals have been used in the figures to identify like structures.

DETAILED DESCRIPTION OF THE INVENTION

Figure 1:
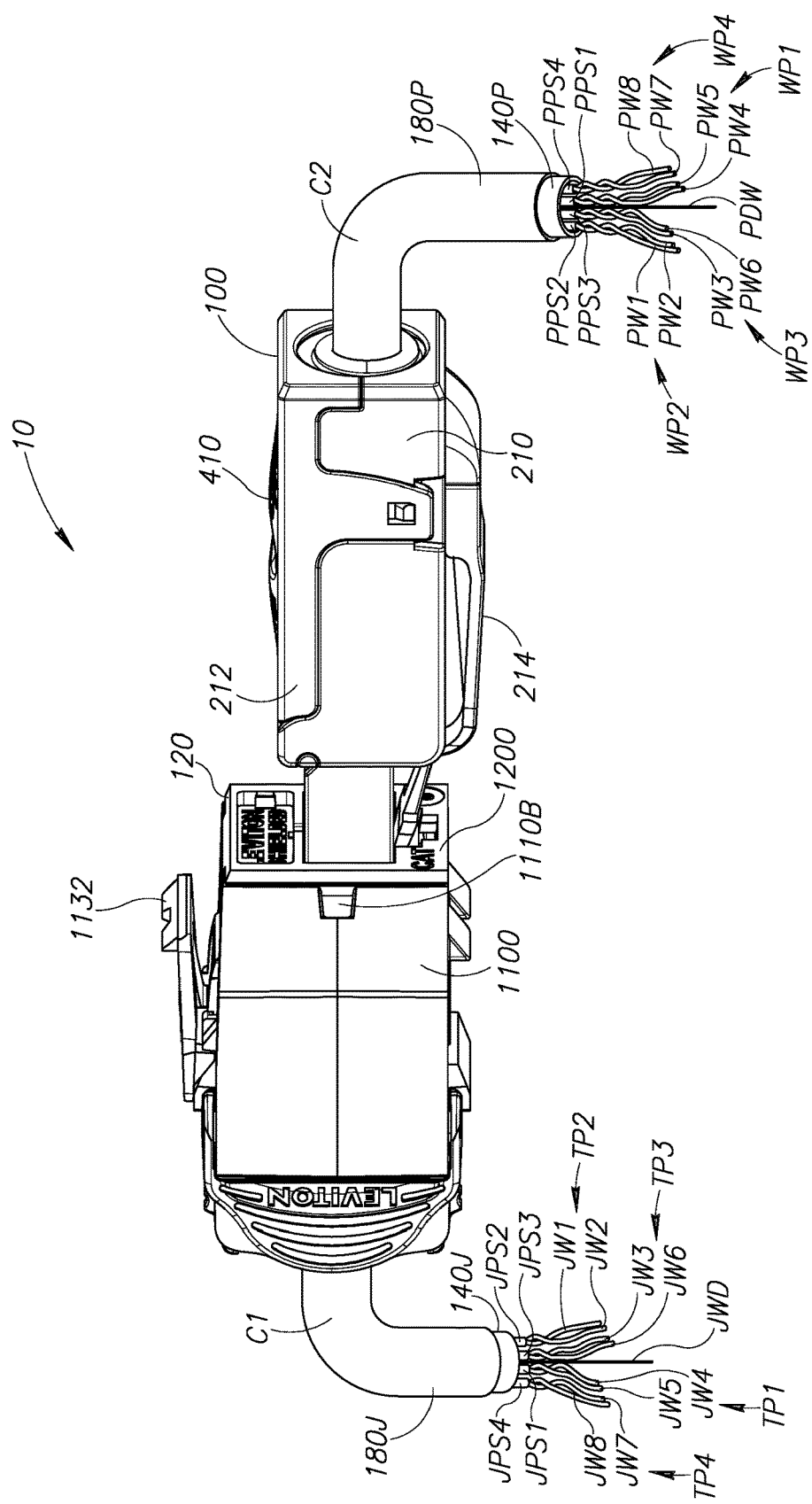
FIG. 1 is a perspective view of a connection that includes a communication plug mated with a communication outlet.

FIG. 1 is a perspective view of an assembly or connection 10 that includes a communication connector or plug 100 mated with a communication outlet 120. The outlet 120 terminates a communication cable C1 and the plug 100 terminates a communication cable C2. Thus, the connection 10 connects the cables C1 and C2 together. By way of a non-limiting example, the cables C1 and C2 may each be implemented as a category 8 class patch cord.

The plug 100 and the outlet 120 are each configured for high-speed data transmission in excess of 10 Gigabits per second. By way of a non-limiting example, the plug 100 and the outlet 120 may each transmit wide-bandwidth signals (e.g., up to 2 GHz or at higher frequencies) carrying encoded data.

In the embodiment illustrated, the plug 100 and the outlet 120 are each constructed to comply with the RJ-45 standard. The plug 100 may be implemented as a category 8, RJ-45 style plug. Alternatively, the plug 100 may be implemented as a lower category plug, such as a category 6a plug, a category 6 plug, a category 5e plug, and the like. By way of a non-limiting example, the plug 100 may be configured to comply with the ANSI/TIA 568-C.2-1 CAT8 plug standard.

The outlet 120 may be implemented as a category 8, RJ-45 style outlet, jack, or port. Alternatively, the outlet 120 may be implemented as a lower category outlet, such as a category 6a outlet, a category 6 outlet, a category 5e outlet, and the like.

For ease of illustration, the portion of the plug 100 inserted into the outlet 120 will be referred to as being the front of the plug 100. Similarly, the plug receiving side of the outlet 120 will be referred to as the front of the outlet 120.

Cables

Referring to FIG. 1, the cables C1 and C2 may be substantially identical to one another. For the sake of brevity, only the structure of the cable C1 will be described in detail. The cable C1 includes a plurality of wires JW1-JW8. The wires JW1-JW8 are arranged in four twisted pairs TP1-TP4 (also known as "twisted pairs"). The first twisted pair TP1 of the cable C1 includes the wires JW4 and JW5. The second twisted pair TP2 of the cable C1 includes the wires JW1 and JW2. The third twisted pair TP3 of the cable C1 includes the wires JW3 and JW6. The fourth twisted pair TP4 of the cable C1 includes the wires JW7 and JW8.

Optionally, each of the twisted pairs TP1-TP4 may be housed inside a pair shield. In the embodiment illustrated, the first twisted pair TP1 (wires JW4 and JW5) of the cable C1 is housed inside a first pair shield JPS1, the second twisted pair TP2 (wires JW1 and JW2) of the cable C1 is housed inside a second pair shield JPS2, the third twisted pair TP3 (wires JW3 and JW6) of the cable C1 is housed inside a third pair shield JPS3, the fourth twisted pair TP4 (wires JW7 and JW8) of the cable C1 is housed inside a fourth pair shield JPS4.

Optionally, the cable C1 may include a drain wire JDW. The optional drain wire JDW, the wires JW1-JW8, and the optional pair shields JPS1-JPS4 are housed inside a cable shield 140J. The optional drain wire JDW, the wires JW1-JW8, the cable shield 140J, and the optional pair shields JPS1-JPS4 are each constructed from one or more electrically conductive materials. The pair shields JPS1-JPS4 may be constructed from metal foil. The cable shield 140J may be implemented as a metallic braid or mesh. In such embodiments, the cable C1 does not typically require or include the optional drain wire JDW.

The drain wire JDW, the wires JW1-JW8, the optional pair shields JPS1-JPS4, and the cable shield 140J are housed inside a protective outer cable sheath or jacket 180J typically constructed from an electrically insulating material.

Optionally, the cable C1 may include additional conventional cable components (not shown) such as additional shielding, dividers, and the like.

Figure 2:
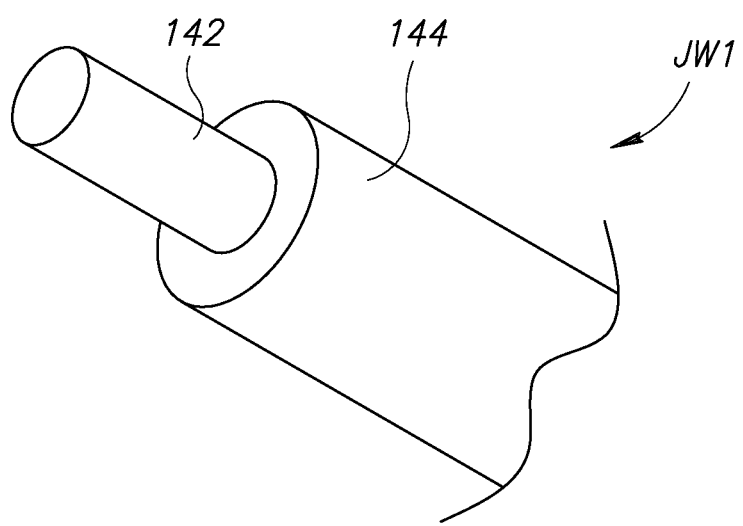
FIG. 2 is a perspective view of a wire of a communication cable.

Turning to FIG. 2, each of the wires JW1-JW8 (see FIG. 1) is substantially identical to one another. For the sake of brevity, only the structure of the wire JW1 will be described. As is appreciated by those of ordinary skill in the art, the wire JW1 as well as the wires JW2-JW8 each includes an electrical conductor 142 (e.g., a conventional solid or stranded copper wire) surrounded by an outer layer of insulation 144 (e.g., a conventional insulating flexible plastic jacket).

Returning to FIG. 1, each of the twisted pairs TP1-TP4 serves as a conductor of a differential signaling pair wherein signals are transmitted thereupon and expressed as voltage and/or current differences between the wires of the twisted pair. A twisted pair can be susceptible to electromagnetic sources including another nearby cable of similar construction. Signals received by the twisted pair from such electromagnetic sources external to the cable's jacket (e.g., the jacket 180J) are referred to as alien crosstalk. The twisted pair can also receive signals from one or more wires of the three other twisted pairs within the cable's jacket, which is referred to as "local crosstalk" or "internal crosstalk."

As mentioned above, the cables C1 and C2 may be substantially identical to one another. In the embodiment illustrated, the cable C2 includes a drain wire PDW, wires PW1-PW8, optional pair shields PPS1-PPS4, a cable shield 140P, and a cable jacket 180P that are substantially identical to the drain wire JDW, the wires JW1-JW8, the optional pair shields JPS1-JPS4, the cable shield 140J, and the cable jacket 180J, respectively, of the cable C1. Optionally, the drain wire PDW may be implemented as an excess, a grounding pigtail, or a braid. Further, the wires PW1-PW8 are arranged into the four twisted pairs WP1-WP4. The first twisted pair WP1 of the cable C2 includes the wires PW4 and PW5. The second twisted pair WP2 of the cable C2 includes the wires PW1 and PW2. The third twisted pair WP3 of the cable C2 includes the wires PW3 and PW6. The fourth twisted pair WP4 of the cable C2 includes the wires PW7 and PW8.

Plug

Figure 3:
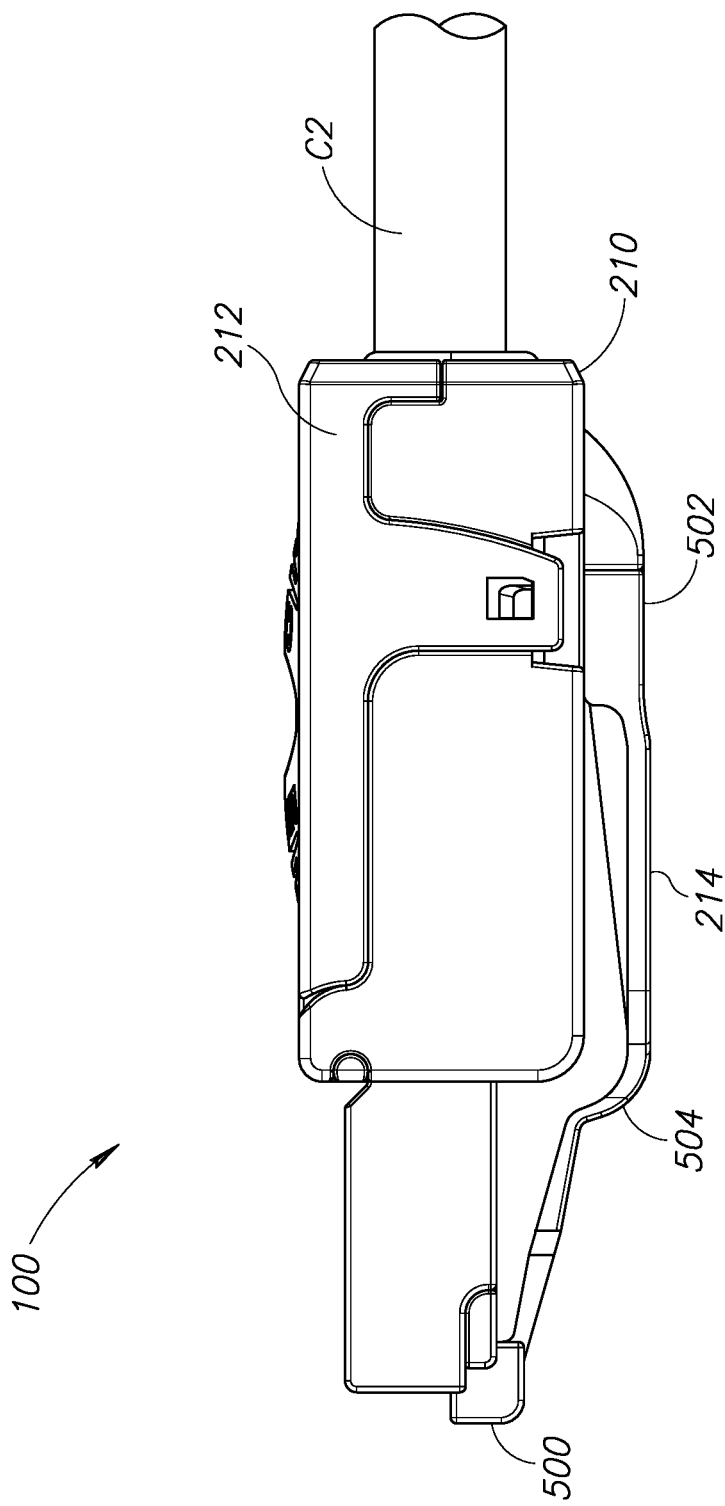
FIG. 3 is a side view of the plug of FIG. 1 connected to a communication cable.
Figure 4:
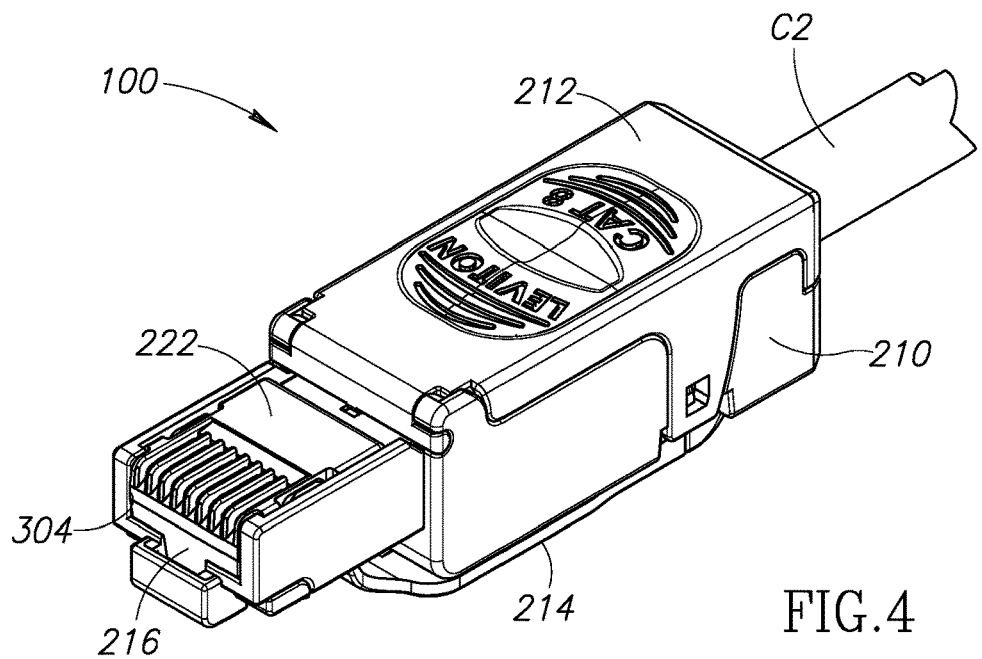
FIG. 4 is a front top perspective view of the plug of FIG. 1 connected to the communication cable.
Figure 5:
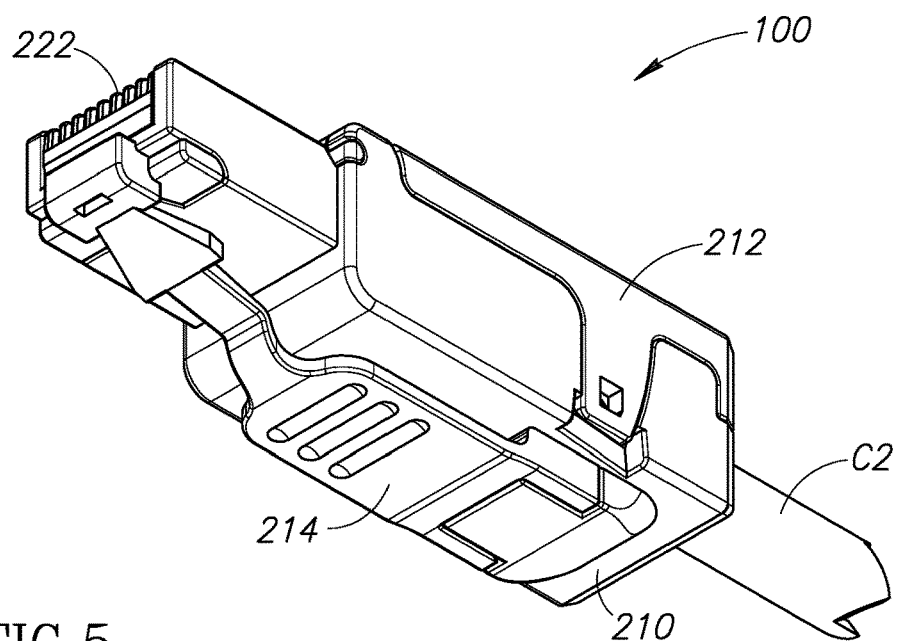
FIG. 5 is a front bottom perspective view of the plug of FIG. 1 connected to the communication cable.
Figure 6:
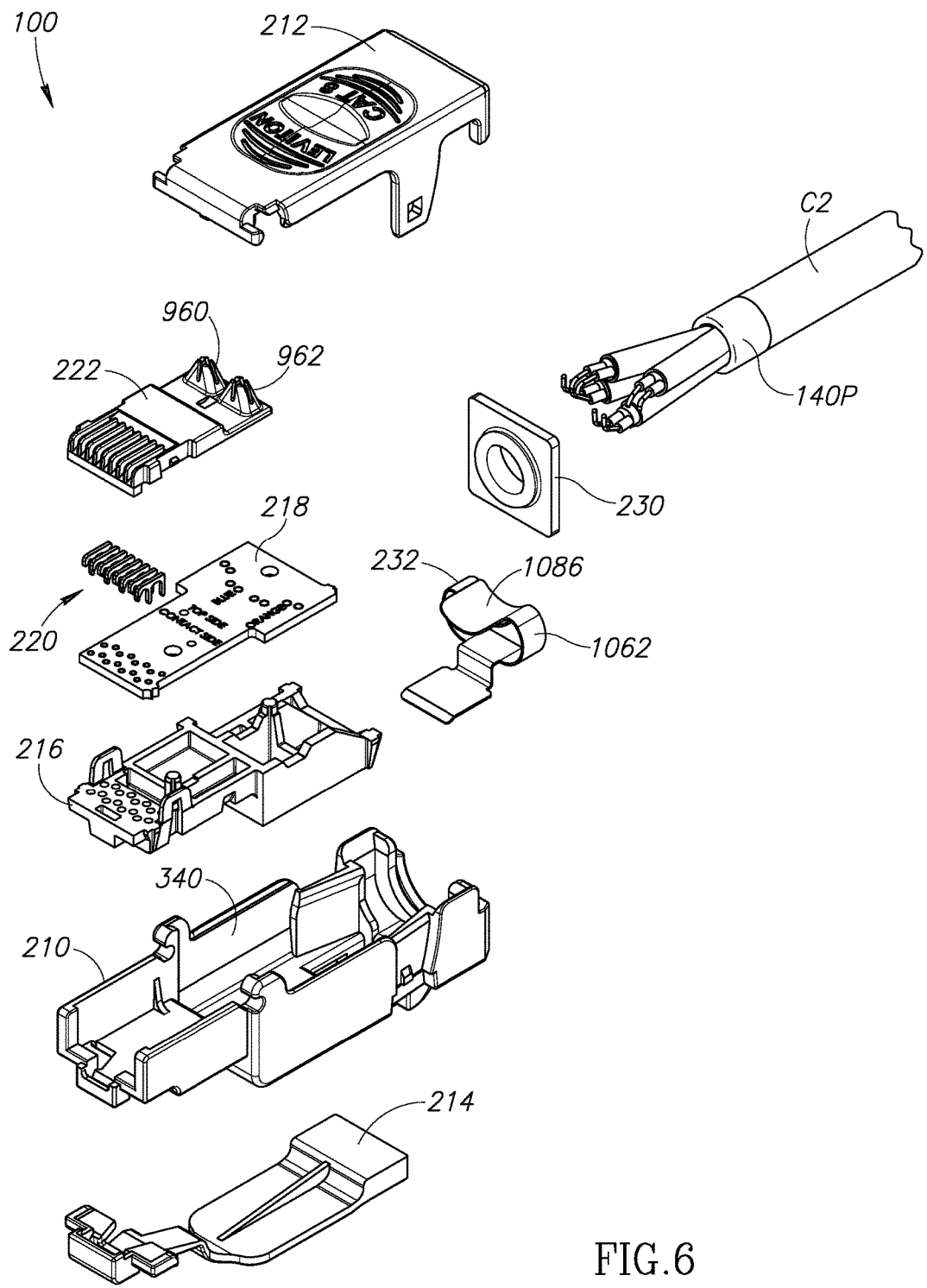
FIG. 6 is an exploded front top perspective view of the plug of FIG. 1 alongside the communication cable.

FIG. 3 is a side view of the plug 100 connected to the cable C2. FIG. 4 is a front top perspective view of the plug 100 connected to the cable C2 and FIG. 5 is a front bottom perspective view of the plug 100 connected to the cable C2. FIG. 6 is an exploded front top perspective view of the plug 100 alongside the cable C2.

Referring to FIG. 6, the plug 100 includes a housing body 210, a housing cover 212, a latch member 214, an insulator 216, a substrate 218, a plurality of plug contacts 220, a comb member 222, a strain relief member 230, and an electrically conductive ground spring 232. The housing body and cover 210 and 212 are each constructed from a substantially electrically conductive material. By way of a non-limiting example, the housing body and cover 210 and 212 may each be constructed from metal using a die-cast process.

Figure 7:
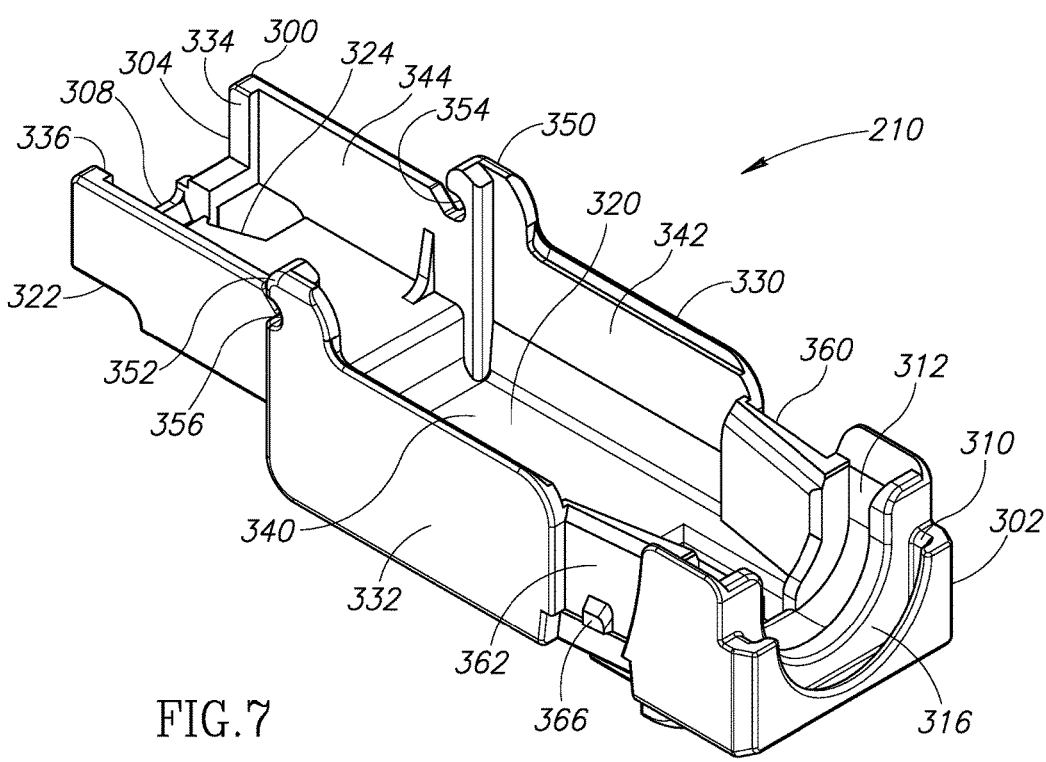
FIG. 7 is a rear top perspective view of a housing body of the plug of FIG. 1.
Figure 8:
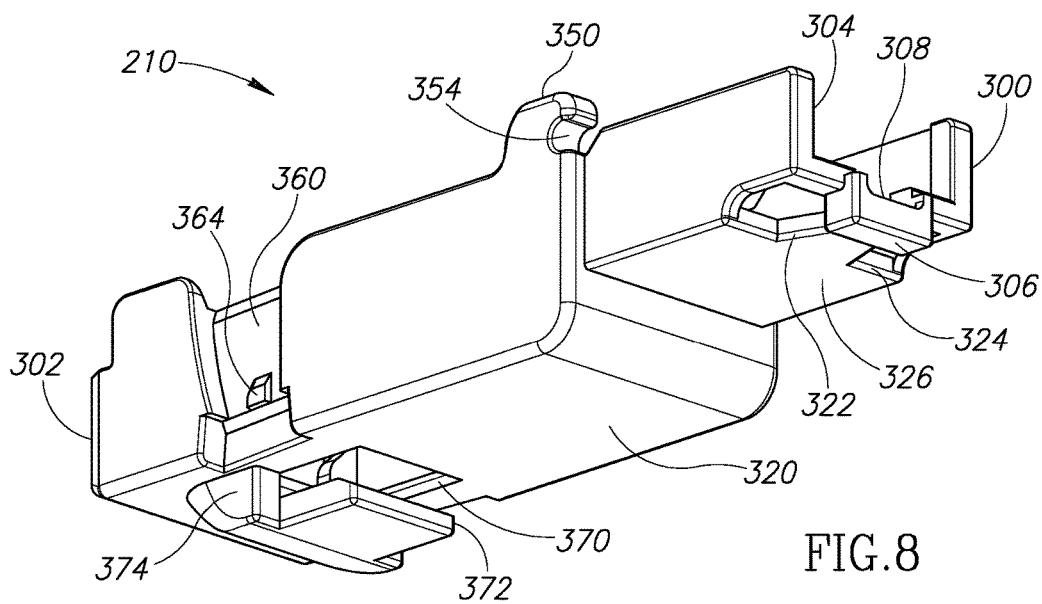
FIG. 8 is a front bottom perspective view of the housing body of FIG. 7.

Referring to FIG. 7, the housing body 210 has a front portion 300 opposite a rear portion 302. The front portion 300 is configured to be inserted into the outlet 120 (see FIGS. 1, 27, and 28) and to be removably coupled thereto by the latch member 214 (see FIGS. 1, 3-6, and 11-14). Referring to FIG. 8, the front portion 300 has a front opening 304 adjacent to a key portion 306. The key portion 306 has an upwardly extending lip 308 positioned in front of the front opening 304. As will be described below, the latch member 214 (see FIGS. 1, 3-6, and 11-14) clips onto the lip 308 and covers the key portion 306.

Figure 11:
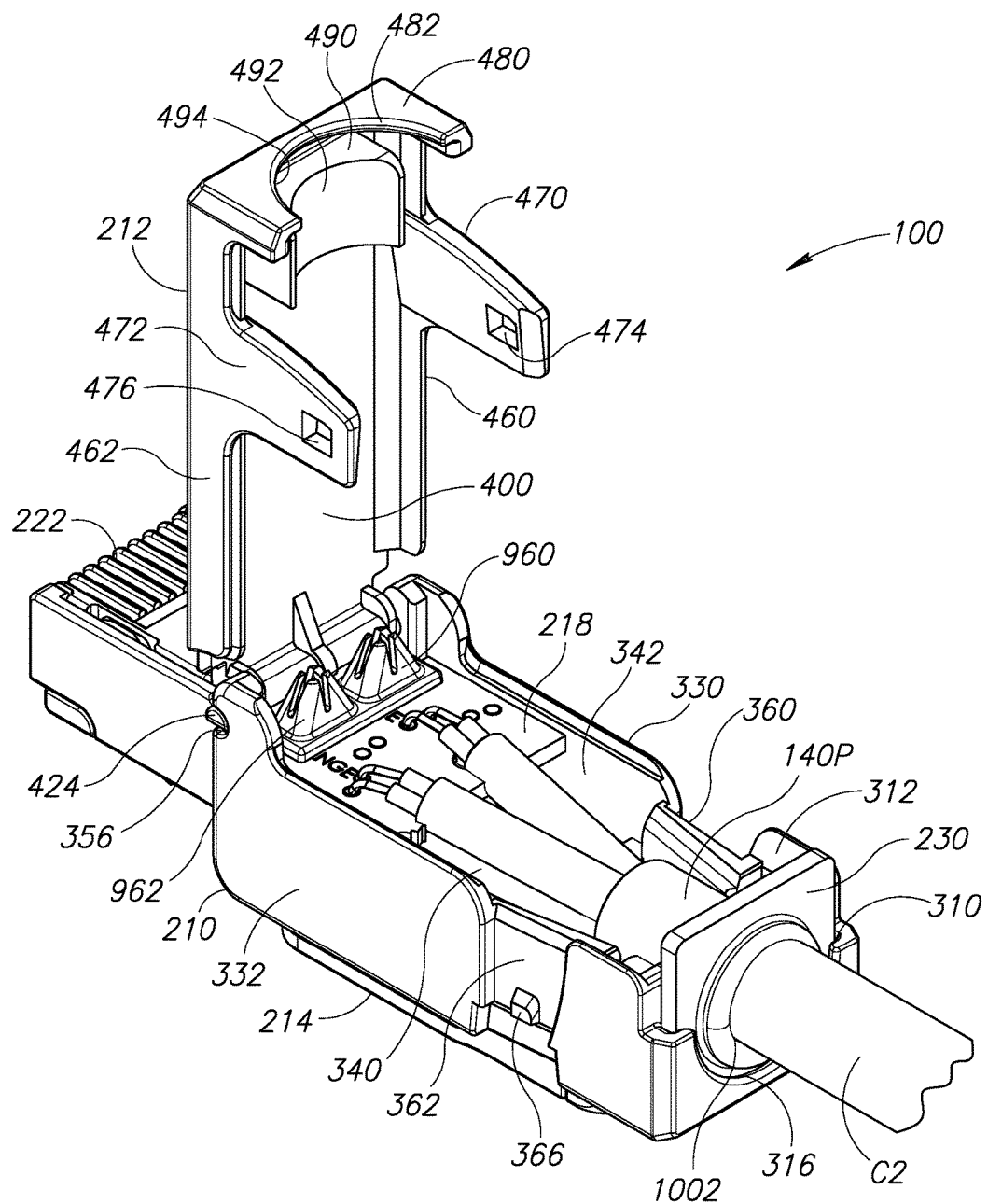
FIG. 11 is a rear top perspective view of the plug of FIG. 1 illustrated with its housing cover in an open position.

Referring to FIG. 7, the rear portion 302 includes a first slot 310 that is adjacent and substantially parallel with a second slot 312. The first and second slots 310 and 312 are configured to receive and retain the strain relief member 230 (see FIGS. 6, 11, 24A, and 26) and the ground spring 232 (see FIGS. 6, 19A, 19B, 25, and 26), respectively. A through-channel 316 extends longitudinally through the first and second slots 310 and 312. Referring to FIG. 11, the through-channel 316 is configured to allow the cable C2 to pass therethrough when the strain relief member 230 is within the first slot 310, the ground spring 232 (see FIGS. 6, 19A, 19B, 25, and 26) is within the second slot 312 under the cable C2, and the cable shield 140P is in physical contact with the ground spring 232 inside the second slot 312.

Referring to FIG. 8, the housing body 210 has a base portion 320 having spaced apart through-holes 322 and 324 formed therein near the front opening 304. The base portion 320 has a bottom outer surface 326 that will be at least partially received inside the outlet 120 (see FIGS. 1, 27, and 28) when the plug 100 (see FIGS. 1, 3-6, and 11) is mated with the outlet 120 as shown in FIG. 1. The through-holes 322 and 324 are formed in the bottom outer surface 326.

Referring to FIG. 7, extending upwardly from the base portion 320, the housing body 210 has a first longitudinally extending sidewall 330 opposite a second longitudinally extending sidewall 332. The through-holes 322 and 324 may be positioned alongside the sidewalls 330 and 332, respectively. First and second wall portions 334 and 336 extend into the front opening 304 from the sidewalls 330 and 332, respectively.

An interior chamber 340 is defined between the base portion 320 and the sidewalls 330 and 332. Referring to FIG. 6, the interior chamber 340 is configured to receive and house the insulator 216, the substrate 218, and the plug contacts 220. Referring to FIG. 7, the housing cover 212 (see FIGS. 1, 3-6, 9-11, and 26) extends across the first and second sidewalls 330 and 332 and covers a rear chamber portion 342 of the interior chamber 340. The comb member 222 (see FIGS. 4-6, 11, 15, 22, 23, and 26) is positionable inside a front chamber portion 344 to extend between the first and second sidewalls 330 and 332 and, together with the insulator 216, cover both the front chamber portion 344 and the front opening 304. In other words, the relative positioning of the comb member 222 and the insulator 216 vis-à-vis the housing body 210 closes both the front chamber portion 344 and the front opening 304 best seen in FIGS. 4, 6, 11, 14 and 15.

Referring to FIG. 7, the first and second sidewalls 330 and 332 have upwardly extending connector portions 350 and 352, respectively, with laterally extending grooves 354 and 356, respectively, formed therein. The first and second sidewalls 330 and 332 include recesses 360 and 362, respectively, with first and second tabs 364 (see FIG. 8) and 366, respectively, extending laterally outwardly therefrom.

Figure 26:
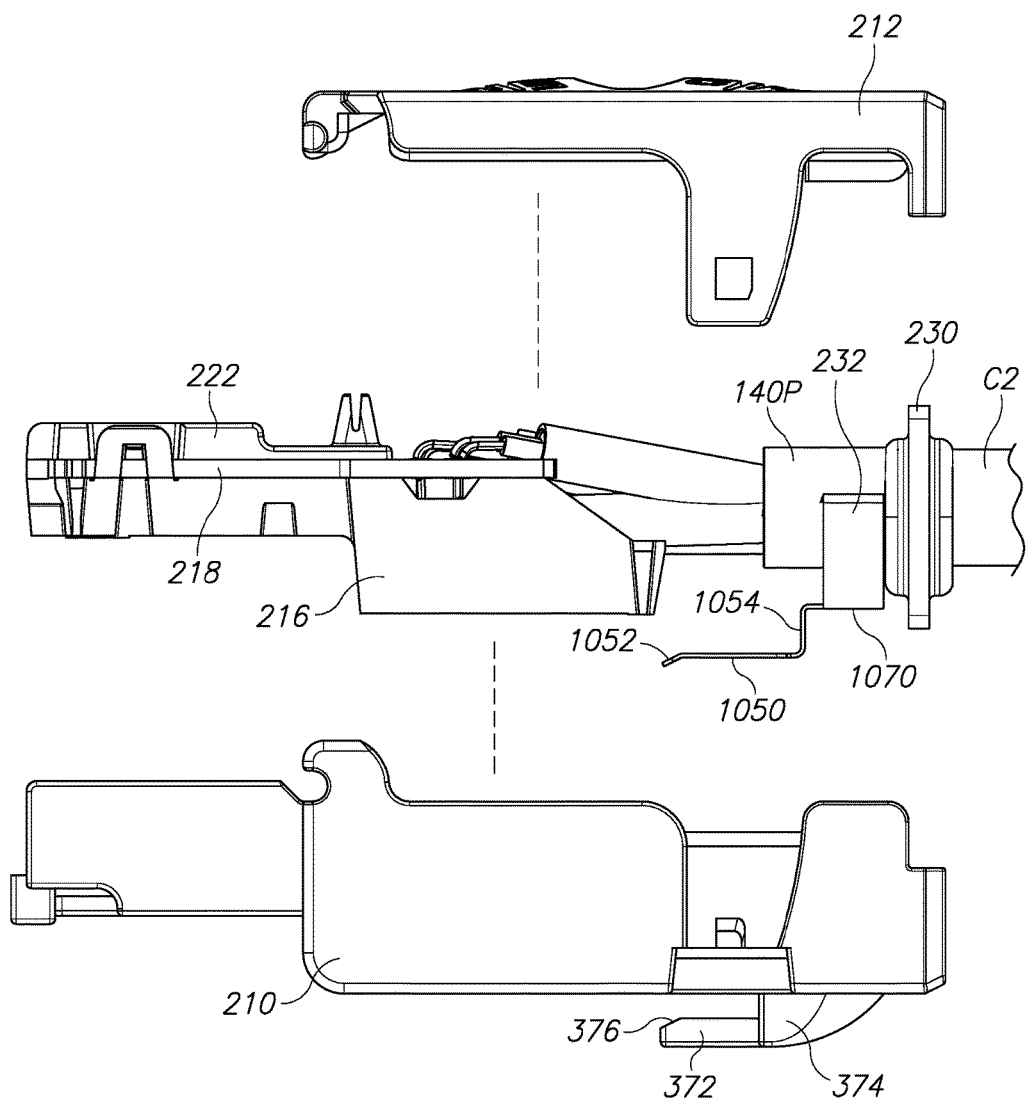
FIG. 26 is a side elevational view of the plug of FIG. 1 omitting the latch member and illustrated with the housing cover and the housing body exploded from the plug.

Referring to FIG. 8, an opening 370 is formed in the base portion 320. A shelf 372 is connected to the base portion 320 by a downwardly extending support 374. The shelf 372 is spaced apart from and positioned alongside the opening 370. Referring to FIG. 26, in the embodiment illustrated, the shelf 372 has an angled edge surface 376 opposite the support 374 that faces both forwardly and upwardly. The ground spring 232 extends from the second slot 312 (see FIGS. 7 and 11) out through the opening 370 (see FIG. 8) and rests atop the shelf 372.

Figure 9:
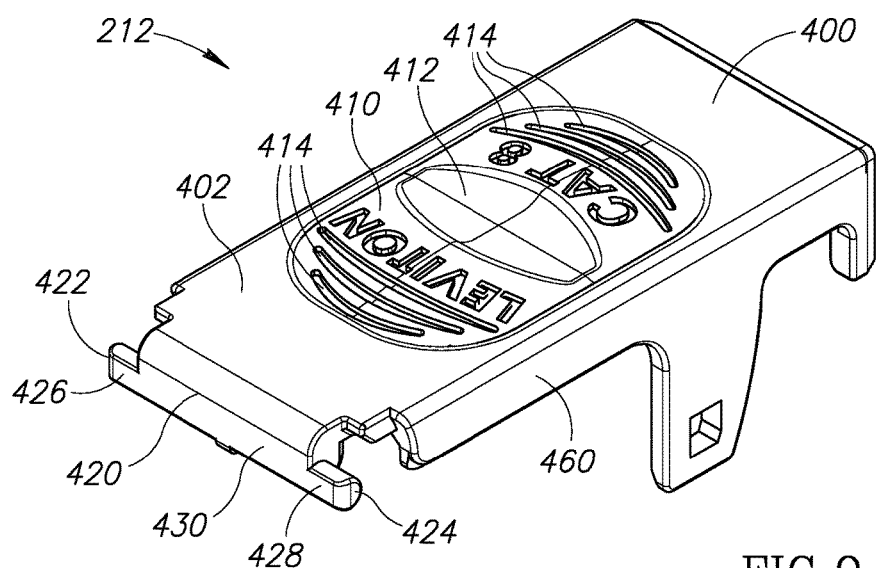
FIG. 9 is a front top perspective view of a housing cover of the plug of FIG. 1.

Referring to FIG. 11, the housing cover 212 has a substantially planar cover portion 400 configured to extend across the first and second sidewalls 330 and 332 of the housing body 210. Referring to FIG. 9, the cover portion 400 has an outwardly facing surface 402 with an embossed or raised pattern 410 formed therein. The raised pattern 410 illustrated is substantially oval and includes a depression or recess 412. The recess 412 is configured to receive a pad (not shown) of a user's finger (e.g., thumb) (not shown). Referring to FIG. 1, the raised pattern 410 may be configured to provide an ergonomic grip for the user's finger, and a tactile indication that the user's finger is correctly placed, which facilitates inserting the plug 100 into the outlet 120 and removing the plug 100 from the outlet 120. The user may apply force along an insertion direction to the raised pattern 410 when the user is either inserting the plug 100 into the outlet 120 or removing the plug 100 from the outlet 120. A lower gripping force may be required to remove the plug 100 from the outlet 120 when force is applied to the raised pattern 410. Optionally, the raised pattern 410 may include ridges or gripping projections 414. For some angles of plug insertion, the user's finger may grip the gripping projections 414 and/or the recess 412. Optionally, the raised pattern 410 includes or displays information (e.g., "Leviton" and "Cat 8") printed in raised or recessed characters. The raised pattern 410 provides a satisfactory view angle for users with respect to such information.

A front sidewall 420 extends downwardly from the cover portion 400. First and second pivot pins 422 and 424 extend laterally outwardly from the front sidewall 420. The first and second pivot pins 422 and 424 are configured to be received within the grooves 354 and 356 (see FIG. 7), respectively, and hingedly attach the housing cover 212 to the housing body 210 (see FIGS. 1, 3-8, 11, 14, and 26). The first and second pivot pins 422 and 424 are rotatable within the grooves 354 and 356 (see FIG. 7), respectively, to selectively position the housing cover 212 in a closed position (see FIGS. 1 and 3-5) or an open position (see FIG. 11) with respect to the housing body 210. In the embodiment illustrated, the first and second pivot pins 422 and 424 are each substantially cylindrical in shape but have substantially planar forwardly facing surfaces 426 and 428, respectively, that are coplanar with a frontwardly facing surface 430 of the front sidewall 420.

Figure 10:
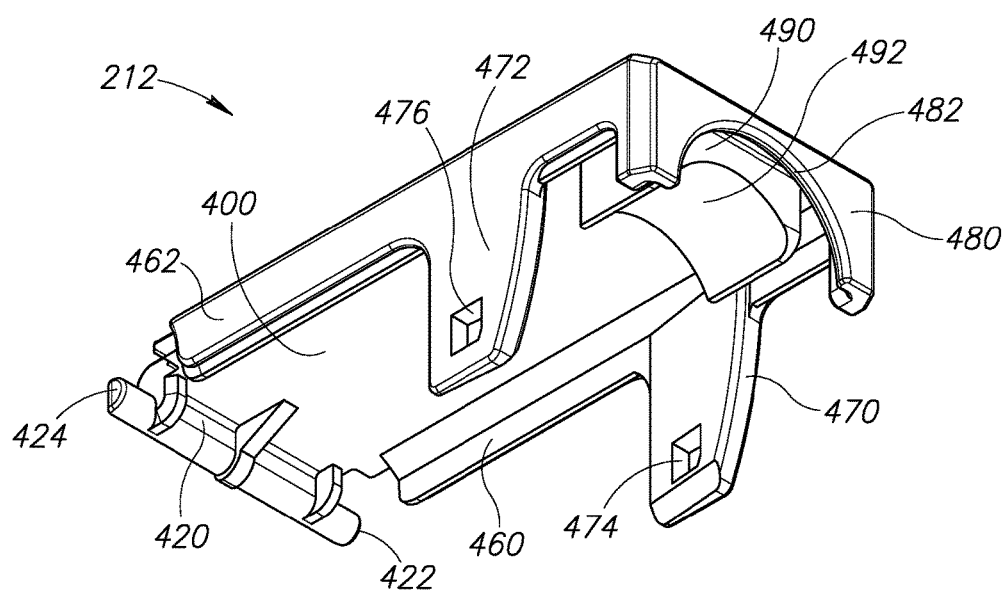
FIG. 10 is a rear bottom perspective view of the housing cover of FIG. 9.

Referring to FIG. 10, first and second sidewalls 460 and 462 extend downwardly from the cover portion 400. Referring to FIG. 11, the first and second sidewalls 460 and 462 are configured to abut the first and second sidewalls 330 and 332 of the housing body 210, respectively. The sidewalls 460 and 462 overlap with the sidewalls 330 and 332, respectively, to limit the radiation of electromagnetic energy. First and second fingers 470 and 472 extend downwardly from the first and second sidewalls 460 and 462, respectively. The fingers 470 and 472 are configured to be received within the recesses 360 and 362, respectively, which guide the fingers 470 and 472 toward the tabs 364 (see FIG. 8) and 366, respectively. The fingers 470 and 472 include openings 474 and 476, respectively, formed therein configured to receive the tabs 364 (see FIG. 8) and 366, respectively. The tabs 364 (see FIG. 8) and 366 latch the housing cover 212 in the closed position (see FIGS. 1 and 3-5).

Referring to FIG. 10, the housing cover 212 has a rear sidewall 480 that extends downwardly from the cover portion 400 and extends between the first and second sidewalls 460 and 462. Referring to FIG. 11, the rear sidewall 480 has an opening 482 configured to allow a portion of the cable C2 to pass therethrough when the strain relief member 230 is within the first slot 310 of the housing body 210. The through-channel 316 and the opening 482 are aligned laterally and together define a throughway for the cable C2 to pass through and enter the interior chamber 340 of the housing body 210. A spacer or positioning projection 490 extends inwardly from the cover portion 400 toward the cable shield 140P of the cable C2. In the embodiment illustrated, the positioning projection 490 has a curved inwardly facing surface 492 configured to conform to the outside shape of the cable shield 140P and press the cable shield 140P against the ground spring 232 (see FIGS. 6, 19A, 19B, 25, and 26) positioned within the second slot 312 below the cable shield 140P.

Referring to FIG. 11, an upper slot 494 is defined between the rear sidewall 480 and the positioning projection 490. The upper slot 494 is aligned with the first slot 310 when the housing cover 212 is in the closed position (see FIGS. 1 and 3-5). An upper portion of the strain relief member 230 is received and housed inside the upper slot 494 when the housing cover 212 is in the closed position. The strain relief member 230 may flex and/or compress as the housing cover 212 is rotated into the closed position and the strain relief member 230 slides into the upper slot 494.

Referring to FIG. 1, the latch member 214 latches the plug 100 to the outlet 120. The latch member 214 may be characterized as being a low profile, snag-free latch. By way of a non-limiting example, the latch member 214 may be constructed from nylon or a similar material. By way of another non-limiting example, the latch member 214 may be constructed from glass-filled polycarbonate or a similar material. Referring to FIG. 3, the latch member 214 is connected by its front and back ends 500 and 502 to the housing body 210. A flexible intermediate portion 504 extends between the front and back ends 500 and 502.

Figure 12:
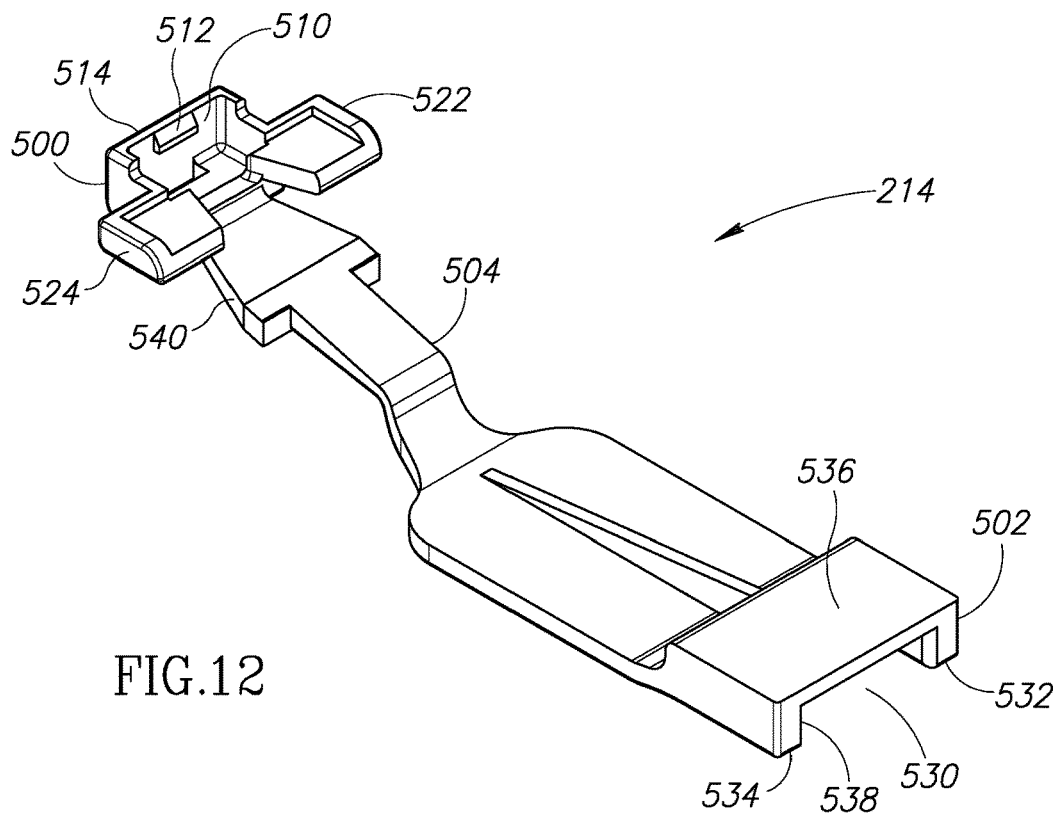
FIG. 12 is a rear top perspective view of a latch member of the plug of FIG. 1.
Figure 14:
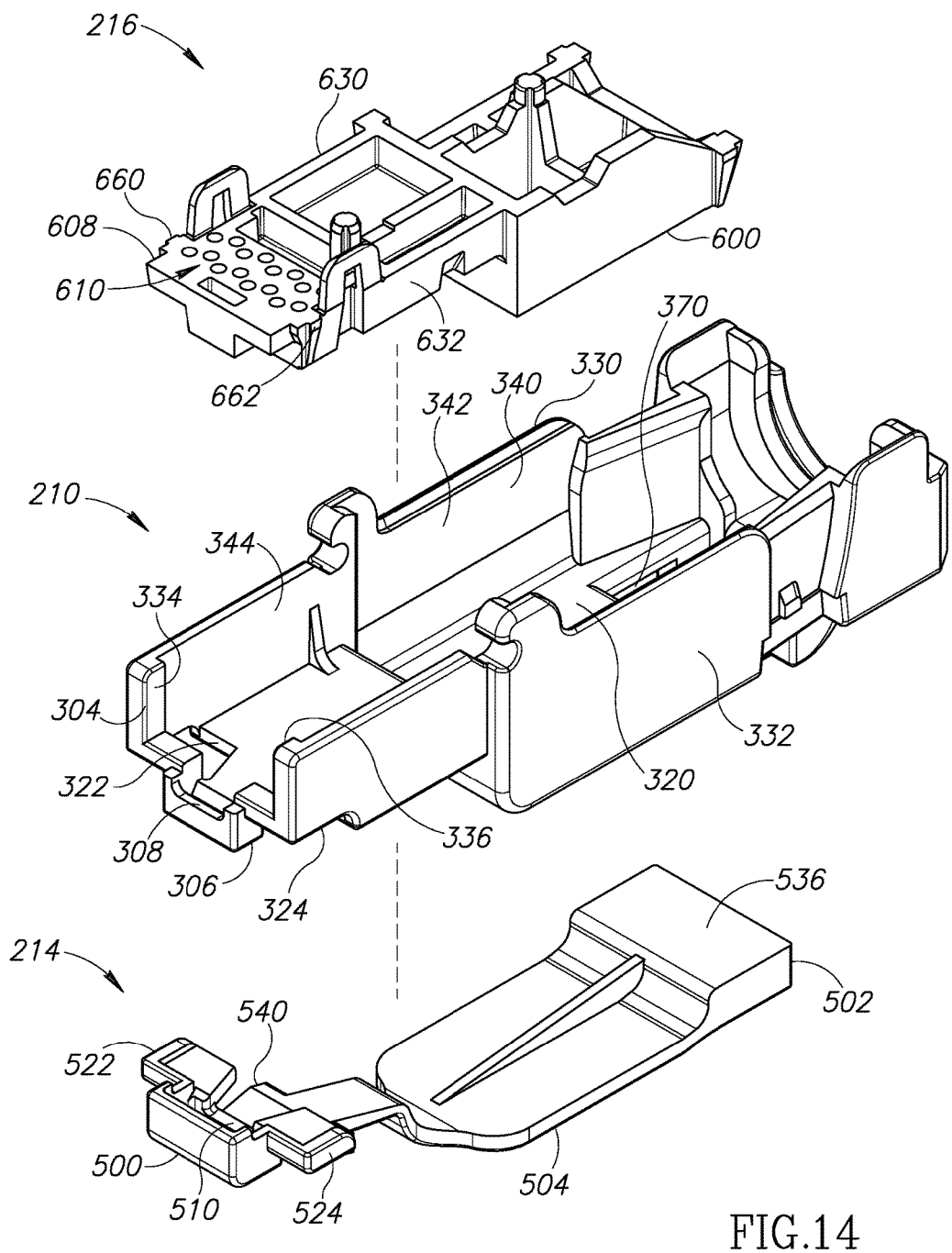
FIG. 14 is an exploded front top perspective view of an insulator, the housing body, and the latch member of the plug of FIG. 1.

Referring to FIG. 14, the front end 500 is configured to clip onto the lip 308 and cover the key portion 306 of the housing body 210. The front end 500 has a front recess 510 configured to receive the key portion 306 of the housing body 210. Referring to FIG. 12, a tab 512 extends into the front recess 510 from a front wall 514 that defines a portion of the recess 510. Referring to FIG. 14, when the key portion 306 of the housing body 210 is inside the recess 510, the tab 512 (see FIG. 12) rests atop the lip 308 and helps maintain the front end 500 on the key portion 306. The front end 500 has first and second plug portions 522 and 524 configured to be received inside and close off the through-holes 322 and 324, respectively.

Figure 13:
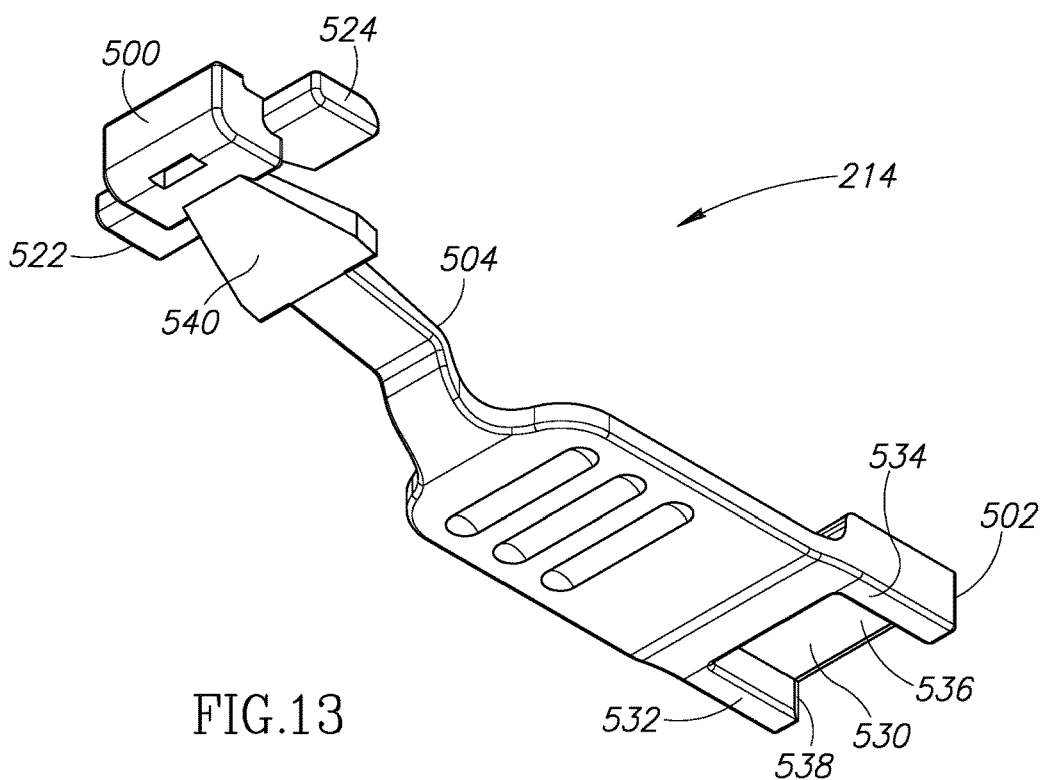
FIG. 13 is a front bottom perspective view of the latch member of FIG. 12.

Referring to FIG. 13, the back end 502 has a recess 530 defined between spaced apart longitudinally extending first and second sidewalls 532 and 534 and an upper transverse wall 536. The recess 530 has a back opening 538 configured to receive the shelf 372 (see FIGS. 8 and 26) of the housing body 210 (see FIGS. 1, 3-8, 11, 14, and 26) and the portion of the ground spring 232 (see FIGS. 6, 19A, 19B, 25, and 26) resting upon the shelf 372. The upper transverse wall 536 rests upon the ground spring 232 and the shelf 372. Thus, referring to FIG. 14, the upper transverse wall 536 is adjacent to, covers, and seals the opening 370 formed in the base portion 320.

Referring to FIGS. 12 and 13, when the plug 100 (see FIGS. 1, 3-6, and 11) is mated with an outlet (e.g., the outlet 120 illustrated in FIGS. 1, 27, and 28), the front end 500 and a switch portion 540 of the intermediate portion 504 are inserted into the outlet. Referring to FIG. 14, a user may press the switch portion 540 toward the housing body 210 to unlatch the latch member 214 from the outlet. The switch portion 540 may be deflected and unlatched from the outlet by pressing on other portions of the intermediate portion 504 nearer the back end 502.

Figure 15:
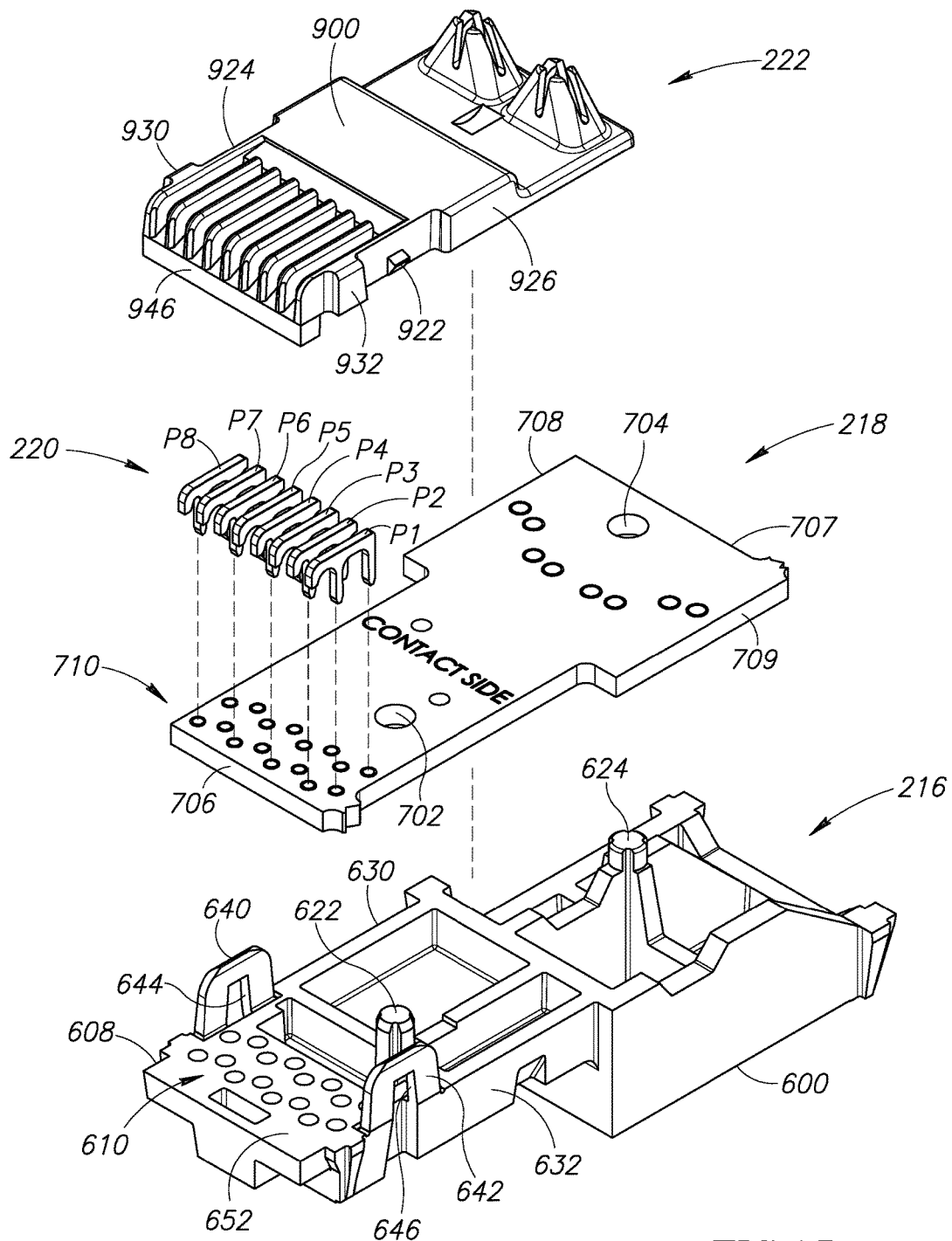
FIG. 15 is an exploded front top perspective view of a comb member, plug contacts, a substrate, and the insulator of the plug of FIG. 1.

Referring to FIG. 14, the insulator 216 is constructed from a substantially dielectric material. The insulator 216 has a base portion 600 that lines a portion of the interior chamber 340 along the base portion 320 of the housing body 210. The base portion 600 of the insulator 216 extends from the front opening 304 through the front chamber portion 344 and partway into the rear chamber portion 342. A plurality of indentations or recesses 610 are formed in a front portion 608 of the base portion 600 that is positionable within the front chamber portion 344 of the housing body 210 near the front opening 304. Referring to FIG. 15, the recesses 610 include a unique pair of recesses for each of the plug contacts 220. In the embodiment illustrated, the plug contacts 220 include eight plug contacts P1-P8 (described below). Specifically, referring to FIG. 16, the recesses 610 include recess pairs 611-618 for the plug contacts P1-P8, respectively.

Figure 16:
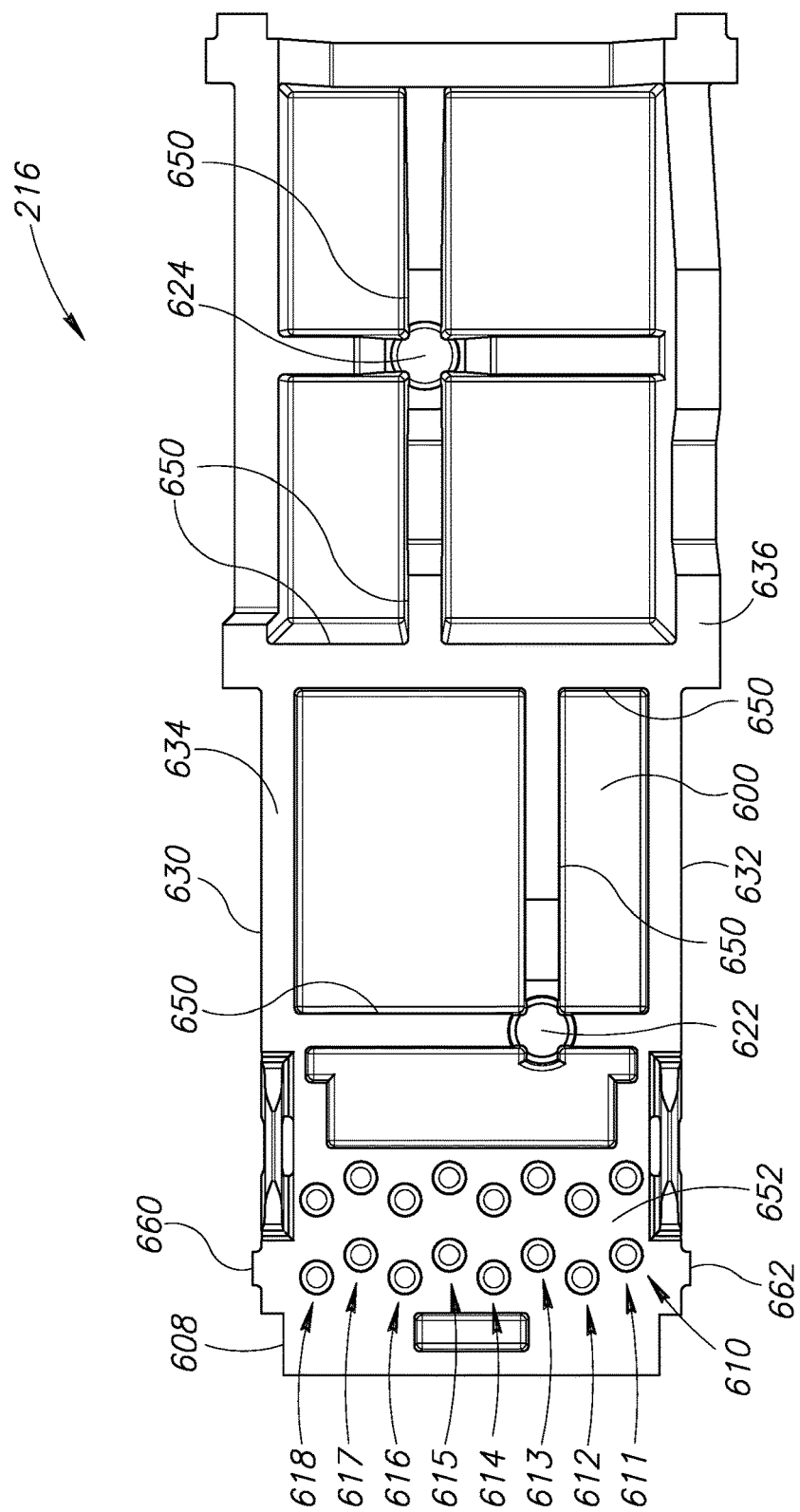
FIG. 16 is a top plan view of the insulator of the plug of FIG. 1.

Referring to FIG. 15, within the plug 100 (see FIGS. 1, 3-6, and 11), the substrate 218 is sandwiched between the insulator 216 and the comb member 222. First and second mounting pegs 622 and 624 extend upwardly from the base portion 600 of the insulator 216 toward the comb member 222. Referring to FIG. 14, first and second sidewalls 630 and 632 extend upwardly from the base portion 600 alongside the first and second sidewalls 330 and 332, respectively, of the housing body 210. Referring to FIG. 16, the first and second sidewalls 630 and 632 terminate at wall edges 634 and 636, respectively, that provide a support surface for the substrate 218 (see FIGS. 6, 11, 15, 17A, 19A, 19B, and 26). Referring to FIG. 15, first and second projections 640 and 642 extend upwardly from the first and second sidewalls 630 and 632, respectively. The first and second projections 640 and 642 include openings 644 and 646, respectively. Referring to FIG. 16, the insulator 216 may include one or more interior walls 650 that, like the first and second sidewalls 630 and 632, each terminates at a wall edge that is substantially parallel with the wall edges 634 and 636 and provides a support surface for the substrate 218. Further, the front portion 608 may include an upwardly facing front support surface 652 that is substantially parallel with the wall edges 634 and 636 and supports the substrate 218. In the embodiment illustrated, the recesses 610 are formed in the front support surface 652.

First and second laterally extending projections 660 and 662 extend outwardly from the first and second sidewalls 630 and 632, respectively. Referring to FIG. 14, when the insulator 216 is positioned inside the housing body 210, the projections 660 and 662 are positioned behind the first and second wall portions 334 and 336, respectively, that extend into the front opening 304.

Referring to FIG. 15, the substrate 218 may be implemented as a printed circuit board ("PCB"). As mentioned above, the substrate 218 rests upon the insulator 216. The substrate 218 has first and second apertures 702 and 704 configured to receive the mounting pegs 622 and 624. When so received, the mounting pegs 622 and 624 help prevent the substrate 218 from moving longitudinally or laterally within the housing body 210 (see FIGS. 1, 3-8, 11, 14, and 26).

The substrate 218 is positioned between the first and second projections 640 and 642, which are positioned between the first and second sidewalls 330 and 332 (see FIGS. 7, 11, and 14) of the housing body 210 (see FIGS. 1, 3-8, 11, 14, and 26). Thus, as shown in FIG. 11, the substrate 218 is recessed inside the housing body 210. The substrate 218 is spaced inwardly from the front opening 304 (see FIGS. 7, 8, and 14) and extends through the front chamber portion 344 (see FIGS. 7 and 14) and partway into the rear chamber portion 342.

Referring to FIG. 15, the substrate 218 has a front edge 706 opposite a back edge 707. A first side edge 708 extends between the front and back edges 706 and 707. The substrate 218 has a second side edge 709 opposite the first side edge 709 that also extends between the front and back edges 706 and 707. A plurality of spaced apart plated through-holes or vias 710 are formed in the substrate 218 near the front edge 706. The vias 710 are aligned with the recesses 610 formed in the insulator 216 when the mounting pegs 622 and 624 are positioned inside the first and second apertures 702 and 704.

The vias 710 include a unique pair of vias for each of the plug contacts P1-P8. Specifically, referring to FIG. 17A, the vias 710 include via pairs 711-718 configured to receive the plug contacts P1-P8 (see FIGS. 15 and 19A), respectively. By way of a non-limiting example, the plug contacts P1-P8 may be press fit into the via pairs 711-718, respectively. Adjacent ones of the via pairs 711-718 are offset from one another longitudinally or staggered to reduce arcing between the plug contacts P1-P8 (see FIGS. 15 and 19A) at voltages less than 1000 volts. The via pairs 711-718 are aligned with the recess pairs 611-618 (see FIG. 16), respectively. Thus, the plug contacts P1-P8 may optionally extend all of the way through the via pairs 711-718, respectively, and at least partway into the recess pairs 611-618 (see FIG. 16), respectively.

Figure 17A:
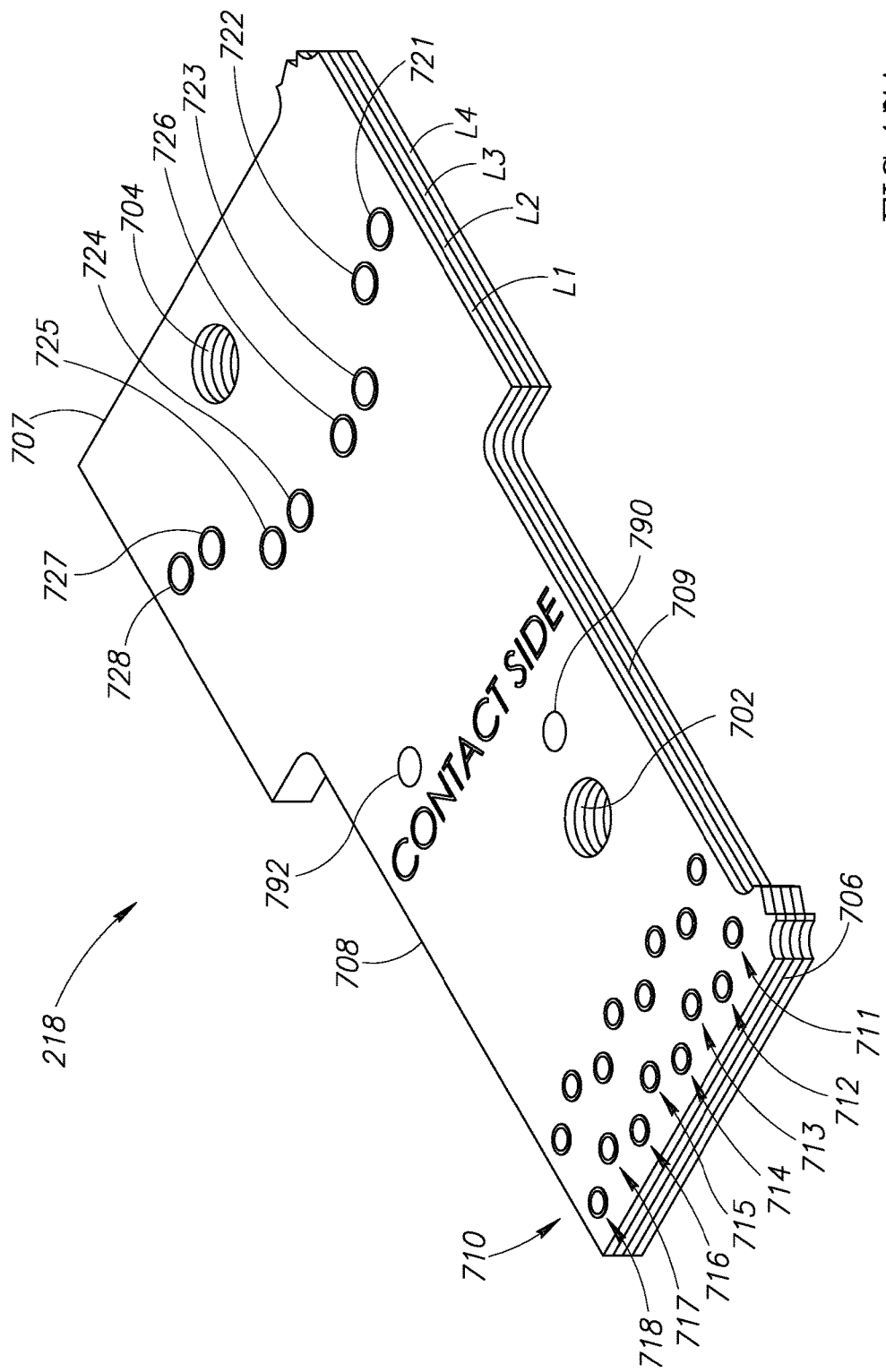
FIG. 17A is a front top perspective view of a first embodiment of the substrate of the plug of FIG. 1.

Referring to FIG. 17A, a plurality of spaced apart plated through-holes 721-728 are formed in the substrate 218 toward the back edge 707 and are positioned in the rear chamber portion 344 (see FIGS. 7, 11, and 14) of the housing body 210 (see FIGS. 1, 3-8, 11, 14, and 26). The plated through-holes 721-728 are configured to have the wires PW1-PW8 (see FIGS. 1, 19A, and 19B), respectively, of the cable C2 (see FIGS. 1, 3-6, 11, 19A, 19B, and 26) soldered therein. The plated through-holes 721-728 are spaced far enough apart from one another to avoid high potential arcing and reduce crosstalk.

The substrate 218 includes a plurality of layers L1-L4 with a plurality of conductors or traces 731-738 (see FIGS. 17B-17E) that interconnect the via pairs 711-718, respectively, with the through-holes 721-728, respectively. In other words, the traces 731-738 connect the wires PW1-PW8, respectively, with the plug contacts P1-P8 (see FIGS. 15 and 19A), respectively.

Referring to FIGS. 19A and 19B, before the wires PW1-PW8 are soldered into the plated through-holes 721-728, respectively, the free end of the cable shield 140P is folded back over the cable jacket 180P. Also, an end most portion of the insulation 144 (see FIG. 2) is removed to expose the conductor 142 (see FIG. 2) of each of the wires PW1-PW8 and the twisted pairs WP1-WP4 are inserted into tube sections 741-744, respectively. By way of non-limiting examples, the tube sections 741-744 may be shrink tubing and the like. Optionally, the tube sections 741-744 may have an electrically conductive interior layer or coating (not shown). By way of another non-limiting example, the tube sections 741-744 may be implemented using electrically conductive tubing, which may improve crosstalk isolation between the twisted pairs WP1-WP4. The tube sections 741-744 firmly grip the twisted pairs WP1-WP4, respectively, hold the wires of each of the twisted pairs WP1-WP4 close together, and hold the twists of each of the twisted pairs WP1-WP4 constant. The tube sections 741-744 may also press the optional pair shields PPS1-PPS4, respectively, against the twisted pairs WP1-WP4, respectively. Optionally, when the tube sections 741-744 have an interior coating (not shown), the tube sections 741-744 may replace one or more of the optional pair shields PPS1-PPS4 (e.g., if the optional pair shields PPS1-PPS4 are omitted).

If the twisted pairs WP1-WP4 remain inside the optional pair shields PPS1-PPS4, respectively, and each of the twisted pairs WP1-WP4 is maintained at a constant twist period and twist tightness, the twisted pairs WP1-WP4 are electromagnetically isolated because signals traveling (e.g., at 2 GHz) through the twisted pairs WP1-WP4 experience no discontinuities that would cause reflections. Because the tube sections 741-744 help maintain the twisted pairs WP1-WP4, respectively, at constant twist periods and twist tightness, the tube sections 741-744 help prevent reflections that would degrade with signal quality (e.g., by causing return loss). Thus, the tube sections 741-744 may help maintain impedance (e.g. at about a desired 100Ω), reduce return loss, reduce insertion loss, and/or reduce crosstalk.

The tube sections 741-744 cover the twisted pairs WP1-WP4, respectively, from the cable shield 140P to near the plated through-holes 721-728. By way of non-limiting examples, the tube section 741 may terminate about 0.100 inches from the plated through-holes 724 and 725, the tube section 742 may terminate about 0.100 inches from the plated through-holes 721 and 722, the tube section 743 may terminate about 0.100 inches from the plated through-holes 723 and 726, and the tube section 744 may terminate about 0.100 inches from the plated through-holes 727 and 728. The optional pair shields PPS1-PPS4 extend all of the way to the end of the tube sections 741-744, respectively.

Figure 18A:
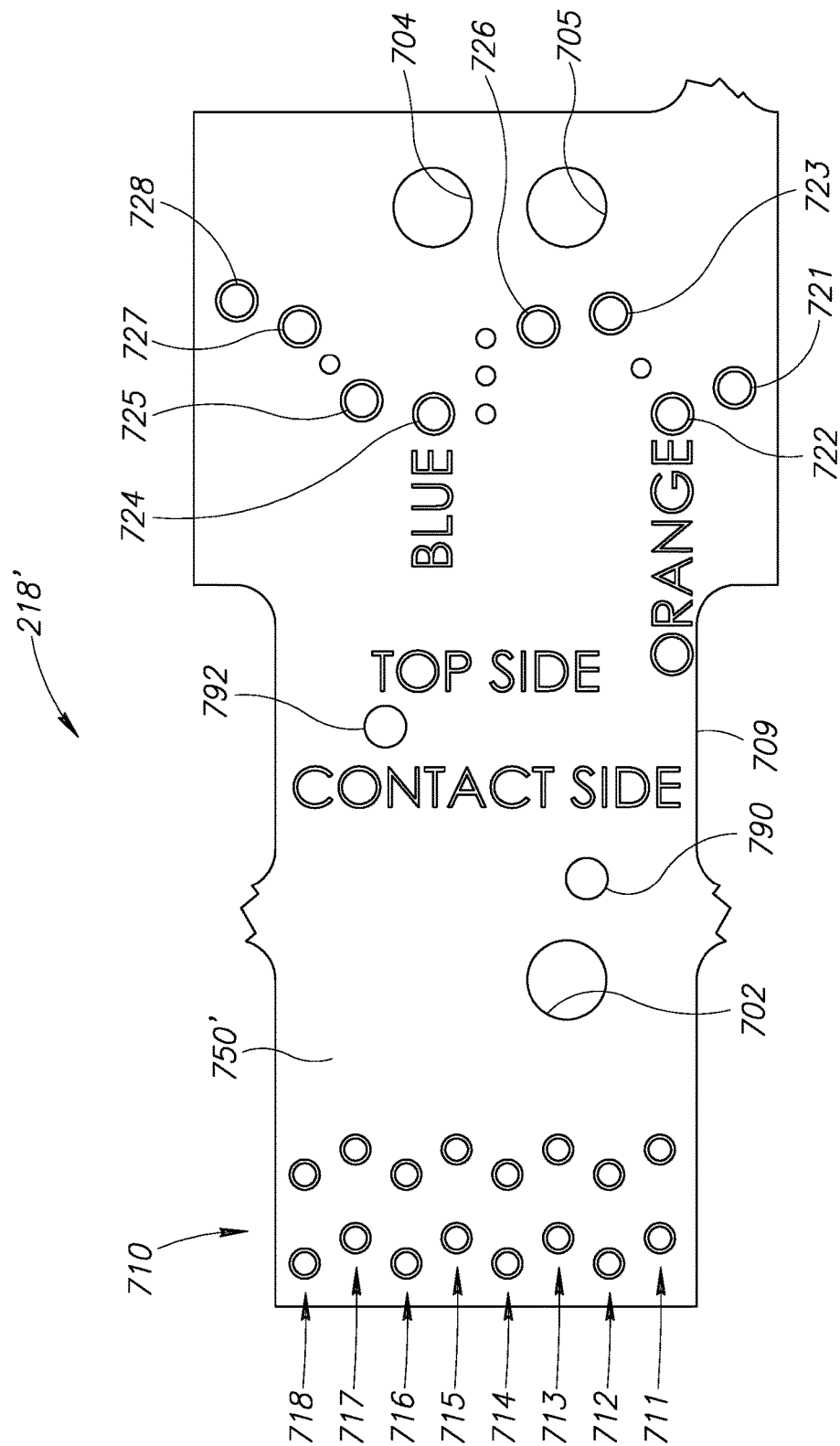
FIG. 18A is a front top perspective view of a second embodiment of the substrate of the plug of FIG. 1.
Figure 19C:
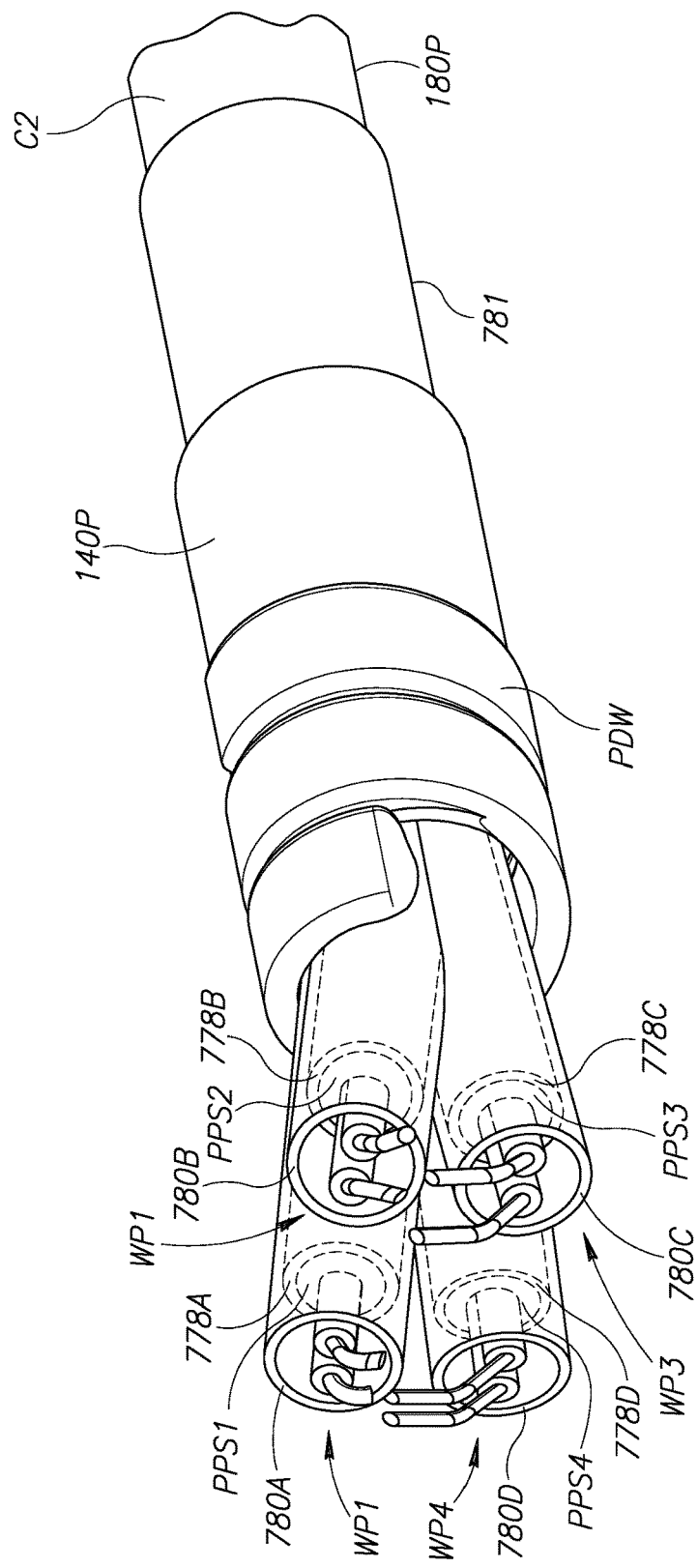
FIG. 19C is a front top perspective view of an alternate embodiment in which inner and outer tube sections as well as an exterior tube section are connected to the communication cable before the communication cable is connected to either the substrate of FIG. 17A or the substrate of FIG. 18A.

In an alternate embodiment illustrated in FIG. 19C, instead of the tube sections 741-744 (see FIGS. 19A and 19B), the twisted pairs WP1-WP4 are inserted into inner tube sections 778A-778D, respectively, that are in turn inserted into outer tube sections 780A-780D, respectively. First, the twisted pairs WP1-WP4 and the optional pair shields PPS1-PPS4 are positioned inside the inner tube sections 778A-778D, respectively. Then, the optional pair shields PPS1-PPS4 may be trimmed. The inner tube sections 778 hold the twisted pairs WP1-WP4, respectively, together, after the optional pair shields PPS1-PPS4 have been trimmed. Then, the inner tube sections 778A-778D are positioned inside the outer tube sections 780A-780D, respectively. Thus, the outer tube sections 780A-780D cover the trimmed ends of the optional pair shields PPS1-PPS4, respectively. The outer tube sections 780A-780D also cover the twisted pairs WP1-WP4, respectively, all the way to the plated through-holes 721-728 (see FIGS. 17A, 18A, 19A, and 19B), respectively, which helps protect against HiPot arcing. Thus, together, the inner and outer tube sections 778A-778D and 780A-780D cover the twisted pairs WP1-WP4, respectively, from the cable shield 140P to near the plated through-holes 721-728 (see FIGS. 17A, 18A, 19A, and 19B). The inner and outer tube sections 778A-778D and 780A-780D firmly hold the twisted pairs WP1-WP4, respectively, and keep them positioned for electromagnetic interaction with the plated through-holes 721-728 (see FIGS. 17A, 18A, 19A, and 19B). The inner and outer tube sections 778A-778D and 780A-780D may be implemented using any material(s) suitable for constructing the tube sections 741-744 (see FIGS. 19A and 19B).

In the alternate embodiment illustrated in FIG. 19C, before the free end of the cable shield 140P is folded back over the cable jacket 180P, an exterior tube section 781 is placed over the cable C2. Then, the free end of the cable shield 140P is folded back over the exterior tube section 781. Next, the drain wire PDW is wrapped around the folded back cable shield 140P. Thus, the drain wire PDW forms an electrical connection with the cable shield 140P. Finally, the exterior tube section 781 is positioned inside the strain relief member 230 (see FIGS. 6, 11, and 24A). The exterior tube section 781 helps the strain relief member 230 prevent damage (e.g., caused by sharp bends in the wires PW1-PW8 illustrated in FIG. 1, fatigue, breakage, and the like) when the cable C2 is used and/or abused. The exterior tube section 781 may be implemented using any material(s) suitable for constructing the tube sections 741-744 (see FIGS. 19A and 19B). As described below, the ground spring 232 (see FIGS. 6, 19A, 19B, 25, and 26) is placed in contact with the cable shield 140P and/or the drain wire PDW.

As shown in FIGS. 19A and 19B, the wires PW1-PW8 are directly insertable into the plated through-holes 721-728, respectively, without the use of any intervening components (e.g., insulation displacement connectors and the like).

Referring to FIG. 15, as mentioned above, the low profile of the plug contacts P1-P8 allows the substrate 218 to be positioned within the housing body 210 (see FIGS. 1, 3-8, 11, 14, and 26) about mid-way between the housing cover 212 (see FIGS. 1, 3-6, 9-11, and 26) and the base portion 320 (see FIGS. 7, 8, and 14) of the housing body 210. Referring to FIGS. 19A and 19B, this allows the twisted pairs WP1 and WP2 to be attached to the substrate 218 along its first side 750 and the twisted pairs WP3 and WP4 to be attached to the substrate 218 along its second side 752. Referring to FIG. 19A, the wires PW1, PW2, PW4, and PW5 are soldered to the plated through-holes 721, 722, 724, and 725, respectively, on a first side 750 of the substrate 218. Referring to FIG. 19B, the wires PW3, PW6, PW7, and PW8 are soldered to the plated through-holes 723, 726, 727, and 728, respectively, on a second side 752 of the substrate 218. The wires PW7 and PW8 of the twisted pair WP4 are soldered into the plated through-holes 727 and 728, respectively, which are adjacent to the plated through-holes 724 and 725 in which the wires PW4 and PW5, respectively, of the twisted pair WP1 are soldered. The unshielded conductors 142 (see FIG. 2) at the ends of each of the twisted pairs WP1 and WP4 are a maximum distance away from one another because they are positioned on opposite sides 750 and 752, respectively, of the substrate 218. In a similar manner, the unshielded conductors 142 (see FIG. 2) at the ends of the twisted pair WP1 (on the first side 750 of the substrate 218) are a maximum distance from the unshielded conductors 142 (see FIG. 2) at the ends of the twisted pair WP3 (on the second side 752 of the substrate 218), and the unshielded conductors 142 (see FIG. 2) at the ends of the twisted pair WP3 (on the second side 752 of the substrate 218) are a maximum distance from the unshielded conductors 142 (see FIG. 2) at the ends of the twisted pair WP2 (on the first side 750 of the substrate 218). This arrangement may help reduce crosstalk by increasing physical distances between the twisted pairs WP1-WP4.

Referring to FIG. 19A, the insulation 144 (see FIG. 2) of wires PW1, PW2, PW4, and PW5 may contact the first side 750 of the substrate 218. Similarly, referring to FIG. 19B, the insulation 144 (see FIG. 2) of wires PW6, PW3, PW7, and PW8 may contact the second side 752 of the substrate 218. The soldering process may melt the insulation 144 (see FIG. 2) slightly, causing it to shrink and retract from the substrate 218.

Referring to FIGS. 17B-17E, for ease of illustration, the (first) layer L1 will be referred to as being the top layer, the (fourth) layer L4 will be referred to as being a bottom layer, and the (second and third) layers L2 and L3 will be referred to as being middle layers. The (second) layer L2 is positioned between the top layer L1 and the (third) layer L3. Further, the (third) layer L3 is positioned between the (second) layer L2 and the bottom layer L4.

Figure 17C:
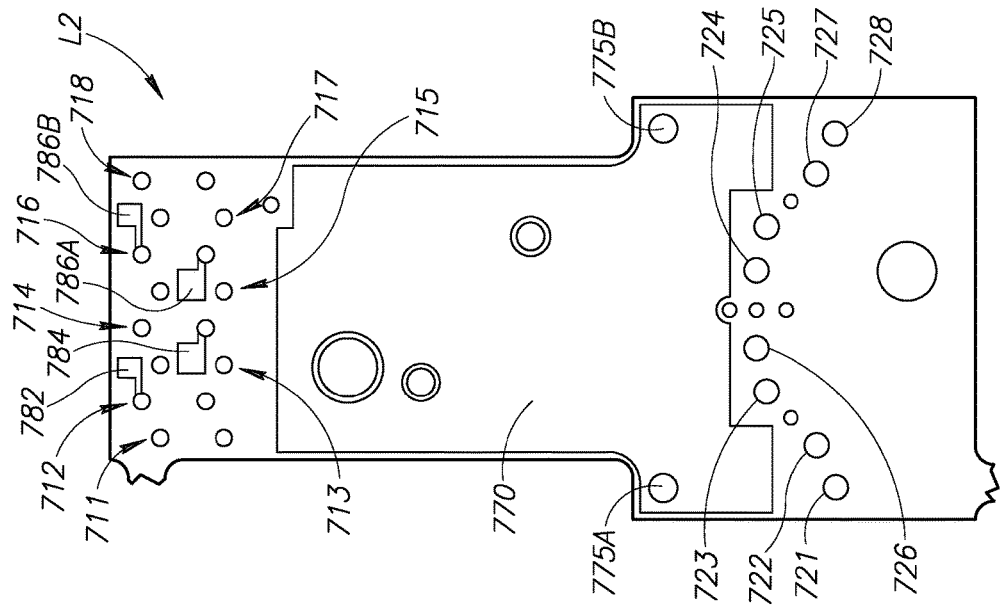
FIG. 17C is a top plan view of a second layer of the substrate of FIG. 17A in which the substrate is illustrated as being transparent.
Figure 17B:
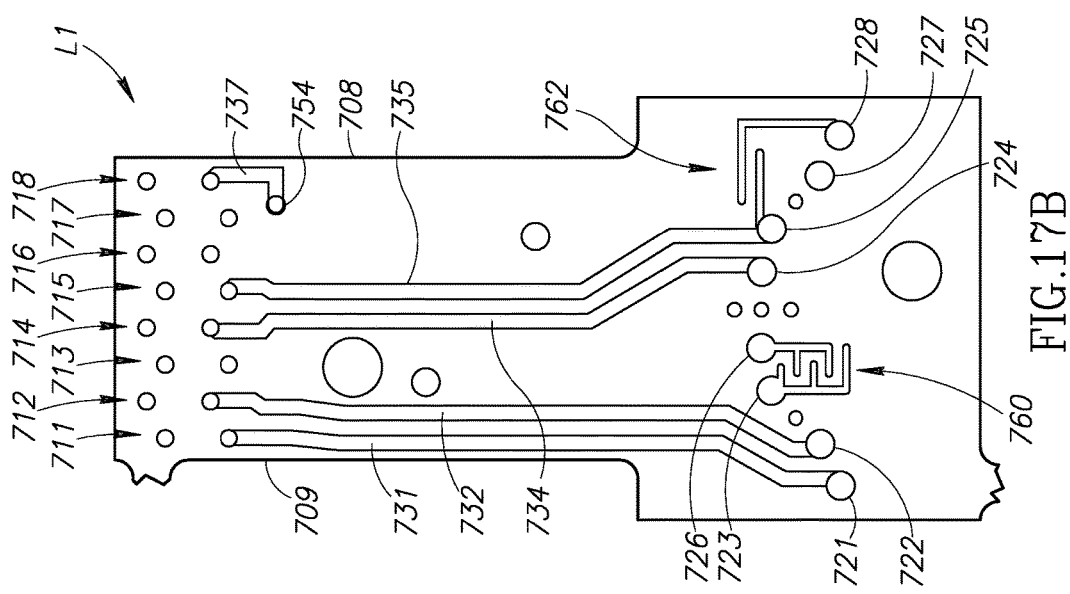
FIG. 17B is a top plan view of a first layer of the substrate of FIG. 17A.

Referring to FIG. 17B, the traces 734 and 735 that conduct signals carried by the first twisted pair WP1 (see FIGS. 1, 19A, and 19C) and the traces 731 and 732 that conduct signals carried by the second twisted pair WP2 (see FIGS. 1, 19A, and 19C) are positioned on the top layer L1. The traces 734 and 735 extend longitudinally about midway between the first and second side edges 708 and 709 of the substrate 218. The traces 731 and 732 extend longitudinally near the second side edge 709 of the substrate 218. A portion of the trace 737 is positioned on the top layer L1 and extends from a via 754 to the via pair 718.

Figure 17E:
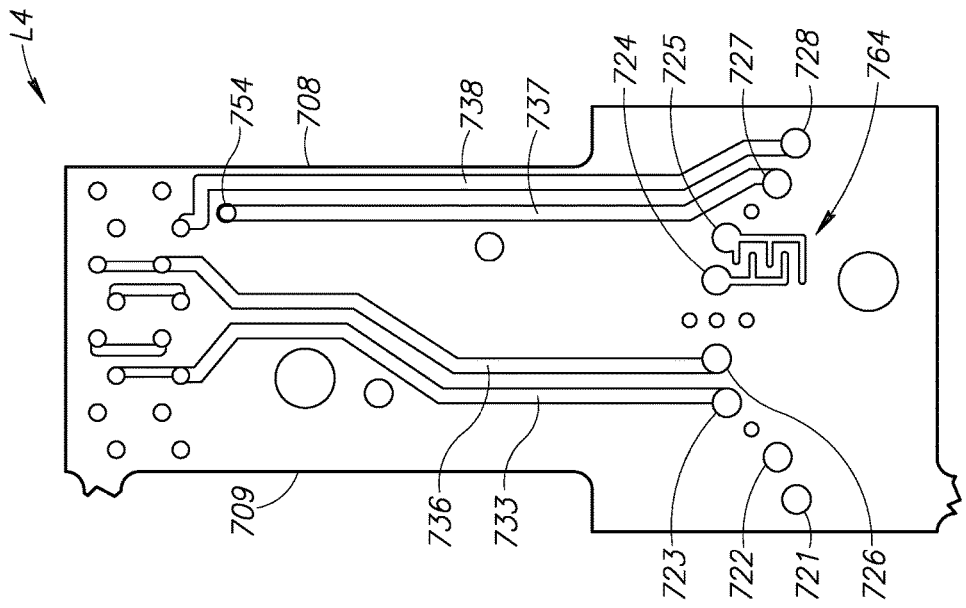
FIG. 17E is a top plan view of a fourth layer of the substrate of FIG. 17A in which the substrate is illustrated as being transparent.

Referring to FIG. 17E, the traces 733 and 736 that conduct signals carried by the third twisted pair WP3 (see FIGS. 1, 19B, and 19C) and the traces 737 and 738 that conduct signals carried by the fourth twisted pair WP4 (see FIGS. 1, 19B, and 19C) are positioned on the bottom layer L4. The traces 733 and 736 extend longitudinally about midway between the first and second side edges 708 and 709 of the substrate 218. The traces 737 and 738 extend longitudinally near the first side edge 708 of the substrate 218. The trace 737 extends from the plated through-hole 727 to the via 754 on the bottom layer L4. Referring to FIGS. 17B and 17E, in the embodiment illustrated, the trace 737 crosses the trace 738 near the via pairs 717 and 718.

The traces connected to different twisted pairs WP1-WP4 (see FIGS. 1 and 19C) of the cable C2 (see FIGS. 1, 3-6, 11, 19A, 19B, and 26) are staggered vertically as well as horizontally. This increases the distance between them and thus decreases their crosstalk in areas where they are not otherwise shielded. For example, referring to FIG. 17B, the traces 731 and 732 connected to the second twisted pair WP2 (see FIGS. 1, 19A, and 19C) are horizontally and vertically separated from the traces 733 and 736 (see FIG. 17E) connected to the third twisted pair WP3 (see FIGS. 1, 19B, and 19C). Additionally, the traces 733 and 736 connected to the third twisted pair WP3 are horizontally and vertically separated from the traces 734 and 735 (see FIG. 17B) connected to the first twisted pair WP1 (see FIGS. 1, 19A, and 19C). Further, the traces 734 and 735 connected to the first twisted pair WP1 (see FIGS. 1, 19A, and 19C) are horizontally and vertically separated from the traces 737 and 738 (see FIG. 17E) connected to the fourth twisted pair WP4 (see FIGS. 1, 19B, and 19C).

The arrangement of the traces 731-738 on the layers L1-L4 illustrated in FIGS. 17B-17E helps reduce crosstalk between the traces 731-738 at or near the plated through-holes 721-728. Further, this arrangement provides sufficient "empty" portions of the substrate 218 that may be used for mechanical tooling holes.

Referring to FIGS. 17B and 17E, the top and bottom layers L1 and L4 include conductors (e.g., traces) that may be arranged to form capacitors 760, 762, and 764. Referring to FIG. 17B, the interdigitated capacitor 760 capacitively couples the wires PW3 and PW6 of the third twisted pair WP3 (see FIGS. 1, 19B, and 19C) together. The capacitor 762 capacitively couples the wires PW5 and PW8 together. Referring to FIG. 17E, the interdigitated capacitor 764 capacitively couples the wires PW4 and PW5 of the first twisted pair WP1 (see FIGS. 1, 19A, and 19C) together.

Referring to FIG. 17C, the middle second layer L2 includes an electrically conductive (e.g., plated) portion 770 that functions as a conductive plane that is not physically connected to any of the signal carrying elements on the substrate 218. By way of a non-limiting example, the conductive portion 770 may be formed by copper plating. The conductive portion 770 helps maintain impedance for the traces 731-736 which carry the signals of the first, second, and third twisted pairs WP1-WP3 (see FIGS. 1 and 19C).

As mentioned above, the traces 734 and 735 that conduct signals carried by the first twisted pair WP1 (see FIGS. 1, 19A, and 19C) are positioned on the top layer L1, and the traces 733 and 736 that conduct signals carried by the third twisted pair WP3 (see FIGS. 1, 19B, and 19C) are positioned on the bottom layer L4. The conductive portion 770, which is positioned on the middle second layer L2, may help reduce crosstalk between the traces 734 and 735 and the traces 733 and 736.

Figure 17D:
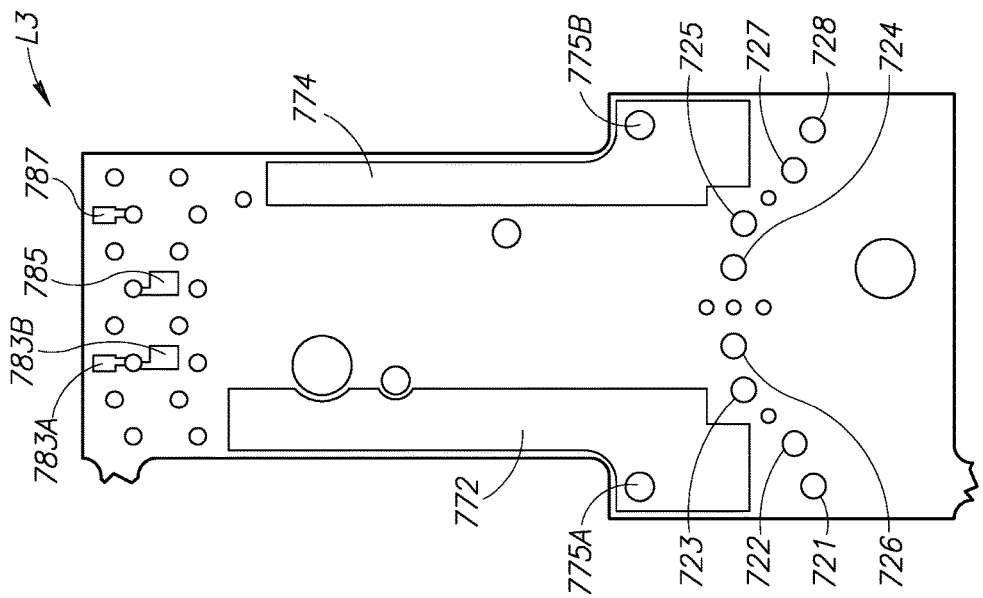
FIG. 17D is a top plan view of a third layer of the substrate of FIG. 17A in which the substrate is illustrated as being transparent.

Referring to FIG. 17D, the middle third layer L3 includes electrically conductive (e.g., plated) portions 772 and 774 that function together as a single (split or divided) conductive plane. The conductive plane formed by the conductive portions 772 and 774 may be electrically (e.g., capacitively) coupled to the conductive plane formed by the conductive portion 770. In the embodiment illustrated, the conductive portions 772 and 774 are electrically and physically connected to the conductive portion 770 by vias 775A and 775B, respectively. Alternatively, neither of the conductive portions 772 and 774 may be physically connected to any other conductive elements on the substrate 218. By way of a non-limiting example, the conductive portions 772 and 774 may be formed by copper plating. The conductive portions 772 and 774 help maintain impedance for the traces 737 and 738, which carry the signals of the fourth twisted pair WP4 (see FIGS. 1, 19B, and 19C).

The conductive planes provided by the conductive portions 770-774 help shield the twisted pairs WP1 and WP2 (see FIGS. 1, 19A, and 19C) attached to the first side 750 of the substrate 218 from the twisted pairs WP3 and WP4 (see FIGS. 1, 19B, and 19C) attached to the second side 752 of the substrate 218, and vice versa.

Referring to FIG. 17C, the middle second layer L2 includes electrically conductive (e.g., plated) portions 782, 784, 786A, and 786B that function as capacitor plates. The capacitor plate portion 782 is electrically connected to the via pair 712 (and the plug contact P2 illustrated in FIGS. 15 and 19A), the capacitor plate portion 784 is electrically connected to the via pair 714 (and the plug contact P4 illustrated in FIGS. 15 and 19A), the capacitor plate portions 786A and 786B are both electrically connected to the via pair 716 (and the plug contact P6 illustrated in FIGS. 15 and 19A). Referring to FIG. 17D, the middle second layer L3 includes electrically conductive (e.g., plated) portions 783A, 783B, 785, and 787 that function as capacitor plates. The capacitor plate portions 783A and 783B are both electrically connected to the via pair 713 (and the plug contact P3 illustrated in FIGS. 15 and 19A), the capacitor plate portion 785 is electrically connected to the via pair 715 (and the plug contact P5 illustrated in FIGS. 15 and 19A), the capacitor plate portion 787 is electrically connected to the via pair 717 (and the plug contact P7 illustrated in FIGS. 15 and 19A).

Together, the capacitor plate portions 782 and 783A form a first capacitor that capacitively couples the plug contacts P2 and P3 (see FIGS. 15 and 19A) together. Similarly, the capacitor plate portions 784 and 783B form a second capacitor that capacitively couples the plug contacts P4 and P3 (see FIGS. 15 and 19A) together. Thus, the plug contacts P2, P3, and P4 (see FIGS. 15 and 19A) are all capacitively coupled together by the capacitor plate portions 782-784.

Together, the capacitor plate portions 786A and 785 form a third capacitor that capacitively couples the plug contacts P6 and P5 (see FIGS. 15 and 19A) together. Similarly, the capacitor plate portions 786B and 787 form a fourth capacitor that capacitively couples the plug contacts P6 and P7 (see FIGS. 15 and 19A) together. Thus, the plug contacts P5, P6, and P7 (see FIGS. 15 and 19A) are all capacitively coupled together by the capacitor plate portions 785-787.

The first capacitor (formed by the capacitor plate portions 782 and 783A) provides crosstalk compensation for the second and third twisted pairs WP2 and WP3 (see FIGS. 1 and 19C). In other words, the first capacitor helps reduce crosstalk between the second and third twisted pairs WP2 and WP3 (see FIGS. 1 and 19C).

Together, the second capacitor (formed by the capacitor plate portions 784 and 783B) and the third capacitor (formed by the capacitor plate portions 786A and 785) provide crosstalk compensation for the first and third twisted pairs WP1 and WP3 (see FIGS. 1 and 19C). In other words, the second and third capacitors help reduce crosstalk (e.g., NEXT or near end crosstalk) between the first and third twisted pairs WP1 and WP3 (see FIGS. 1 and 19C). Further, the second and third capacitors are positioned close to locations at which the plug contacts P3-P6 (see FIGS. 15 and 19A) contact the outlet contacts J3-J6 (see FIGS. 27, 29, and 32), respectively.

The fourth capacitor (formed by the capacitor plate portions 786B and 787) provides crosstalk compensation for the third and fourth twisted pairs WP3 and WP4 (see FIGS. 1, 19B, and 19C). In other words, the fourth capacitor helps reduce crosstalk between the third and fourth twisted pairs WP3 and WP4 (see FIGS. 1, 19B, and 19C).

Without being limited by theory, according to TIA/ISO standards, insertion loss is a mated measurement between a plug and an outlet. The insertion loss from the plug contributes to the total energy loss. Based on simulation and test results, it is believed that Return Loss/Insertion Loss performance may be adjusted (e.g., improved) by modifying the distance between those of the plated through-holes 721-728 connected to the same twisted pair. For example, the plated through-holes 723 and 726 connected to the same twisted pair, namely the third twisted pair WP3 (see FIGS. 1, 19B, and 19C). Crosstalk between the plated through-holes 723 and 726 forms a resonator (e.g., having a center frequency of about 60% to 75% of the maximum operating frequency). Generally speaking, the closer the plated through-holes 723 and 726 are to one another, the more capacitance will generate crosstalk. When capacitance increases, the center frequency of the resonator moves to a lower frequency. In other words, it is possible to position the plated through-holes 721-728 to obtain satisfactory performance on each of the twisted pairs WP1-WP4 (see FIGS. 1 and 19C) for both low and high frequency. Thus, Return Loss/Insertion Loss may be adjusted by adjusting the distance between the plated through-holes 721 and 722, the distance between the plated through-holes 723 and 726, the distance between the plated through-holes 724 and 725, and the distance between the plated through-holes 727 and 728. According to analysis, the plug 100 may be configured to have about 30% to about 40% less insertion loss than prior art plugs at high frequencies (e.g., about 1 GHz to about 2 GHz). In fact, adjustment of the plated through-holes 721-728 may be sufficient to minimize or completely eliminate the need to use, for instance, the interdigitated capacitors 760, 762, and 764 shown in FIGS. 17B and 17E.

It is also advantageous for the purpose of noise cancelling to maintain the NEXT phase between the first and third twisted pairs WP1 and WP3 (see FIGS. 1 and 19C) on the plug side close to about −90 degrees with respect to an inserted data signal located at the connector point of contact. According to analysis up to 2 GHz, within the plug 100, the NEXT phase between the first and third twisted pairs WP1 and WP3 (see FIGS. 1 and 19C) may be very close to or slightly lower than −90 degrees.

Referring to FIG. 17A, the substrate 218 includes through-holes 790 and 792. As will be explained below, the through-holes 790 and 792 are used to attach the comb member 222 (see FIGS. 4-6, 11, 15, 22, 23, and 26) to the substrate 218.

FIG. 18A depicts an alternate embodiment of a substrate 218' that may be used instead and in place of the substrate 218 (see FIG. 17A). The substrate 218' has first and second sides 750' and 752' (see FIG. 18E) substantially similar to the first and second sides 750 and 752 (see FIGS. 19A and 19B, respectively) of the substrate 218 (see FIG. 17A). The substrate 218' includes the first and second apertures 702 and 704, the via pairs 711-718, the plated through-holes 721-728, and the through-holes 790 and 792. Thus, like in the substrate 218 (see FIG. 17A), the wires PW1, PW2, PW4, and PW5 (see FIG. 19A) are soldered to the plated through-holes 721, 722, 724, and 725, respectively, on a first side 750' of the substrate 218'. The wires PW3, PW6, PW7, and PW8 (see FIG. 19B) are soldered to the plated through-holes 723, 726, 727, and 728, respectively, on a second side 752' (see FIG. 18E) of the substrate 218'. However, as shown in FIG. 18A, the substrate 218' differs from the substrate 218 with respect to the positioning of the plated through-holes 721-728. The plated through-holes 721-728 are positioned on the substrate 218' for ease of manufacturing. The substrate 218' also includes an aperture 705 that makes an inspection datum easier to describe and use.

Referring to FIGS. 18B-18E, the substrate 218' (see FIG. 18A) also includes layers L1'-L4' that differ from layers L1-L4 (see FIGS. 17A-17E), respectively, of the substrate 218 (see FIG. 17A). For ease of illustration, the (first) layer L1' will be referred to as being the top layer, the (fourth) layer L4' will be referred to as being a bottom layer, and the (second and third) layers L2' and L3' will be referred to as being middle layers. The (second) layer L2' is positioned between the top layer L1' and the (third) layer L3'. Further, the (third) layer L3' is positioned between the (second) layer L2' and the bottom layer L4'.

Figure 18B:
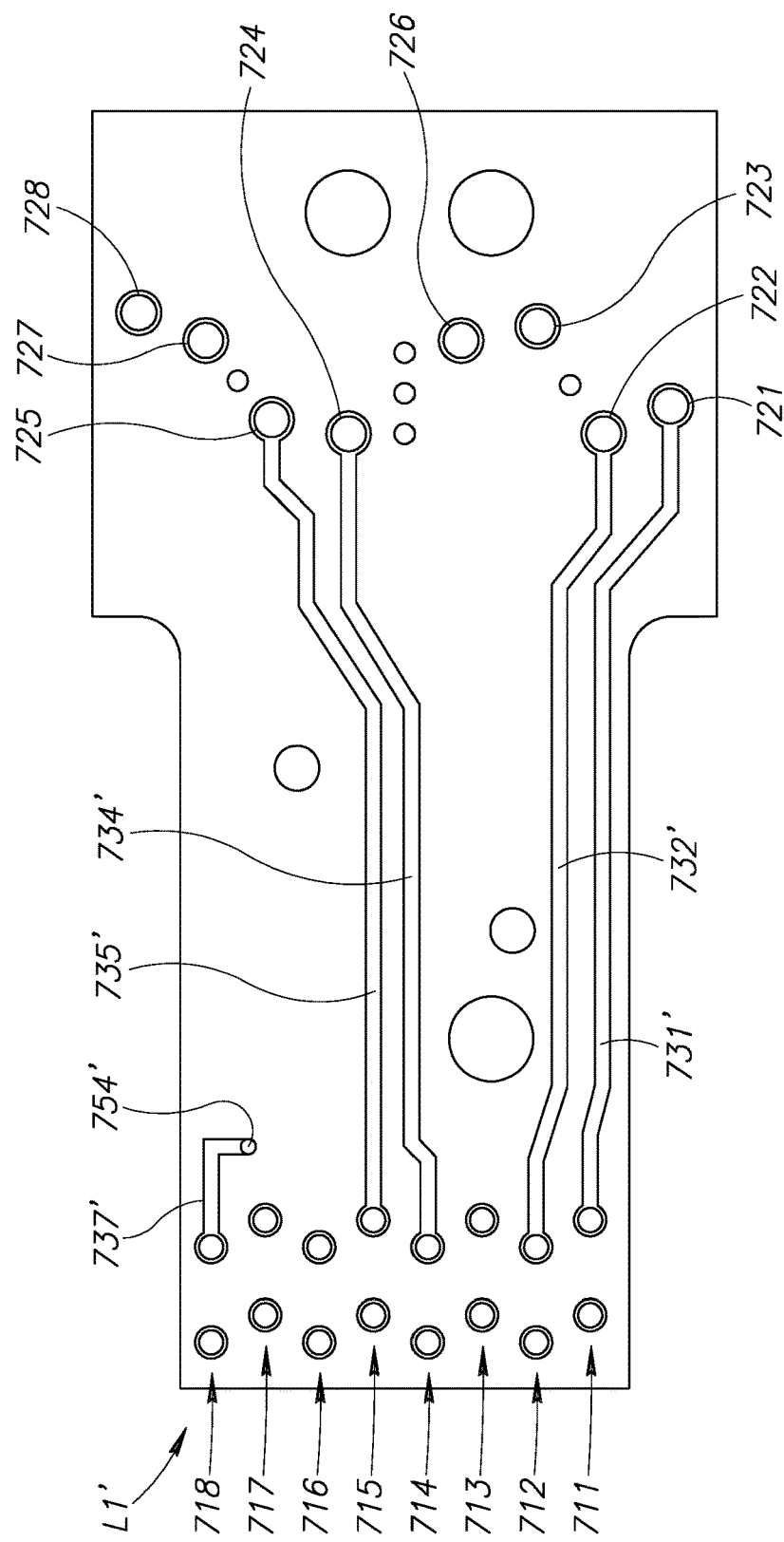
FIG. 18B is a top plan view of a first layer of the substrate of FIG. 18A.

The layers L1'-L4' include with a plurality of conductors or traces 731'-738' (see FIGS. 18B and 18E) that interconnect the via pairs 711-718, respectively, with the through-holes 721-728, respectively. Referring to FIG. 18B, the traces 734' and 735' that conduct signals carried by the first twisted pair WP1 (see FIGS. 1, 19A, and 19C) and the traces 731' and 732' that conduct signals carried by the second twisted pair WP2 (see FIGS. 1, 19A, and 19C) are positioned on the top layer L1'. A portion of the trace 737' is positioned on the top layer L1' and extends from a via 754' to the via pair 718.

Figure 18C:
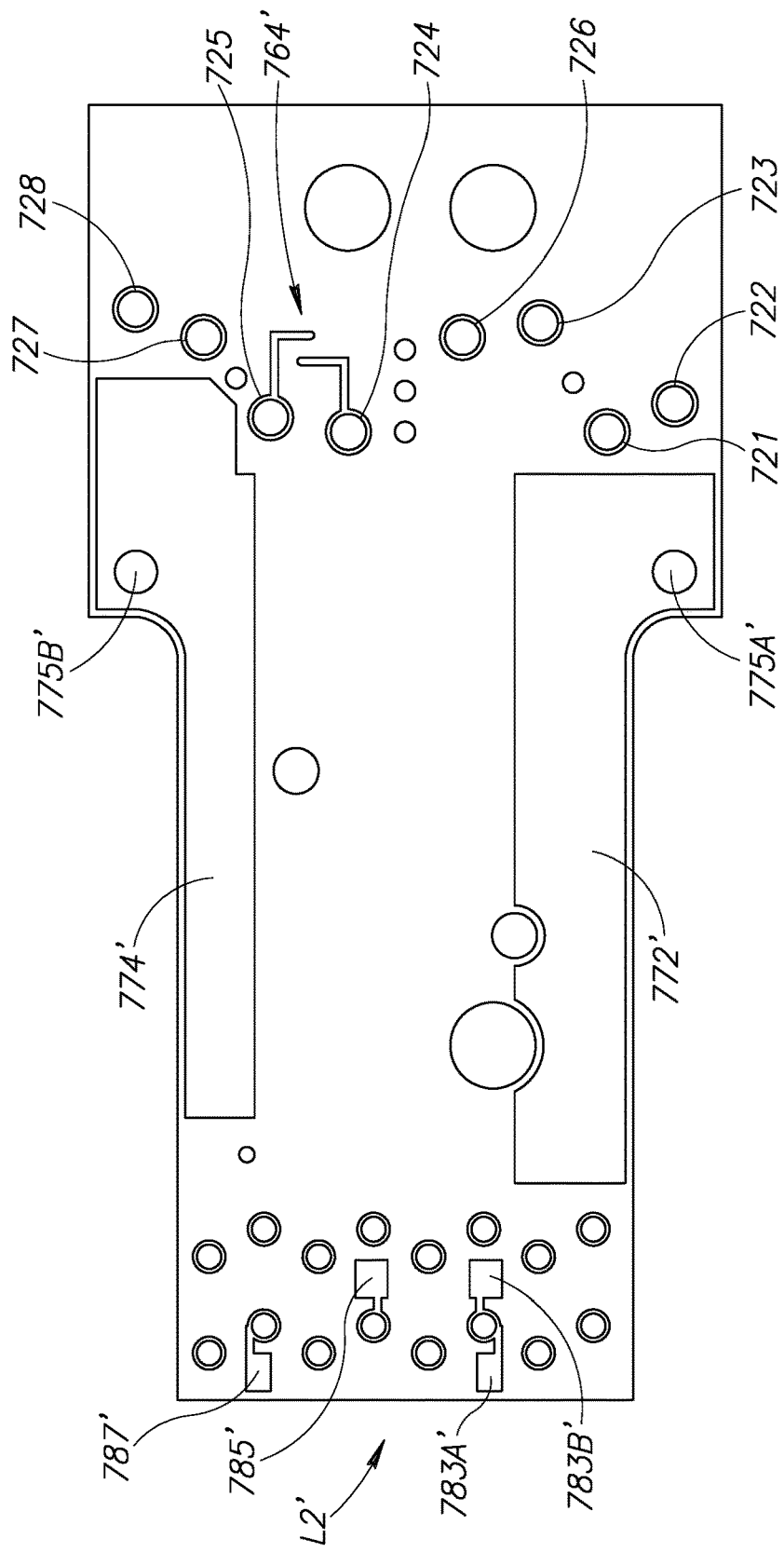
FIG. 18C is a top plan view of a second layer of the substrate of FIG. 18A in which the substrate is illustrated as being transparent.
Figure 18D:
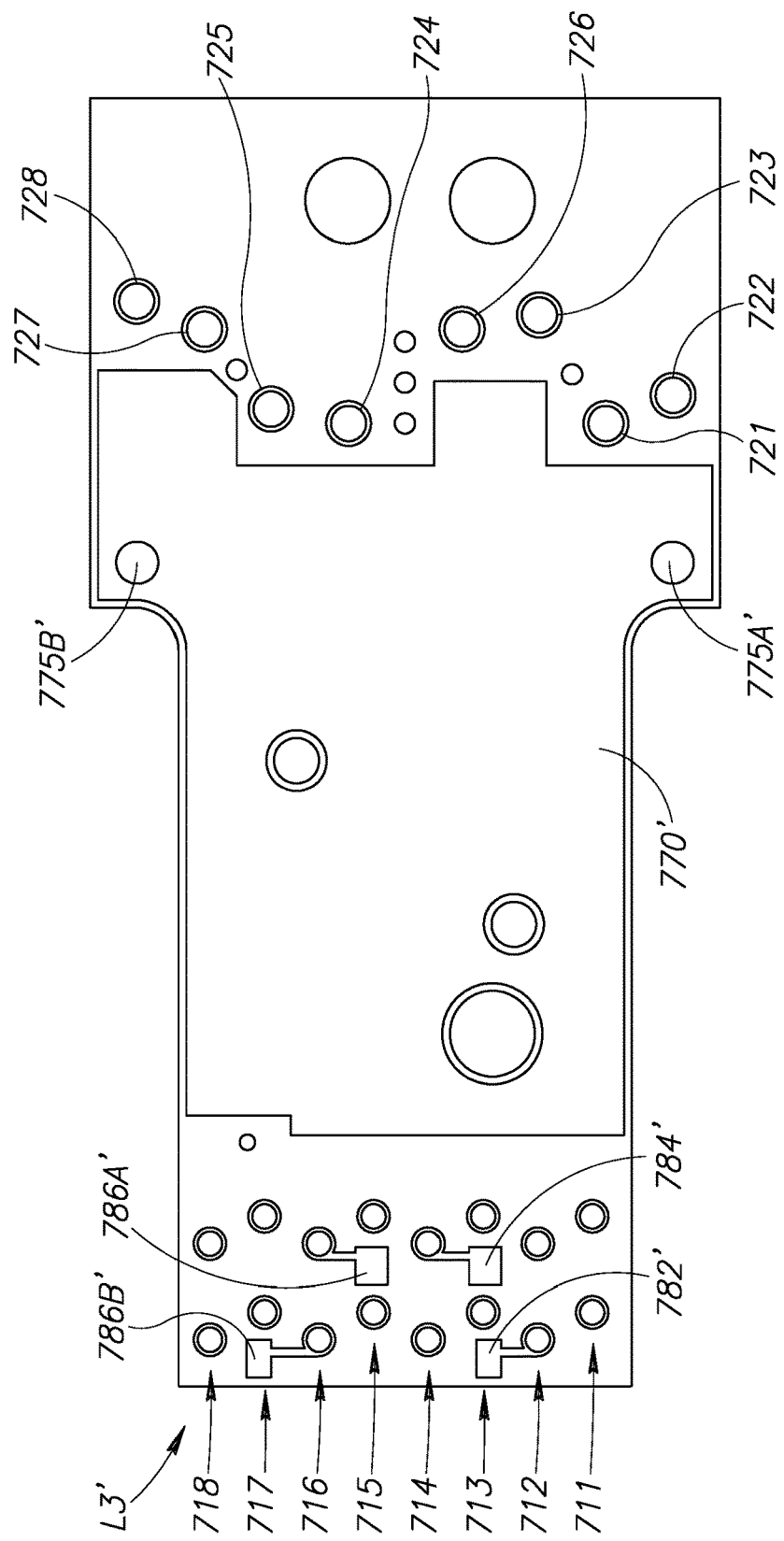
FIG. 18D is a top plan view of a third layer of the substrate of FIG. 18A in which the substrate is illustrated as being transparent.
Figure 18E:
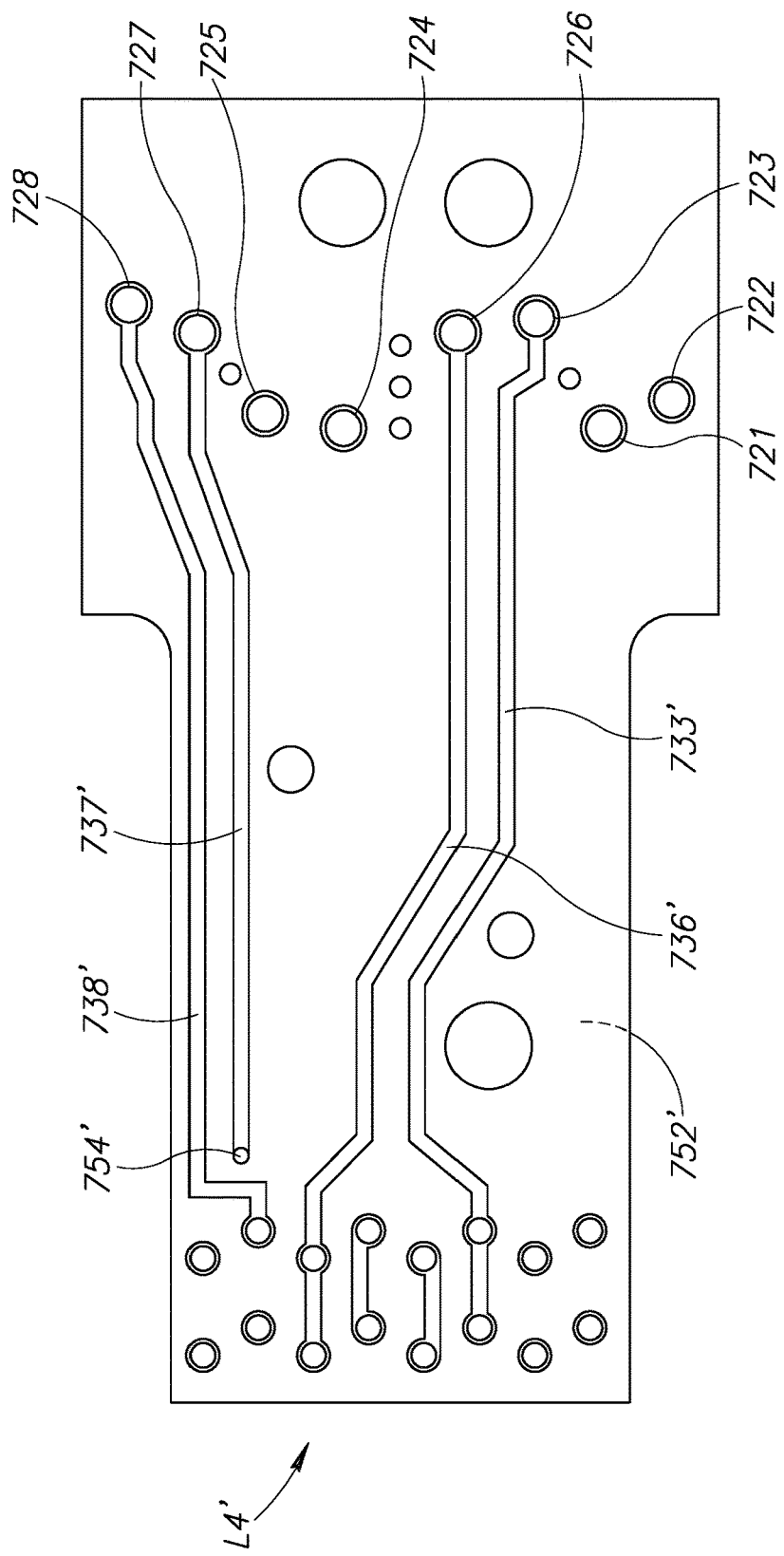
FIG. 18E is a top plan view of a fourth layer of the substrate of FIG. 18A in which the substrate is illustrated as being transparent.

Referring to FIG. 18E, the traces 733' and 736' that conduct signals carried by the third twisted pair WP3 (see FIGS. 1, 19B, and 19C) and the traces 737' and 738' that conduct signals carried by the fourth twisted pair WP4 (see FIGS. 1, 19B, and 19C) are positioned on the bottom layer L4'. The trace 737' extends from the plated through-hole 727 to the via 754' on the bottom layer L4'. Referring to FIGS. 18B and 18E, in the embodiment illustrated, the trace 737' crosses the trace 738' near the via pairs 717 and 718.

As in the substrate 218 (see FIGS. 6, 11, 15, 17A, 19A, 19B, and 26), the traces connected to different twisted pairs WP1-WP4 (see FIGS. 1 and 19C) of the cable C2 (see FIGS. 1, 3-6, 11, 19A, 19B, and 26) are staggered vertically as well as horizontally. This increases the distance between them and thus decreases their crosstalk in areas where they are not otherwise shielded. For example, referring to FIG. 18B, the traces 731' and 732' connected to the second twisted pair WP2 (see FIGS. 1, 19A, and 19C) are horizontally and vertically separated from the traces 733' and 736' (see FIG. 18E) connected to the third twisted pair WP3 (see FIGS. 1, 19B, and 19C). Additionally, the traces 733' and 736' connected to the third twisted pair WP3 (see FIGS. 1, 19B, and 19C) are horizontally and vertically separated from the traces 734' and 735' (see FIG. 18B) connected to the first twisted pair WP1 (see FIGS. 1, 19A, and 19C). Further, the traces 734' and 735' connected to the first twisted pair WP1 (see FIGS. 1, 19A, and 19C) are horizontally and vertically separated from the traces 737' and 738' (see FIG. 18E) connected to the fourth twisted pair WP4 (see FIGS. 1, 19B, and 19C).

The arrangement of the traces 731'-738' on the layers L1'-L4' illustrated in FIGS. 18B-18E helps reduce crosstalk between the traces 731'-738' at or near the plated through-holes 721-728. Further, this arrangement provides sufficient "empty" portions of the substrate 218' that may be used for mechanical tooling holes.

Referring to FIG. 18C, the (second) layer L2' includes conductors (e.g., traces) that may be arranged to form a capacitor 764' that capacitively couples the wires PW4 and PW5 of the first twisted pair WP1 (see FIGS. 1, 19A, and 19C) together. The middle second layer L2' includes electrically conductive (e.g., plated) portions 772' and 774' that function together as a single (split or divided) conductive plane. Neither of the conductive portions 772' and 774' is physically connected to any of the signal carrying elements on the substrate 218'. By way of a non-limiting example, the conductive portions 772' and 774' may be formed by copper plating. The conductive portions 772' and 774' help maintain impedance for the traces 737' and 738', which carry the signals of the fourth twisted pair WP4 (see FIGS. 1, 19B, and 19C).

Referring to FIG. 18D, the middle third layer L3' includes an electrically conductive (e.g., plated) portion 770' that functions as a conductive plane that is not physically connected to any of the signal carrying elements on the substrate 218'. By way of a non-limiting example, the conductive portion 770' may be formed by copper plating. The conductive portion 770' helps maintain impedance for the traces 731'-736', which carry the signals of the first, second, and third twisted pairs WP1-WP3 (see FIGS. 1 and 19C). The conductive plane formed by the conductive portion 770' may be electrically (e.g., capacitively) coupled to the conductive plane formed by the conductive portions 772' and 774'. In the embodiment illustrated, the conductive portion 770' is electrically and physically connected to the conductive portions 772' and 774' by vias 775A' and 7756', respectively. As mentioned above, the traces 734' and 735' that conduct signals carried by the first twisted pair WP1 (see FIGS. 1, 19A, and 19C) are positioned on the top layer L1', and the traces 733' and 736' that conduct signals carried by the third twisted pair WP3 (see FIGS. 1, 19B, and 19C) are positioned on the bottom layer L4'. The conductive portion 770' may help reduce crosstalk between the traces 734' and 735' and the traces 733' and 736'.

The conductive planes provided by the conductive portions 770'-774' help shield the twisted pairs WP1 and WP2 (see FIGS. 1, 19A, and 19C) attached to the first side 750' of the substrate 218' from the twisted pairs WP3 and WP4 (see FIGS. 1, 19B, and 19C) attached to the second side 752' of the substrate 218', and vice versa. The conductive portions 770'-774' may be characterized as being floating conductive "ungrounded" planes.

Referring to FIG. 18C, the middle second layer L2 includes electrically conductive (e.g., plated) portions 783A', 7836', 785', and 787' that function as capacitor plates and are substantially identical to the electrically conductive (e.g., plated) portions 783A, 7836, 785, and 787 (see FIG. 17D). Thus, the capacitor plate portions 783A' and 7836' are both electrically connected to the via pair 713 (and the plug contact P3 illustrated in FIGS. 15 and 19A), the capacitor plate portion 785' is electrically connected to the via pair 715 (and the plug contact P5 illustrated in FIGS. 15 and 19A), the capacitor plate portion 787' is electrically connected to the via pair 717 (and the plug contact P7 illustrated in FIGS. 15 and 19A).

Referring to FIG. 18D, the middle second layer L3 includes electrically conductive (e.g., plated) portions 782', 784', 786A', and 7866' that function as capacitor plates and are substantially identical to the electrically conductive portions 782, 784, 786A, and 7866 (see FIG. 17C). Thus, the capacitor plate portion 782' is electrically connected to the via pair 712 (and the plug contact P2 illustrated in FIGS. 15 and 19A), the capacitor plate portion 784' is electrically connected to the via pair 714 (and the plug contact P4 illustrated in FIGS. 15 and 19A), the capacitor plate portions 786A' and 7866' are both electrically connected to the via pair 716 (and the plug contact P6 illustrated in FIGS. 15 and 19A).

Together, the capacitor plate portions 782' and 783A' form a first capacitor that capacitively couples the plug contacts P2 and P3 (see FIGS. 15 and 19A) together. Similarly, the capacitor plate portions 784' and 7836' form a second capacitor that capacitively couples the plug contacts P4 and P3 (see FIGS. 15 and 19A) together. Thus, the plug contacts P2, P3, and P4 (see FIGS. 15 and 19A) are all capacitively coupled together by the capacitor plate portions 782'-784'.

Together, the capacitor plate portions 786A' and 785' form a third capacitor that capacitively couples the plug contacts P6 and P5 (see FIGS. 15 and 19A) together. Similarly, the capacitor plate portions 7866' and 787' form a fourth capacitor that capacitively couples the plug contacts P6 and P7 (see FIGS. 15 and 19A) together. Thus, the plug contacts P5, P6, and P7 (see FIGS. 15 and 19A) are all capacitively coupled together by the capacitor plate portions 785'-787'.

The first capacitor (formed by the capacitor plate portions 782' and 783A') provides crosstalk compensation for the second and third twisted pairs WP2 and WP3 (see FIGS. 1 and 19C). In other words, the first capacitor helps reduce crosstalk between the second and third twisted pairs WP2 and WP3 (see FIGS. 1 and 19C).

Together, the second capacitor (formed by the capacitor plate portions 784' and 7836') and the third capacitor (formed by the capacitor plate portions 786A' and 785') provide crosstalk compensation for the first and third twisted pairs WP1 and WP3 (see FIGS. 1 and 19C). In other words, the second and third capacitors help reduce crosstalk (e.g., NEXT or near end crosstalk) between the first and third twisted pairs WP1 and WP3 (see FIGS. 1 and 19C). Further, the second and third capacitors are positioned close to locations at which the plug contacts P3-P6 (see FIGS. 15 and 19A) contact the outlet contacts J3-J6 (see FIGS. 27, 29, and 32), respectively.

The fourth capacitor (formed by the capacitor plate portions 786B' and 787') provides crosstalk compensation for the third and fourth twisted pairs WP3 and WP4 (see FIGS. 1, 19B, and 19C). In other words, the fourth capacitor helps reduce crosstalk between the third and fourth twisted pairs WP3 and WP4 (see FIGS. 1, 19B, and 19C).

Referring to FIG. 6, for the sake of brevity, the plug 100 is described and illustrated as including the substrate 218. However, the plug 100 may include the substrate 218' (see FIG. 18A) instead and in place of the substrate 218.

Traditional plug contacts (not shown) are often referred to as "spades." Spade shaped contacts are large and flat pieces of spring-copper (typically phosphor-bronze) with a gold-plated contact side opposite an insulation displacement contact side that is pressed through wire insulation into contact with a wire conductor.

Referring to FIG. 15, the plug contacts P1-P8 differ from traditional spade shaped plug contacts in at least two ways. First, the plug contacts P1-P8 are smaller than traditional spade shaped plug contacts, which reduces electromagnetic interference between the plug contacts P1-P8. Second, the plug contacts P1-P8 have a lower profile (or height), which allows the substrate 218 to be positioned about mid-way between the housing cover 212 (see FIGS. 1, 3-6, 9-11, and 26) and the base portion 320 (see FIGS. 7, 8, and 14) within the housing body 210 (see FIGS. 1, 3-8, 11, 14, and 26).

The plug contacts P1-P8 should be positioned inside the plug 100 such that they each extend above the bottom outer surface 326 (see FIG. 7) of the housing body 210 by about a desired distance (e.g., about 0.24 inches). However, manufacturing realities may cause the dimensions of the components of the plug 100 to vary. This could cause the plug contacts P1-P8 to extend above the bottom outer surface 326 (see FIG. 7) by a distance other than the desired distance (e.g., about 0.24 inches). This problem may be avoided by using a two-stage contact installation process. Using this process, the plug contacts P1-P8 are initially inserted into the via pairs 711-718 (see FIG. 17A), respectively, to an initial (shallow) depth (e.g., before the cable C2 is attached to the substrate 218). This insertion may be performed by a precision machine (not shown) before or after the substrate 218 has been separated from a panel (not shown) including a plurality of substrates (not shown) each like the substrate 218.

After the plug contacts P1-P8 have been inserted (and the substrate 218 has been separated from panel, if necessary), the comb member 222 is attached to the substrate 218 over the plug contacts P1-P8. As mentioned above, the first and second anchoring projections 950 and 952 (see FIG. 23) may be configured to be press fit into the through-holes 790 and 792 (see FIG. 17A) formed in the substrate 218 and to attach the comb member 222 to the substrate 218. The comb member 222 protects the plug contacts P1-P8 during subsequent handling and assembly operations.

Next, referring to FIG. 26, the cable C2 may be coupled to the substrate 218. The strain relief member 230 is slipped over the cable C2 before it is coupled to the substrate 218. Then, the substrate 218 is positioned on the insulator 216 and the comb member 222 (which is attached to the substrate 218) is clipped onto the insulator 216.

The ground spring 232 is positioned inside the second slot 312 (see FIGS. 7 and 11) and the latch member 214 (see FIGS. 1, 3-6, and 11-14) is attached to the housing body 210. Then, referring to FIG. 26, the substrate 218, the insulator 216, the comb member 222, the strain relief member 230, and the cable C2 are positioned inside the housing body 210. Next, the housing cover 212 is attached to the housing body 210. Then, the plug contacts P1-P8 (see FIGS. 15 and 19A) may be pressed further into the via pairs 711-718 (see FIG. 17A), respectively (e.g., to a final (desired) depth) through the through-holes 901-908 (see FIG. 22) of the comb member 222. Referring to FIG. 3, this two-stage contact installation process allows the plug 100 to have a precise thickness (or height) with the plug contacts P1-P8 (see FIGS. 15 and 19A) positioned as desired heights within the plug 100.

Figure 20A:
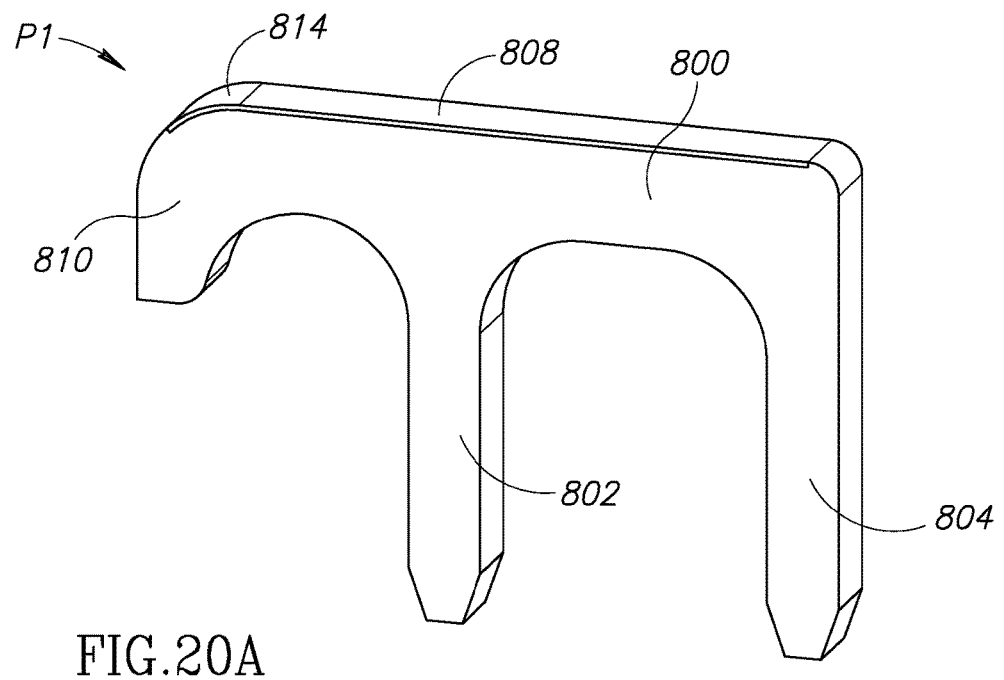
FIG. 20A is a rear top perspective view of a first embodiment of an odd numbered plug contact.

Referring to FIG. 15, the odd numbered plug contacts P1, P3, P5, and P7 are substantially identical to one another. For the sake of brevity, only the structure of the plug contact P1 will be described in detail. As shown in FIG. 20A, the plug contact P1 may be substantially planar and characterized as being a blade-type plug contact. By way of a non-limiting example, the plug contact P1 may be stamped out of an electrically conductive sheet material.

Referring to FIG. 20A, the plug contact P1 has an upper connecting portion 800 attached to downwardly extending first and second legs 802 and 804. The first and second legs 802 and 804 are configured to be inserted (or press fit) into the first via pair 711 (see FIG. 17A) to position the connecting portion 800 alongside the first side 750 (see FIG. 19A) of the substrate 218 (see FIGS. 6, 11, 15, 17A, 19A, 19B, and 26). Similarly, the first and second legs 802 and 804 of the plug contacts P3, P5 and P7 (see FIGS. 15 and 19A) are configured to be inserted (or press fit) into the via pairs 713, 715, and 717 (see FIG. 17A), respectively, to position the connecting portions 800 of the plug contacts P3, P5 and P7 alongside the first side 750 (see FIG. 19A) of the substrate 218 (see FIGS. 6, 11, 15, 17A, 19A, 19B, and 26). In the embodiment illustrated, the connecting portions 800 of the plug contacts P1, P3, P5, and P7 (see FIGS. 15 and 19A) are positioned above the first side 750 (see FIG. 19A) of the substrate 218. However, this is not a requirement. The first and second legs 802 and 804 of the plug contacts P1, P3, P5, and P7 may extend through the via pairs 711, 713, 715, and 717, respectively, and into the recess pairs 611, 613, 615, and 617 (see FIG. 16), respectively. The first and second legs 802 and 804 are set firmly into the substrate 218 and resist being pressed deeper into the first via pair 711 (see FIG. 17A), resist being pulled out of the first via pair 711, and also resist torque that would deform the plug contact P1.

In the embodiment illustrated, the connecting portion 800 has a substantially planar top surface 808 and a front overhang portion 810 that extends forwardly away from the first leg 802. The top surface 808 or a portion thereof may be plated with gold. The front overhang portion 810 may optionally extend forwardly beyond the front edge 706 (see FIG. 15) of the substrate 218. As will be described below, referring to FIG. 27, the outlet 120 includes a plurality of outlet contacts J1-J8. When the plug 100 and the outlet 120 are mated together as shown in FIG. 1, the front overhang portion 810 (see FIG. 20A) of each of the plug contacts P1, P3, P5, and P7 (see FIGS. 15 and 19A) physically contacts the outlet contacts J1, J3, J5, and J7, respectively, and form electrical connections therewith.

Referring to FIG. 20A, the front overhang portion 810 has a contact portion 814 whereat the outlet contact J1 contacts the plug contact P1. The contact portion 814 may be plated with gold. The first and second legs 802 and 804 are "downstream" of the contact portion 814. Even if the location of the contact portion 814 moves along the front overhang portion 810, the contact portion 814 remains "upstream" from the first and second legs 802 and 804. Thus, the substrate 218 (and its electrical components) also remains "downstream" from the contact portion 814. In the embodiment illustrated, the connecting portion 800 is solid and does not include any through-holes.

Figure 20B:
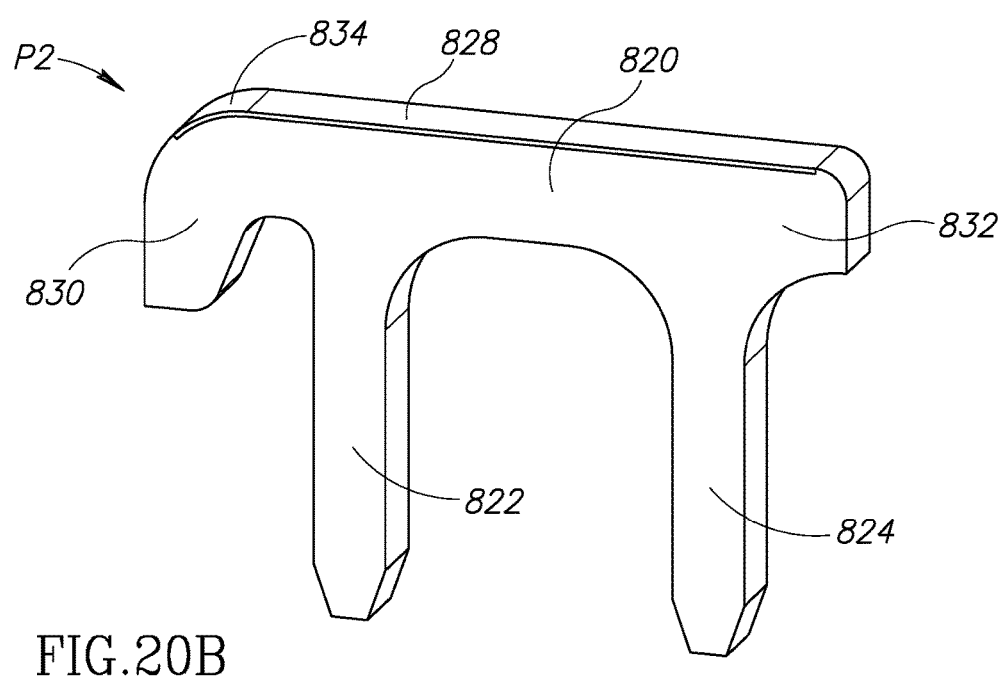
FIG. 20B is a rear top perspective view of a first embodiment of an even numbered plug contact.

Referring to FIG. 15, the even numbered plug contacts P2, P4, P6, and P8 are substantially identical to one another. For the sake of brevity, only the structure of the plug contact P2 will be described in detail. As shown in FIG. 20B, the plug contact P2 may be substantially planar and characterized as being a blade-type plug contact. By way of a non-limiting example, the plug contact P2 may be stamped out of an electrically conductive sheet material.

Referring to FIG. 20B, the plug contact P2 has an upper connecting portion 820 attached to downwardly extending first and second legs 822 and 824. The connecting portion 820 is substantially identical to the connecting portion 800 (see FIG. 20A) of the plug contact P1 and includes a substantially planar top surface 828 substantially identical to the top surface 808 (see FIG. 20A) of the plug contact P1. The top surface 828 may be plated with gold.

The connecting portion 820 also includes a front overhang portion 830 substantially identical to the front overhang portion 810 (see FIG. 20A) of the plug contact P1. The front overhang portion 830 may optionally extend forwardly beyond the front edge 706 (see FIG. 15) of the substrate 218. When the plug 100 and the outlet 120 are mated together as shown in FIG. 1, the front overhang portion 830 (see FIG. 20B) of each of the plug contacts P2, P4, P6, and P8 (see FIGS. 15 and 19A) physically contacts the outlet contacts J2, J4, J6, and J8, respectively, and form electrical connections therewith.

Referring to FIG. 20B, the front overhang portion 830 has a contact portion 834 whereat the outlet contact J2 contacts the plug contact P2. The contact portion 834 may be plated with gold. The first and second legs 822 and 824 are "downstream" of the contact portion 834. Even if the location of the contact portion 834 moves along the front overhang portion 830, the contact portion 834 remains "upstream" from the first and second legs 822 and 824. Thus, the substrate 218 (and its electrical components) also remains "downstream" from the contact portion 834. In the embodiment illustrated, the connecting portion 820 is solid and does not include any through-holes.

The first and second legs 822 and 824 are substantially identical to the legs 802 and 804 (see FIG. 20A) of the plug contact P1. However, the first and second legs 822 and 824 are shifted forwardly. Thus, the front overhang portion 830 is shorter than the front overhang portion 810 (see FIG. 20A) of the plug contact P1. Also, a back overhang portion 832 extends rearwardly away from the second leg 824.

The first and second legs 822 and 824 configured to be inserted (or press fit) into the second via pair 712 (see FIG. 17A) to position the connecting portion 820 alongside the first side 750 (see FIG. 19A) of the substrate 218 (see FIGS. 6, 11, 15, 17A, 19A, 19B, and 26). Similarly, the first and second legs 822 and 824 of the plug contacts P4, P6 and P8 (see FIGS. 15 and 19A) are configured to be inserted (or press fit) into the via pairs 714, 716, and 718 (see FIG. 17A), respectively, to position the connecting portions 820 of the plug contacts P4, P6 and P8 alongside the first side 750 (see FIG. 19A) of the substrate 218 (see FIGS. 6, 11, 15, 17A, 19A, 19B, and 26). In the embodiment illustrated, the connecting portions 820 of the plug contacts P2, P4, P6, and P8 (see FIGS. 15 and 19A) are positioned above the first side 750 (see FIG. 19A) of the substrate 218. However, this is not a requirement. The first and second legs 822 and 824 of the plug contacts P2, P4, P6, and P8 may extend through the via pairs 712, 714, 716, and 718, respectively, and into the recess pairs 612, 614, 616, and 618 (see FIG. 16), respectively. The first and second legs 822 and 824 are set firmly into the substrate 218 and resist being pressed deeper into the second via pair 712 (see FIG. 17A), resist being pulled out of the second via pair 712, and also resist torque that would deform the plug contact P2.

Referring to FIG. 17A, as mentioned above, adjacent ones of the via pairs 711-718 are offset from one another longitudinally or staggered in a zigzag like pattern. However, as shown in FIG. 19A, the plug contacts P1-P8 are aligned laterally along the front edge 706 (see FIG. 17A) of the substrate 218. This may be achieved by positioning the legs 802 and 804 of the odd numbered plug contacts P1, P3, P5, and P7 (see FIG. 15) as shown in FIG. 20A and positioning the legs 822 and 824 of the even numbered plug contacts P2, P4, P6, and P8 (see FIG. 15) as shown in FIG. 20B.

Figure 20C:
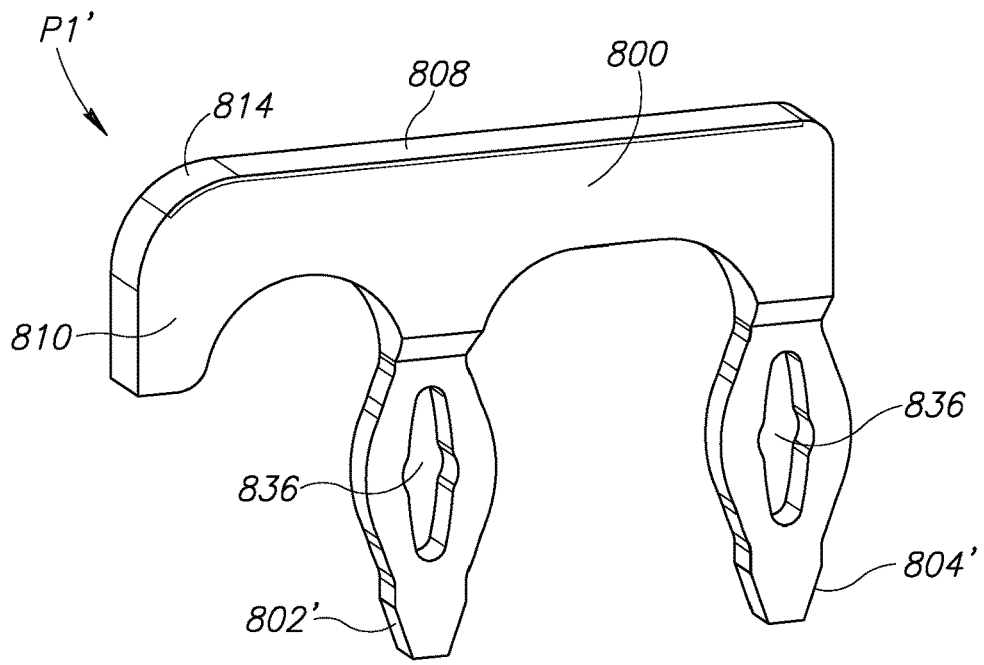
FIG. 20C is a front top perspective view of a second embodiment of an odd numbered plug contact.
Figure 20D:
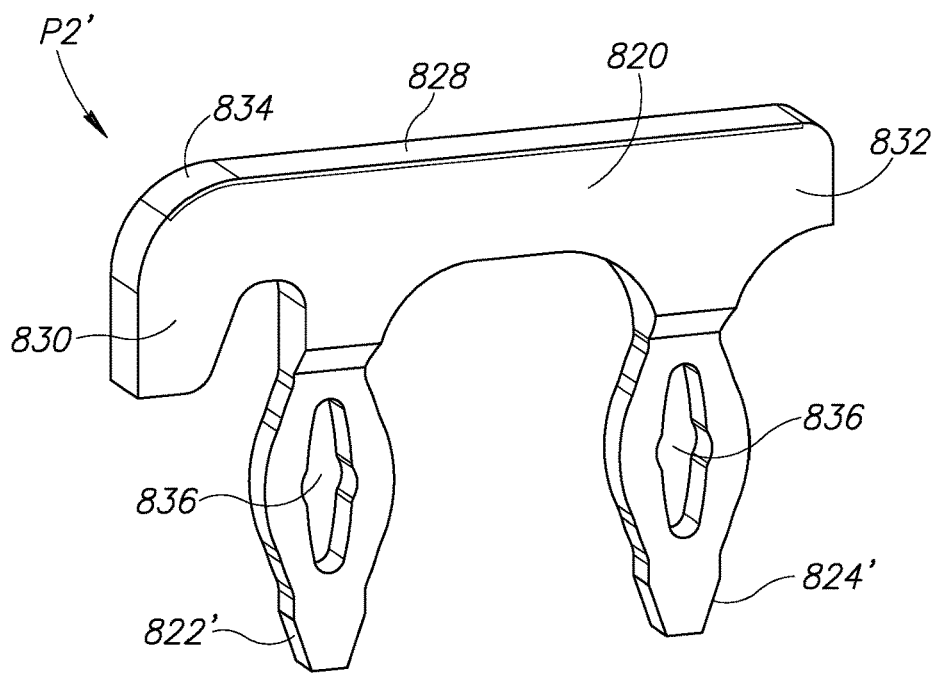
FIG. 20D is a front top perspective view of a second embodiment of an even numbered plug contact.

FIG. 20C is a front top perspective view of an alternate embodiment of a plug contact P1' that may be used to implement each of the odd numbered plug contacts P1, P3, P5, and P7 (see FIG. 15), and FIG. 20D is a front top perspective view of an alternate embodiment of a plug contact P2' that may be used to implement each of the even numbered plug contacts P2, P4, P6, and P8 (see FIG. 15). The plug contact P1' differs from the plug contact P1 (see FIG. 20A) only with respect to its first and second legs 802' and 804'. Similarly, the plug contact P2' differs from the plug contact P2 (see FIG. 20B) only with respect to its first and second legs 822' and 824'. Specifically, each of the legs 802', 804', 822', and 824' includes an eyelet 836. Otherwise, the plug contacts P1' and P2' are substantially identical to the plug contacts P1 and P2.

Figure 21A:
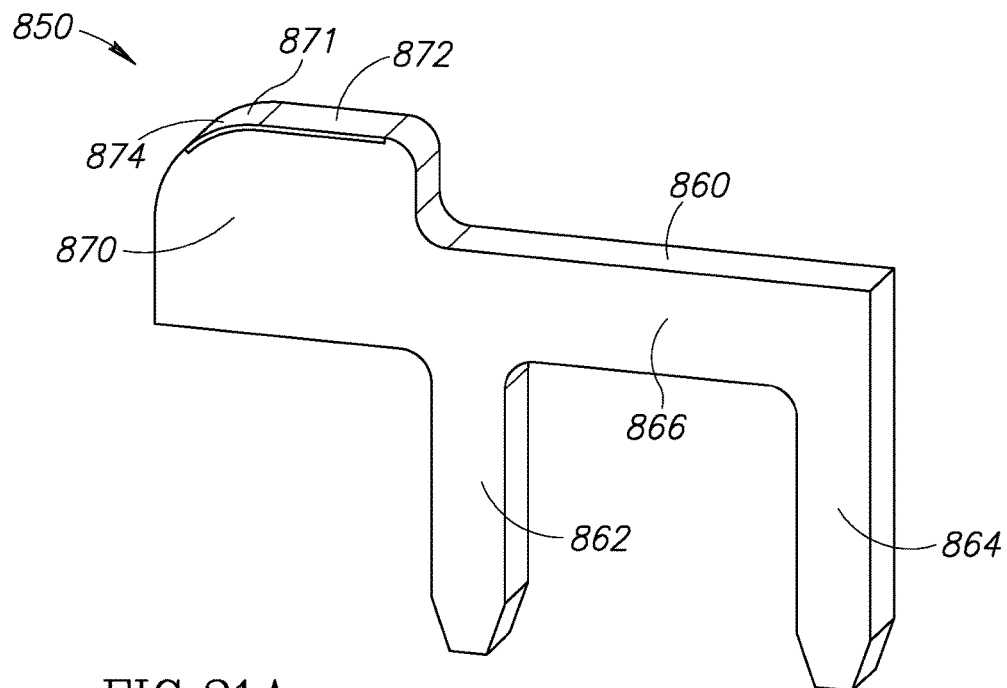
FIG. 21A is a rear top perspective view of a third embodiment of an odd numbered plug contact.
Figure 21B:
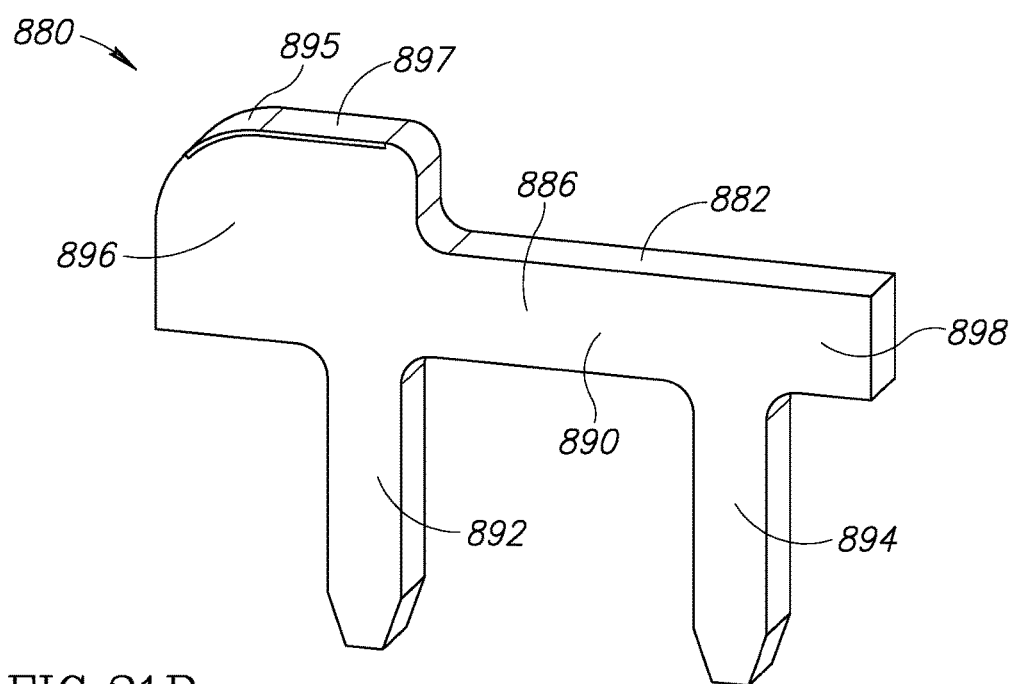
FIG. 21B is a rear top perspective view of a third embodiment of an even numbered plug contact.

FIG. 21A is a perspective view of an alternate embodiment of a plug contact 850 that may be used to implement each of the odd numbered plug contacts P1, P3, P5, and P7, and FIG. 21B is a perspective view of an alternate embodiment of a plug contact 880 that may be used to implement each of the even numbered plug contacts P2, P4, P6, and P8. As shown in FIGS. 21A and 21B, the plug contacts 850 and 880 may each be substantially planar and characterized as being a blade-type plug contact. By way of a non-limiting example, the plug contacts 850 and 880 may each be stamped out of an electrically conductive sheet material.

Referring to FIG. 21A, the plug contact 850 has an upper connecting portion 860 attached to downwardly extending first and second legs 862 and 864. The first and second legs 862 and 864 are configured to be inserted (or press fit) into one of the via pairs 711, 713, 715, and 717 (see FIG. 17A) to position the connecting portion 860 alongside the first side 750 (see FIG. 19A) of the substrate 218 (see FIGS. 6, 11, 15, 17A, 19A, 19B, and 26). The first and second legs 862 and 864 may extend through one of the via pairs 711, 713, 715, and 717, respectively, and into one of the recess pairs 611, 613, 615, and 617 (see FIG. 16), respectively. The first and second legs 862 and 864 are set firmly into the substrate 218 and resist being pressed deeper into the via pair, resist being pulled out of the via pair, and also resist torque that would deform the plug contact 850.

Figure 27:
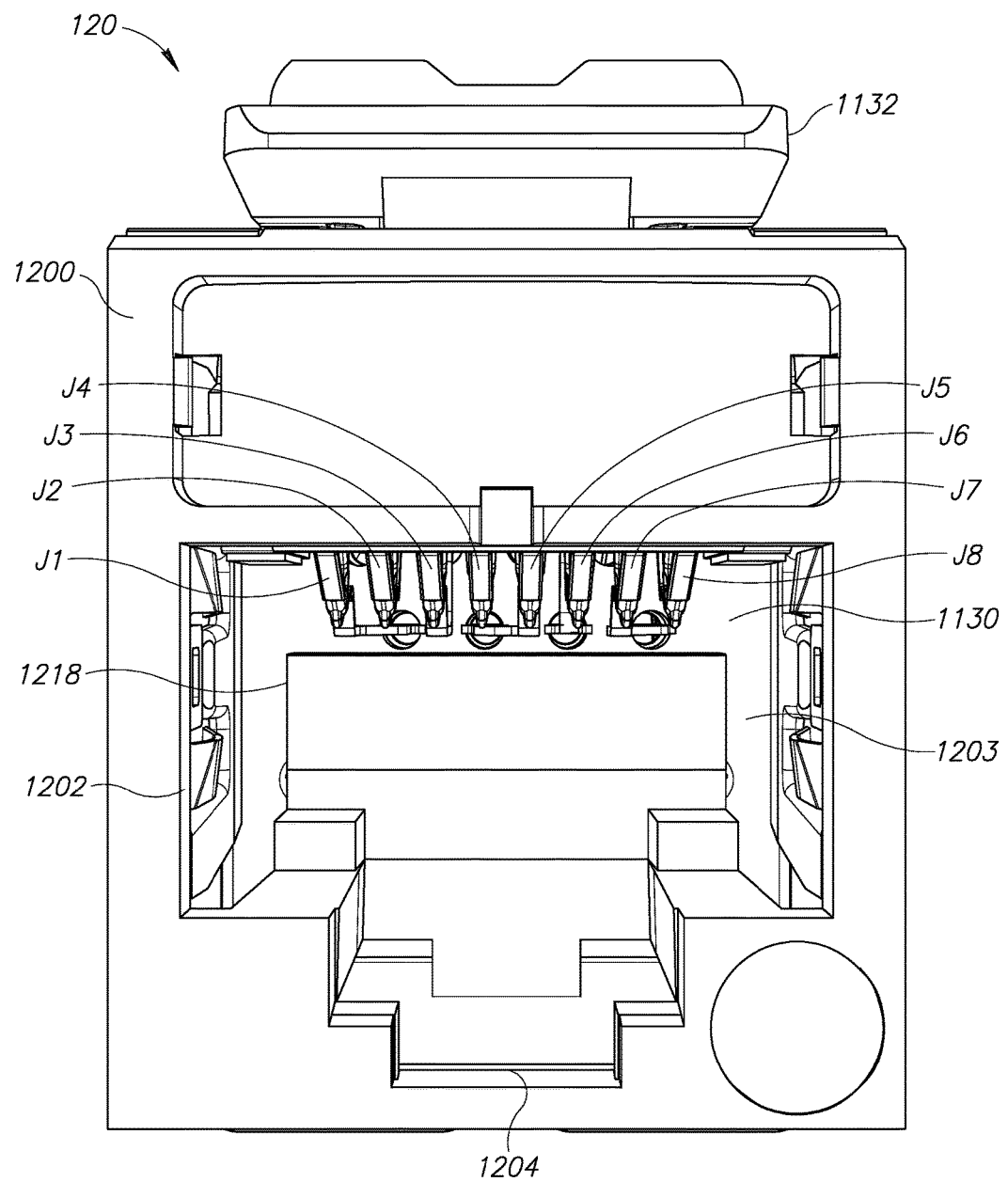
FIG. 27 is a front perspective view of the communication outlet of FIG. 1.

In the embodiment illustrated, the connecting portion 860 includes a first portion 866 that extends between the first and second legs 862 and 864, and a front overhang portion 870 that extends forwardly away from the first leg 862. The front overhang portion 870 extends upwardly beyond the first portion 866. Thus, the connecting portion 860 has a top surface 872 that is not planar. Referring to FIG. 27, when the plug 100 (see FIGS. 1, 3-6, and 11) and the outlet 120 are mated together (as shown in FIG. 1), the front overhang portions 870 (see FIG. 21A) physically contacts a corresponding one of the outlet contacts J1, J3, J5, and J7, respectively, and forms an electrical connections therewith. Referring to FIG. 21A, a top surface 871 of the front overhang portions 870 may be plated with gold. Because the front overhang portion 870 extends upwardly, the first and second legs 862 and 864 may be shorter than the first and second legs 802 and 804 (see FIG. 20A) and the first portion 866 may be positioned closer to the substrate 218 (see FIGS. 6, 11, 15, 17A, 19A, 19B, and 26) than the connecting portion 800 (see FIG. 20A). Further, the connecting portion 860 may have a smaller volume and area than the connecting portion 800 (see FIG. 20A). In the embodiment illustrated, the connecting portion 860 is solid and does not include any through-holes.

The front overhang portion 870 has a contact portion 874 whereat one of the outlet contacts J1, J3, J5, and J7 (see FIGS. 27 and 29) contacts the plug contact 850. The contact portion 874 may be plated with gold. The first and second legs 862 and 864 are "downstream" of the contact portion 874. Even if the location of the contact portion 874 moves along the front overhang portion 870, the contact portion 874 remains "upstream" from the first and second legs 862 and 864. Thus, the substrate 218 (and its electrical components) also remains "downstream" from the contact portion 874.

Referring to FIG. 21B, the plug contact 880 has an upper connecting portion 890 attached to downwardly extending first and second legs 892 and 894. The connecting portion 890 is substantially identical to the connecting portion 860 (see FIG. 21A) of the plug contact 850 and includes a non-planar top surface 882 substantially identical to the top surface 872 (see FIG. 21A) of the plug contact 850. The top surface 882 or a portion thereof may be plated with gold.

The connecting portion 890 also includes a first portion 886 that extends between the first and second legs 892 and 894, and a front overhang portion 896 that extends forwardly away from the first leg 892. The connecting portion 890 and the front overhang portion 896 are substantially identical to the connecting portion 860 (see FIG. 21A) and the front overhang portion 870 (see FIG. 21A), respectively, of the plug contact 850.

The first and second legs 892 and 894 are substantially identical to the first and second legs 862 and 864 (see FIG. 21A) of the plug contact 850. However, the first and second legs 892 and 894 are shifted forwardly. Thus, the front overhang portion 896 is shorter than the front overhang portion 870 (see FIG. 21A) of the plug contact 850. Also, a back overhang portion 898 extends rearwardly away from the second leg 894.

The first and second legs 892 and 894 are configured to be inserted (or press fit) into one of the via pairs 712, 714, 716, and 718 (see FIG. 17A) to position the connecting portion 860 alongside the first side 750 (see FIG. 19A) of the substrate 218 (see FIGS. 6, 11, 15, 17A, 19A, 19B, and 26). The first and second legs 892 and 894 may extend through one of the via pairs 712, 714, 716, and 718, respectively, and into one of the recess pairs 612, 614, 616, and 618 (see FIG. 16), respectively. The first and second legs 892 and 894 are set firmly into the substrate 218 and resist being pressed deeper into the via pair, resist being pulled out of the via pair, and also resist torque that would deform the plug contact 850.

The front overhang portion 896 extends upwardly beyond the first portion 886. Referring to FIG. 27, when the plug 100 (see FIGS. 1, 3-6, and 11) and the outlet 120 are mated together (as shown in FIG. 1), the front overhang portions 896 (see FIG. 21B) physically contacts a corresponding one of the outlet contacts J2, J4, J6, and J8, respectively, and forms an electrical connections therewith. Referring to FIG. 21B, a top surface 897 of the front overhang portions 896 may be plated with gold.

The front overhang portion 896 has a contact portion 895 whereat one of the outlet contacts J2, J4, J6, and J8 (see FIGS. 27 and 29) contacts the plug contact 880. The contact portion 895 may be plated with gold. The first and second legs 892 and 894 are "downstream" of the contact portion 895. Even if the location of the contact portion 895 moves along the front overhang portion 896, the contact portion 895 remains "upstream" from the first and second legs 892 and 894. Thus, the substrate 218 (and its electrical components) also remains "downstream" from the contact portion 895.

Referring to FIG. 15, as mentioned above, the comb member 222 is positioned inside the front chamber portion 344 (see FIGS. 7 and 14) of the housing body 210 (see FIGS. 1, 3-8, 11, 14, and 26) and extends between the first and second sidewalls 330 and 332 (see FIGS. 7, 11, and 14) thereby closing the front chamber portion 344. The comb member 222 is substantially dielectric and has a cover portion 900 that covers a front portion of substrate 218 that begins at the front edge 706 of the substrate 218 and stops before the plated through-holes 721-728 (see FIG. 17A). The cover portion 900 also covers the plug contacts 220.

Figure 22:
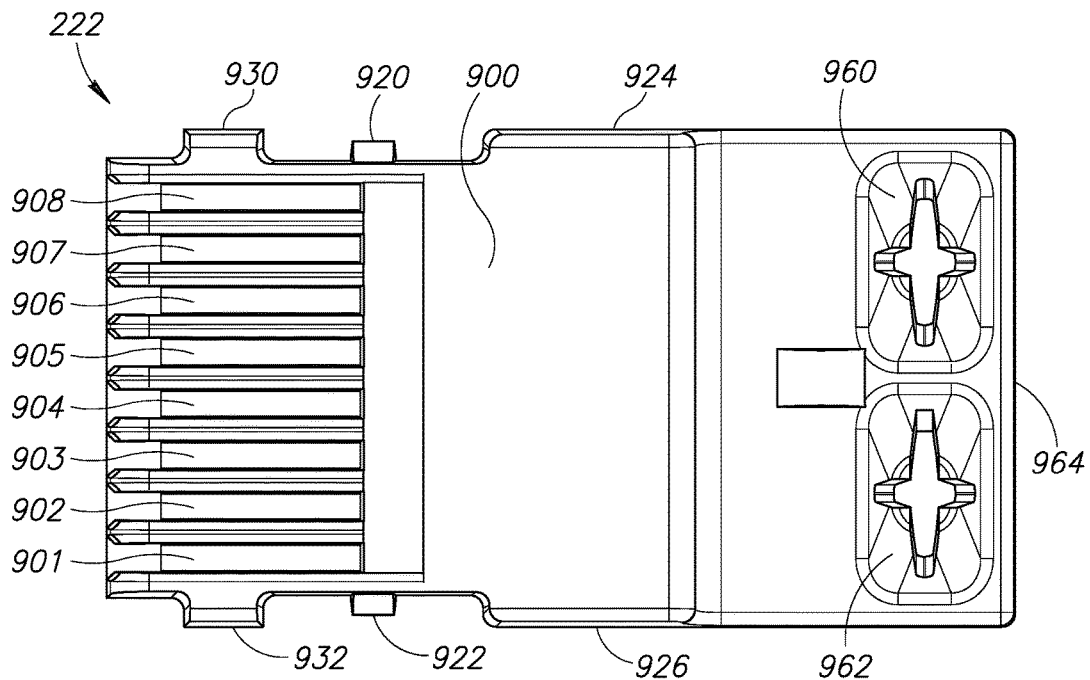
FIG. 22 is a top plan view of the comb member of the plug of FIG. 1.

Referring to FIG. 22, a plurality of through-holes 901-908 aligned with the plug contacts P1-P8 (see FIGS. 15 and 19A), respectively, are formed in the cover portion 900. The through-holes 901-908 provide passages through which the outlet contacts J1-J8 (see FIGS. 27 and 29) may travel and contact the plug contacts P1-P8, respectively, when the plug 100 (see FIGS. 1, 3-6, and 11) is inserted into the outlet 120 (as shown in FIG. 1).

Figure 23:
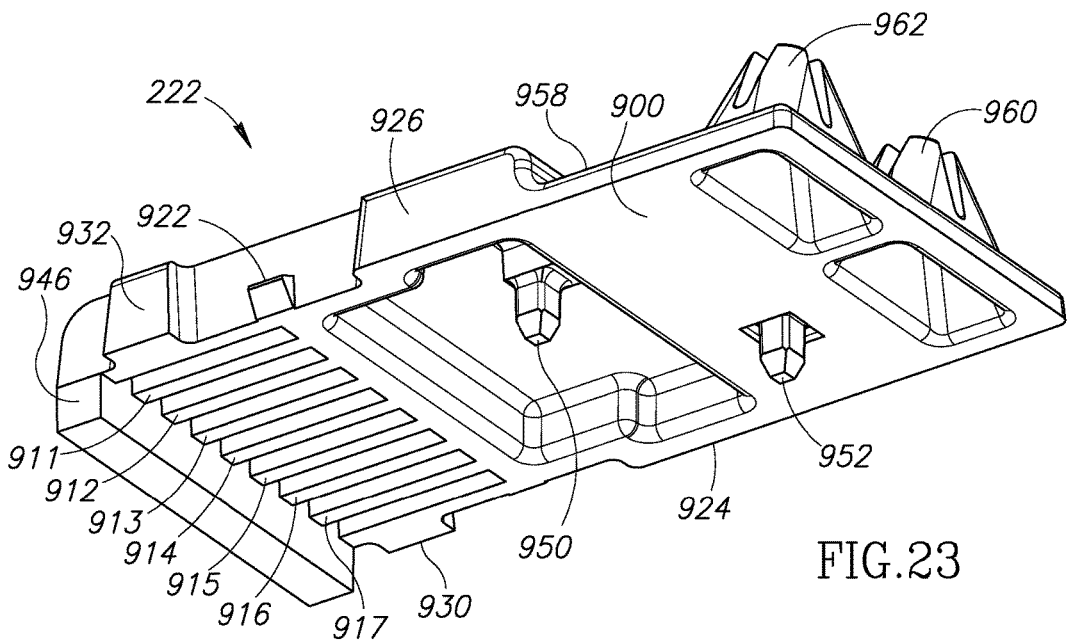
FIG. 23 is a rear bottom perspective view of the comb member of the plug of FIG. 1.

Referring to FIG. 23, the comb member 222 includes a plurality of ribs or dividers 911-917. The divider 911 is positioned between and separates the plug contacts P1 and P2 from one another. Similarly, the divider 912 is positioned between and separates the plug contacts P2 and P3 from one another, the divider 913 is positioned between and separates the plug contacts P3 and P4 from one another, the divider 914 is positioned between and separates the plug contacts P4 and P5 from one another, the divider 915 is positioned between and separates the plug contacts P5 and P6 from one another, the divider 916 is positioned between and separates the plug contacts P6 and P7 from one another, and the divider 917 is positioned between and separates the plug contacts P7 and P8 from one another.

Referring to FIG. 15, first and second projections 920 (see FIG. 22) and 922 extend outwardly from opposite sides 924 and 926, respectively, of the cover portion 900. The first and second projections 920 (see FIG. 22) and 922 are configured to be received inside the openings 644 and 646, respectively, formed in the first and second projections 640 and 642, respectively, of the insulator 216. In this manner, the comb member 222 snaps into the insulator 216 with the substrate 218 (and the plug contacts P1-P8) sandwiched therebetween.

Referring to FIG. 15, first and second positioning projections 930 and 932 extend outwardly from the sides 924 and 926, respectively, of the cover portion 900. The first and second positioning projections 930 and 932 are positioned alongside the sidewalls 330 and 332 (see FIGS. 7, 11, and 14), respectively, of the housing body 210. Further, the first positioning projection 930 is positioned longitudinally in between the first projection 640 of the insulator 216 and the first wall portion 334 extending into the front opening 304. Similarly, the second positioning projection 932 is positioned longitudinally in between the second projection 642 of the insulator 216 and the second wall portion 336 extending into the front opening 304.

Referring to FIG. 23, a front wall 946 extends downwardly from the cover portion 900. Referring to FIG. 15, the front wall 946 extends along the front edge 706 of the substrate 218 and abuts the front support surface 652 of the insulator 216. Thus, the front wall 946 covers the front edge 706 of the substrate 218 within the front opening 304 (see FIGS. 7, 8, and 14) of the housing body 210 (see FIGS. 1, 3-8, 11, 14, and 26).

Referring to FIG. 23, first and second anchoring projections 950 and 952 extend downwardly from the cover portion 900. The first and second anchoring projections 950 and 952 are configured to be received inside the through-holes 790 and 792 (see FIG. 17A) formed in the substrate 218. The first and second anchoring projections 950 and 952 (see FIG. 23) may be configured to be press fit into the through-holes 790 and 792 (see FIG. 17A) formed in the substrate 218 and thereby attach the comb member 222 to the substrate 218.

Referring to FIGS. 22 and 23, the cover portion 900 includes a recessed portion 958 with one or more crushable projections 960 and 962 extending upwardly therefrom. Referring to FIG. 11, when the comb member 222 is positioned inside the housing body 210, the recessed portion 958 (see FIG. 23) extends from in front of the grooves 354 (see FIG. 7) and 356 of the housing body 210 to behind the pivot pins 422 (see FIG. 9) and 424 of the housing cover 212. In other words, the projections 960 and 962 are positioned behind the grooves 354 (see FIG. 7) and 356 of the housing body 210. In front of the grooves 354 (see FIG. 7) and 356, the recessed portion 958 provides sufficient space for the housing cover 212 to rotate about the first and second pivot pins 422 and 424. For example, as the housing cover 212 is rotated about the first and second pivot pins 422 (see FIG. 9) and 424 from the closed position (see FIGS. 1 and 3-5) to the open position (see FIG. 11), the front sidewall 420 of the housing cover 212 rotates into the recessed portion 958 (see FIG. 23). When the housing cover 212 is in the closed position (see FIGS. 1 and 3-5), the housing cover 212 may compress and/or crush the projections 960 and 962. Referring to FIG. 6, the projections 960 and 962 help retain the internal components (e.g., the comb member 222, the substrate 218, and the insulator 216) inside the housing body 210 when the housing cover 212 is in the closed position (see FIGS. 1 and 3-5). Referring to FIG. 22, the comb member 222 has a rear edge 964 that is positioned in front of the plated through-holes 721-728 (see FIG. 17A) of the substrate 218 (see FIGS. 6, 11, 15, 17A, 19A, 19B, and 26).

Figure 24A:
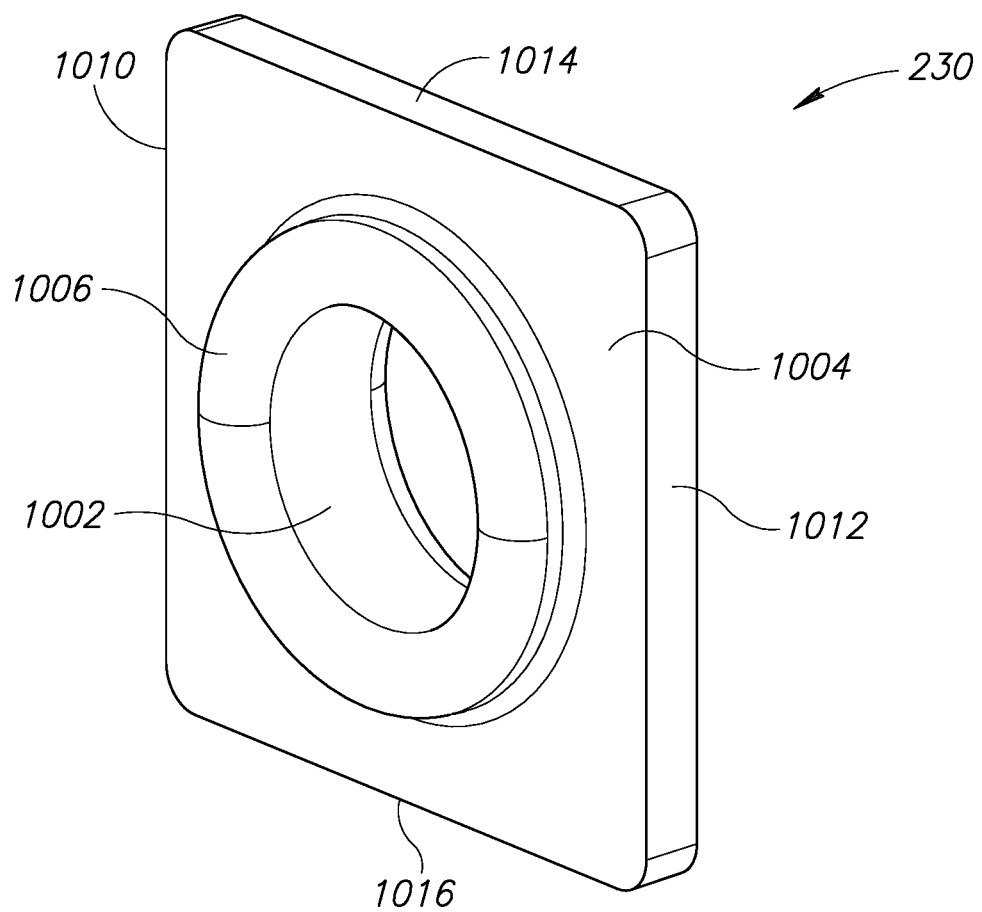
FIG. 24A is a rear top perspective view of a first embodiment of a strain relief member of the plug of FIG. 1.

Referring to FIG. 24A, the strain relief member 230 has a through-hole 1002 defined in a substantially planar body portion 1004. The through-hole 1002 is configured to allow the cable C2 (see FIGS. 1, 3-6, 11, 19A, 19B, and 26) to pass therethrough. The body portion 1004 includes a ring shaped gripping portion 1006 that extends around the through-hole 1002 and helps grip the cable C2 (see FIGS. 1, 3-6, 11, 19A, 19B, and 26) circumferentially. Friction between the gripping portion 1006 and the cable C2 helps prevent longitudinal movement of the cable C2 with respect to the strain relief member 230.

Referring to FIG. 11, as mentioned above, the strain relief member 230 is configured to be received and housed inside the first slot 310 of the housing body 210. The cable C2 may be inserted into the through-hole 1002 before the strain relief member 230 is inserted into the first slot 310. Referring to FIG. 24A, in the embodiment illustrated, the strain relief member 230 has a generally square outer shape with opposite side edges 1010 and 1012. Referring to FIG. 11, the side edges 1010 and 1012 (see FIG. 24A) are positioned alongside the sidewalls 330 and 332, respectively, of the housing body 210 when the strain relief member 230 is positioned inside the first slot 310. Referring to FIG. 24A, the strain relief member 230 has a top edge 1014 opposite a bottom edge 1016. Referring to FIG. 11, the top edge 1014 (see FIG. 24A) is adjacent the cover portion 400 of the housing cover 212 when the housing cover 212 is in the closed position (see FIGS. 1 and 3-5), and the bottom edge 1016 (see FIG. 24A) is adjacent the base portion 320 (see FIGS. 7, 8, and 14) of the housing body 210. The first slot 310 prevents the strain relief member 230 from moving longitudinally within the housing body 210. The gripping force applied to the cable C2 by the strain relief member 230 helps prevent the wires PW1-PW8 (see FIGS. 1, 19A, and 19B) of the cable C2 from being pulled free of the substrate 218. The strain relief member 230 may be constructed from a flexible material, such as an elastomeric material. However, that is not a requirement.

Figure 24B:
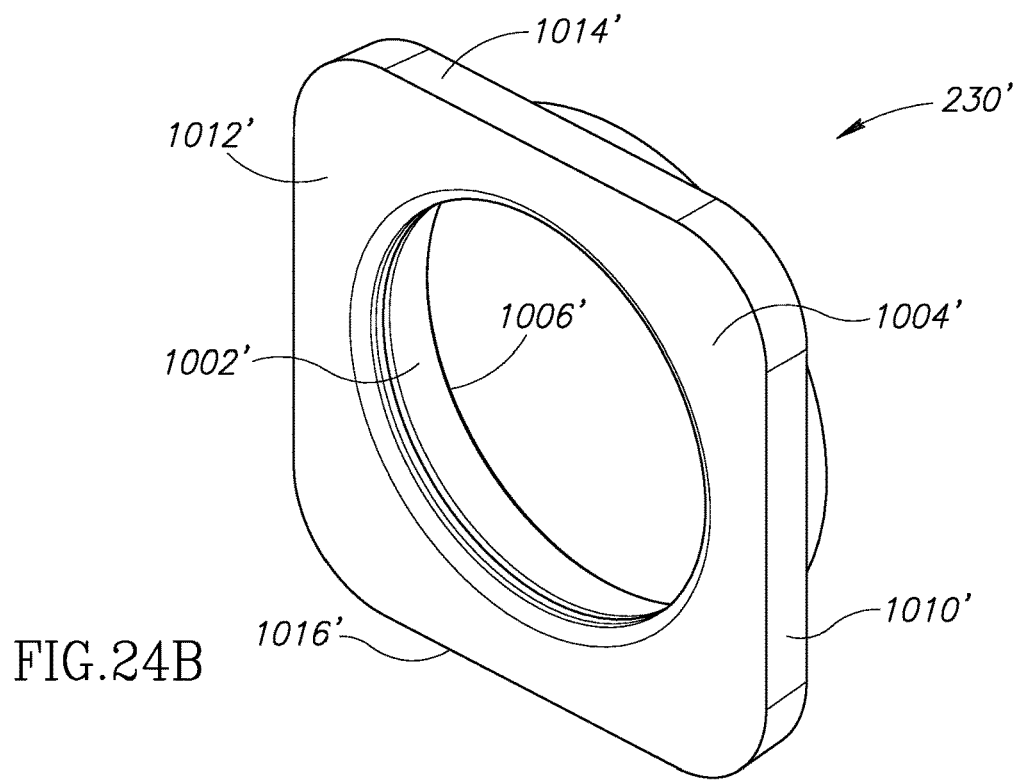
FIG. 24B is a front top perspective view of a second embodiment of the strain relief member.
Figure 24C:
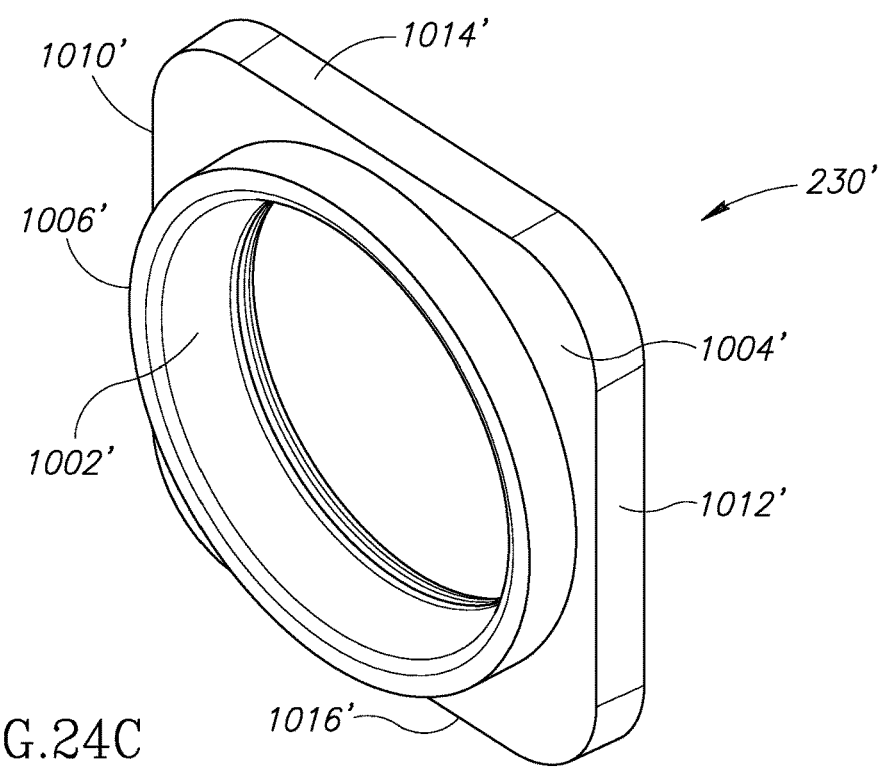
FIG. 24C is a rear top perspective view of the second embodiment of the strain relief member of FIG. 24B.

FIGS. 24B and 24C depict an alternate embodiment of a strain relief member 230' that may be used instead and in place of the strain relief member 230. The strain relief member 230' has a through-hole 1002' defined in a substantially planar body portion 1004'. The through-hole 1002' is configured to allow the cable C2 (see FIGS. 1, 3-6, 11, 19A-19C, and 26) and the tube section 781 (see FIG. 19C) to pass therethrough. The body portion 1004' includes a ring shaped gripping portion 1006' that extends around the through-hole 1002' and helps grip the tube section 781 (see FIG. 19C) circumferentially. Friction between the gripping portion 1006' and the tube section 781 (see FIG. 19C) helps prevent longitudinal movement of the cable C2 with respect to the strain relief member 230'. The strain relief member 230' may be constructed from a stiff or inflexible material, such as polycarbonate.

The strain relief member 230' is positionable inside the first slot 310 (see FIGS. 7 and 11). In the embodiment illustrated, the strain relief member 230' has a generally square outer shape with opposite side edges 1010' and 1012'. The side edges 1010' and 1012' are positioned alongside the sidewalls 330 and 332 (see FIGS. 7 and 11), respectively, of the housing body 210 (see FIGS. 1, 3-8, 11, 14, and 26) when the strain relief member 230' is positioned inside the first slot 310 (see FIGS. 7 and 11). The strain relief member 230' has a top edge 1014' opposite a bottom edge 1016'. The top edge 1014' is adjacent the cover portion 400 (see FIGS. 9-11) of the housing cover 212 (see FIGS. 1, 3-6, 9-11, and 26) when the housing cover 212 is in the closed position (see FIGS. 1 and 3-5), and the bottom edge 1016' is adjacent the base portion 320 (see FIGS. 7, 8, and 14) of the housing body 210 (see FIGS. 1, 3-8, 11, 14, and 26). The first slot 310 (see FIGS. 7 and 11) prevents the strain relief member 230' from moving longitudinally within the housing body 210 (see FIGS. 1, 3-8, 11, 14, and 26). The gripping force applied to the tube section 781 (see FIG. 19C) by the strain relief member 230' helps prevent the wires PW1-PW8 (see FIGS. 1, 19A, and 19B) of the cable C2 (see FIGS. 1, 3-6, 11, 19A-19C, and 26) from being pulled free of the substrate 218 (see FIGS. 6, 11, 15, 17A, 19A, 19B, and 26).

Referring to FIG. 6, for the sake of brevity, the plug 100 is described and illustrated as including the strain relief member 230. However, the plug 100 may include the strain relief member 230' (see FIGS. 24B and 24C) instead and in place of the strain relief member 230.

Figure 25:
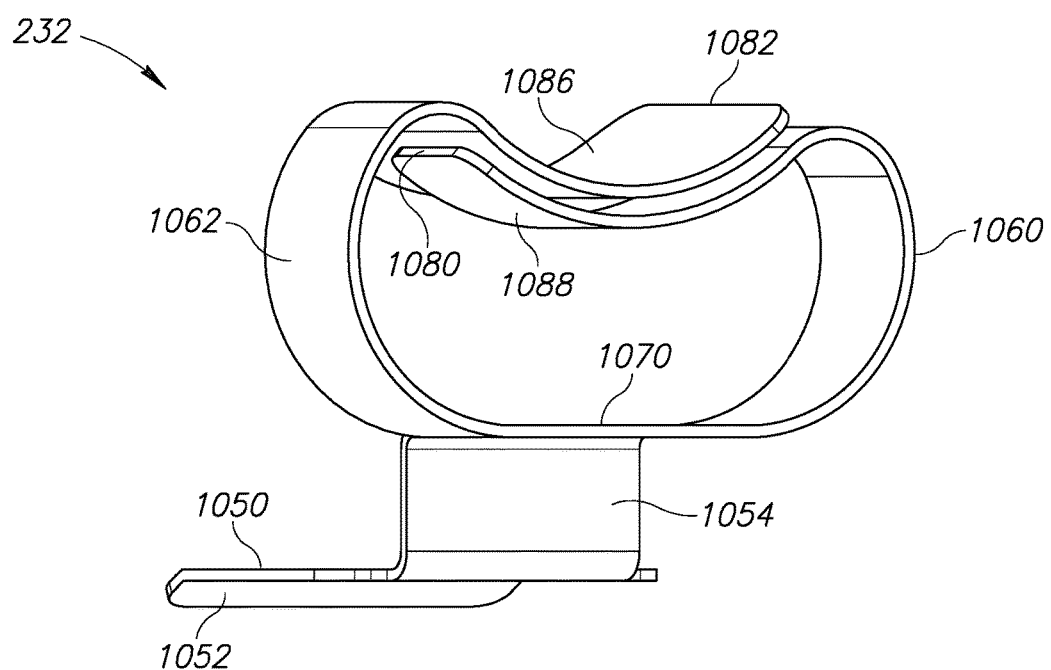
FIG. 25 is a rear perspective view of a ground spring of the plug of FIG. 1.

Referring to FIG. 11, as mentioned above, the ground spring 232 (see FIGS. 6, 19A, 19B, 25, and 26) is configured to be received and housed inside the second slot 312 of the housing body 210. Inside the second slot 312, the ground spring 232 physically contacts the cable shield 140P of the cable C2 and forms an electrical connection therewith. Referring to FIGS. 25 and 26, the ground spring 232 may be constructed from an electrically conductive and substantially planar material. By way of a non-limiting example, the ground spring 232 may be stamped out of an electrically conductive sheet material and subsequently bent into the shape illustrated in FIGS. 6, 19A, 19B, 25, and 26.

Referring to FIGS. 25 and 26, the ground spring 232 has a platform portion 1050 configured to rest upon the shelf 372 of the housing body 210 when the ground spring 232 is positioned inside the second slot 312 (see FIGS. 7 and 11) of the housing body 210. In the embodiment illustrated, the platform portion 1050 has an angled lip 1052 configured to extend along the angled edge surface 376 of the shelf 372. A connecting section 1054 is attached to the platform portion 1050 opposite the angled lip 1052. The connecting section 1054 extends upwardly from the platform portion 1050. In the embodiment illustrated, the connecting section 1054 is substantially orthogonal to the platform portion 1050. When the ground spring 232 is positioned inside the second slot 312 (see FIGS. 7 and 11) of the housing body 210, the connecting section 1054 extends outwardly from the second slot 312 through the opening 370 (see FIGS. 8 and 14) and along the support 374.

Referring to FIG. 25, a pair of curved arms 1060 and 1062 are attached to the connecting section 1054 by a base portion 1070 opposite the platform portion 1050. In the embodiment illustrated, the base portion 1070 is substantially orthogonal to the connecting section 1054 and substantially parallel to the platform portion 1050.

The curved arms 1060 and 1062 extend outwardly from the base portion 1070 in opposite directions and are configured to be housed inside the second slot 312 (see FIGS. 7 and 11) of the housing body 210 (see FIGS. 1, 3-8, 11, 14, and 26). The curved arms 1060 and 1062 terminate at free ends 1080 and 1082, respectively.

The curved arm 1060 initially extends outwardly away from the base portion 1070 and then curves upwardly and back toward the curved arm 1062. The curved arm 1062 initially extends outwardly away from the base portion 1070 and then curves upwardly and back toward the curved arm 1060. The free ends 1080 and 1082 of the curved arms 1060 and 1062, respectively, pass by one another with the free end 1082 being positioned above the free end 1080. Referring to FIG. 6, the curved arm 1062 has a curved shield contacting portion 1086 formed at its free end 1082. In the embodiment illustrated, the shield contacting portion 1086 is configured (e.g., has a concave shape) to cradle the folded back cable shield 140P covering the cable C2. Referring to FIG. 25, the curved arm 1060 has a curved portion 1088 formed at its free end 1080 positioned underneath the shield contacting portion 1086. The curved portion 1088 may be shaped to follow the contour of the shield contacting portion 1086. The curved arms 1060 and 1062 are compressible and may be compressed by the cable C2 (see FIGS. 1, 3-6, 11, 19A, 19B, and 26) when the cable shield 140P (see FIGS. 1, 6, 11, 19A, 19B, and 26) physically contacts the shield contacting portion 1086.

Outlet

Referring to FIG. 1, the outlet 120 may be implemented as any communication outlet described in U.S. patent application Ser. No. 14/685,379, filed on Apr. 13, 2015, titled Communication Outlet with Shutter Mechanism and Wire Manager, U.S. patent application Ser. No. 14/883,267, filed on Oct. 14, 2015, titled Communication Outlet with Shutter Mechanism and Wire Manager, or U.S. patent application Ser. No. 14/883,415, filed on Oct. 14, 2015, titled Communication Connector, each of which is incorporated by reference herein in its entirety. Further, in embodiments in which the plug 100 complies with the RJ-45 standard, the outlet 120 may be implemented as any RJ-45 outlet.

FIG. 27 is a front view of an exemplary embodiment of the outlet 120. The outlet 120 is substantially similar to an outlet also identified by reference numeral "120" in U.S. patent application Ser. No. 14/685,379. For example, referring to FIGS. 27 and 28, the outlet 120 includes the following components:

1. a housing 1100 (that is substantially identical to a "housing 330" described in U.S. patent application Ser. No. 14/685,379);
2. ground springs 1110A and 1110B (that are substantially identical to "ground springs 340A and 340B" described in U.S. patent application Ser. No. 14/685,379);
3. the outlet contacts J1-J8 (that are substantially identical to "outlet contacts J1-J8" described in U.S. patent application Ser. No. 14/685,379);
4. an optional spring assembly 1120 (that is substantially identical to a "spring assembly 350" described in U.S. patent application Ser. No. 14/685,379);
5. a contact positioning member 1122 (that is substantially identical to a "contact positioning member 352" described in U.S. patent application Ser. No. 14/685,379);
6. an optional clip or latch member 1132 (that is substantially identical to a "latch member 356" described in U.S. patent application Ser. No. 14/685,379);
7. wire contacts 1141-1148 (that are substantially identical to "wire contacts 361-368" described in U.S. patent application Ser. No. 14/685,379);
8. a guide sleeve 1170 (that is substantially identical to a "guide sleeve 370" described in U.S. patent application Ser. No. 14/685,379);
9. a wire manager 1180 (that is substantially identical to a "wire manager 380" described in U.S. patent application Ser. No. 14/685,379); and
10. housing doors 1190 and 1192 (that are substantially identical to "housing doors 390 and 392" described in U.S. patent application Ser. No. 14/685,379).

Figure 28:
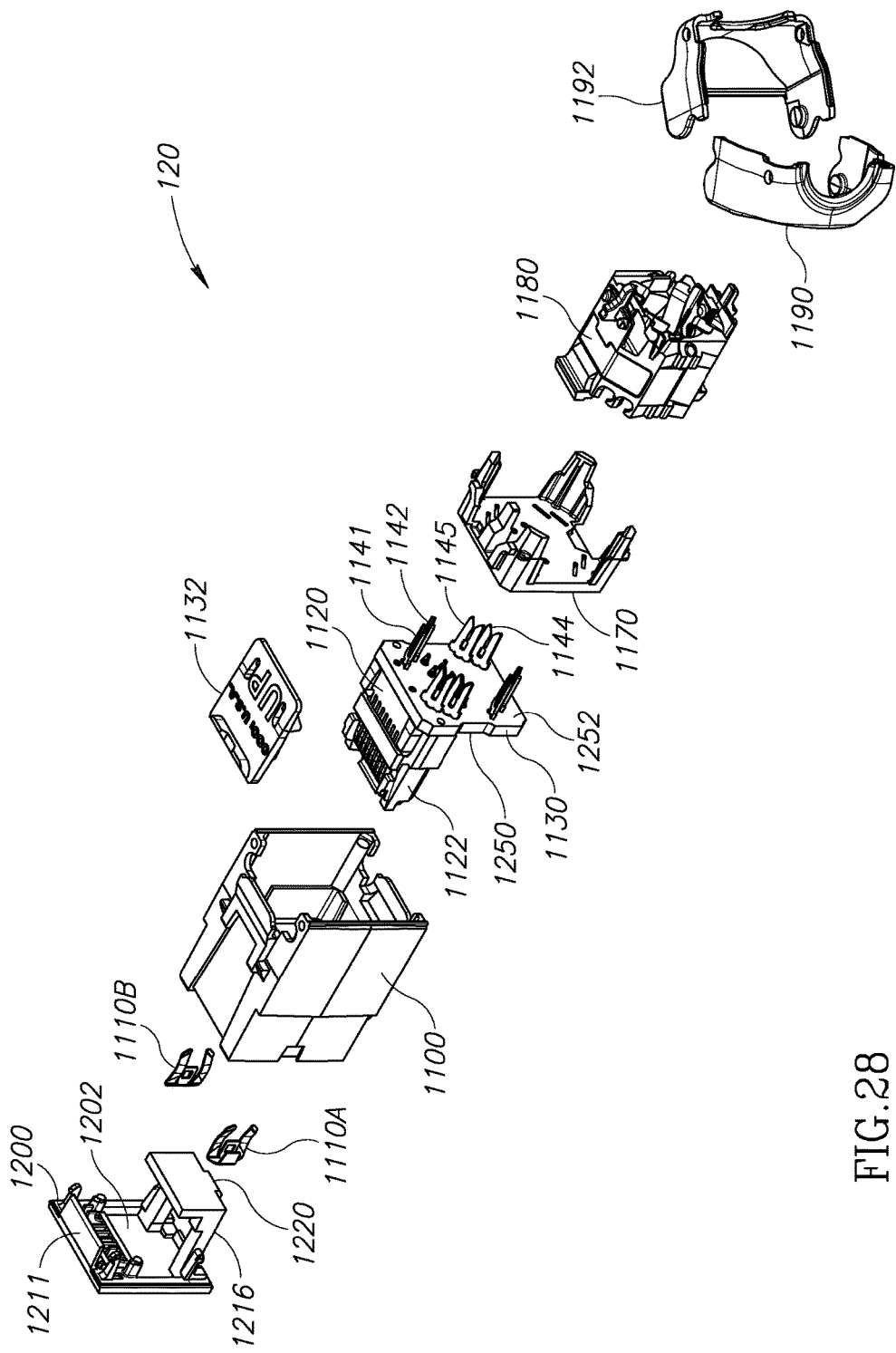
FIG. 28 is an exploded rear top perspective view of the communication outlet of FIG. 27.

However, the outlet 120 illustrated in FIGS. 1, 27, and 28 excludes a locking shutter subassembly (identified by reference numeral "320" in U.S. patent application Ser. No. 14/685,379) and includes a face plate 1200 instead and in place of a face plate (identified by reference numeral "310" in U.S. patent application Ser. No. 14/685,379) used with the locking shutter subassembly. However, alternative embodiments of the outlet 120 may include a locking shutter subassembly and/or a face plate designed for use with a locking shutter subassembly. Further, the outlet 120 illustrated in FIGS. 1, 27, and 28 includes a substrate 1130 (e.g., a printed circuit board) instead and in place of a "substrate 354" described in U.S. patent application Ser. No. 14/685,379.

Referring to FIG. 27, the face plate 1200 includes a plug receiving opening 1202 configured to permit the plug 100 (see FIGS. 1, 3-6, and 11) to pass therethrough into an interior receptacle 1203 of the outlet 120 unobstructed. The face plate 1200 includes a conventional lip 1204 onto which the latch member 214 (see FIGS. 1, 3-6, and 11-14) of the plug 100 (see FIGS. 1, 3-6, and 11) may latch. As shown in FIG. 28, the face plate 1200 is configured to be attached to the housing 1100. Optionally, the face plate 1200 may include an overhanging portion 1211 positioned above the plug receiving opening 1202. The overhanging portion 1211 may rest upon the housing 1100 when the outlet 120 is assembled. The face plate 1200 includes a rearwardly projecting support portion 1216. As shown in FIGS. 27 and 28, the support portion 1216 includes a distal upright stop member 1218 positioned to protect the substrate 1130 from objects and debris entering the interior receptacle 1203 of the outlet 120 through the plug receiving opening 1202. Referring to FIG. 28, the support portion 1216 may also include a distal downwardly extending support member 1220 configured to rest upon the housing 1100. The face plate 1200 may be constructed from an electrically conductive and/or dielectric material.

Figure 29:
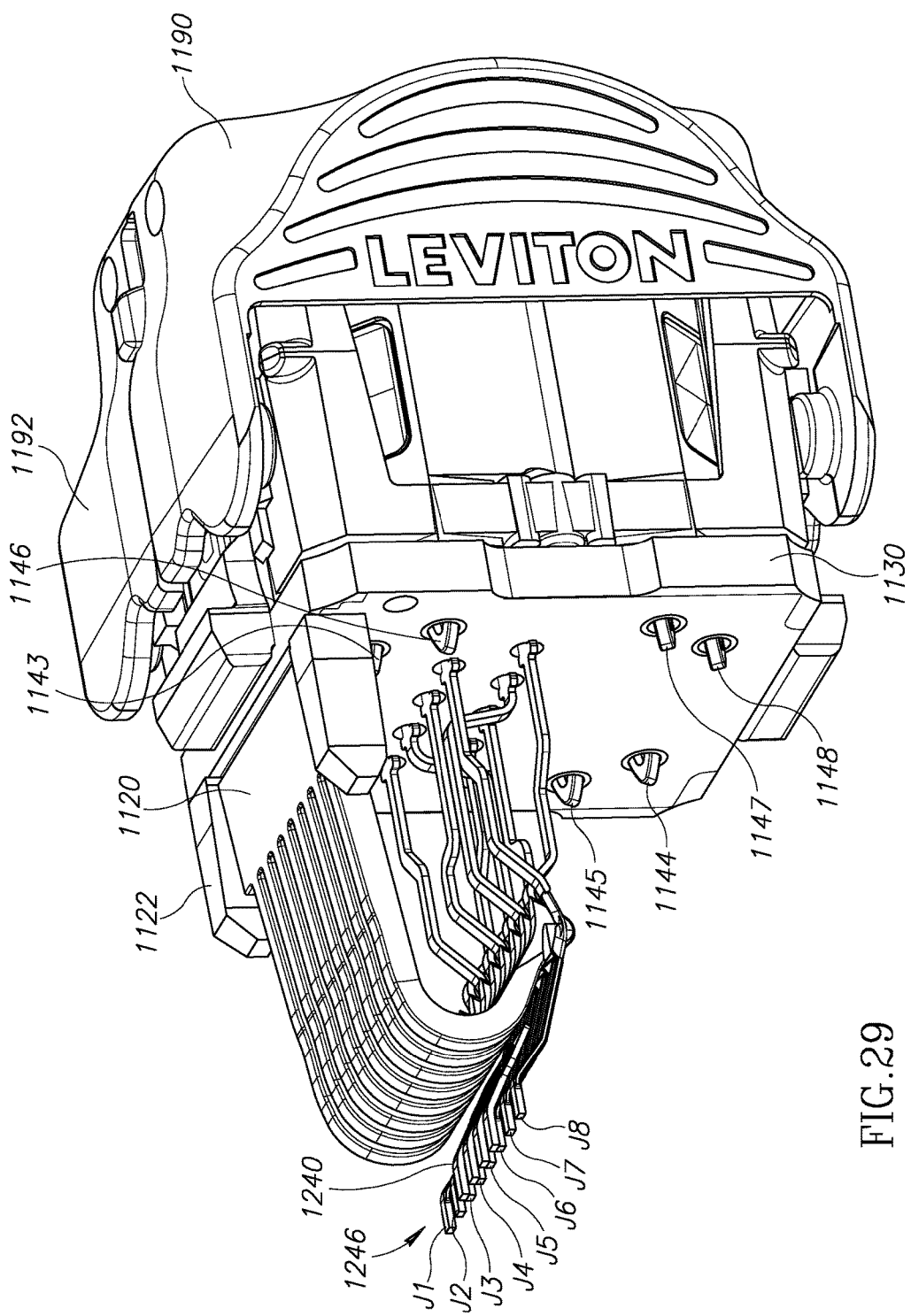
FIG. 29 is a front top perspective view of the communication outlet of FIG. 27 omitting its housing, ground springs, face plate, latch member, and contact positioning member.
Figure 32:
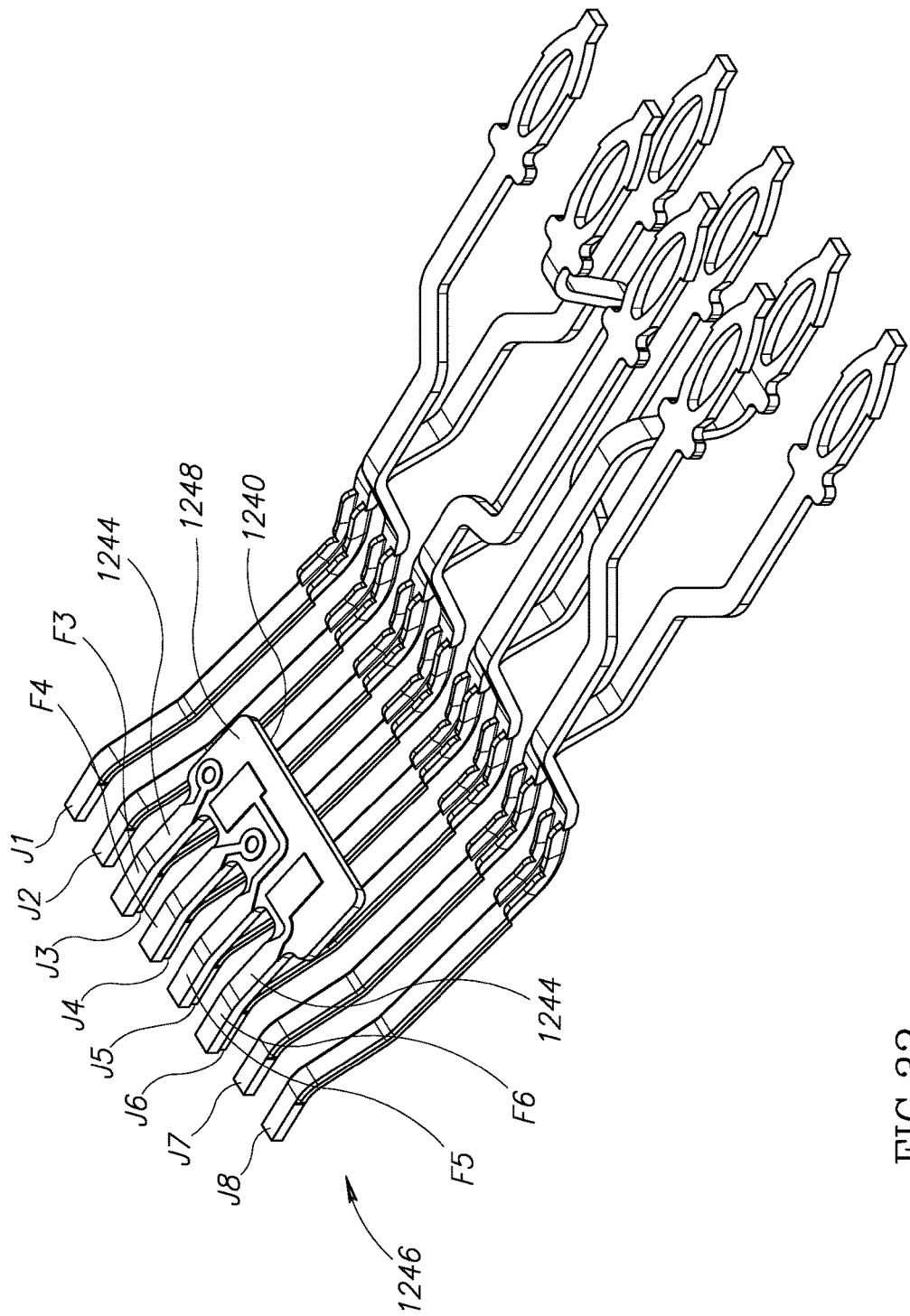
FIG. 32 is a rear top perspective view of outlet contacts and a flexible printed circuit board of the communication outlet of FIG. 27.

Referring to FIG. 29, the outlet 120 of the present application also includes an optional flexible printed circuit board ("PCB") 1240. The flexible PCB 1240 has crosstalk attenuating or cancelling circuits formed thereon that are configured to provide crosstalk compensation. As shown in FIG. 29, the flexible PCB 1240 may be positioned between the spring assembly 1120 and the outlet contacts J3-J6. Referring to FIG. 32, the flexible PCB 1240 may include contacts F3-F6 configured to be connected (e.g., soldered) to one or more of the centermost outlet contacts J3-J6, respectively. The flexible PCB 1240 includes a plurality of fingers 1244 upon which the contact F3-F6 are mounted (one each). The fingers 1244 position the contacts F3-F6 at locations at or near ends 1246 of the outlet contacts J3-J6, respectively. The flexible PCB 1240 includes a body portion 1248 from which the fingers 1244 extend. The fingers 1144 and/or the body portion 1248 may extend along the outlet contacts J3-J6 and at least a portion of the body portion 1248 may be positioned between the spring assembly 1120 (see FIGS. 28 and 29) and the outlet contacts J3-J6. Alternatively, the fingers 1144 and/or the body portion 1248 may curve upwardly away from the outlet contacts J3-J6 to position the body portion 1248 against a forwardly facing portion of the spring assembly 1120 (see FIGS. 28 and 29).

In some embodiments, instead of the flexible PCB 1240, the outlet 120 may include a compensation circuit 1322 described in U.S. patent application Ser. No. 14/883,415 connected to the outlet contacts J2-J7.

As mentioned above, the outlet 120 includes the outlet contacts J1-J8 positioned to physically contact and form electrical connections with the plug contacts P1-P8 (see FIGS. 15 and 19A), respectively. As shown in FIG. 28, inside the outlet 120, the outlet contacts J1-J8 are connected to a first side 1250 of the substrate 1130 and the wire contacts 1141-1148 are connected to a second side 1252 of the substrate 1130. The first and second sides 1250 and 1252 are opposite one another.

Figure 30A:
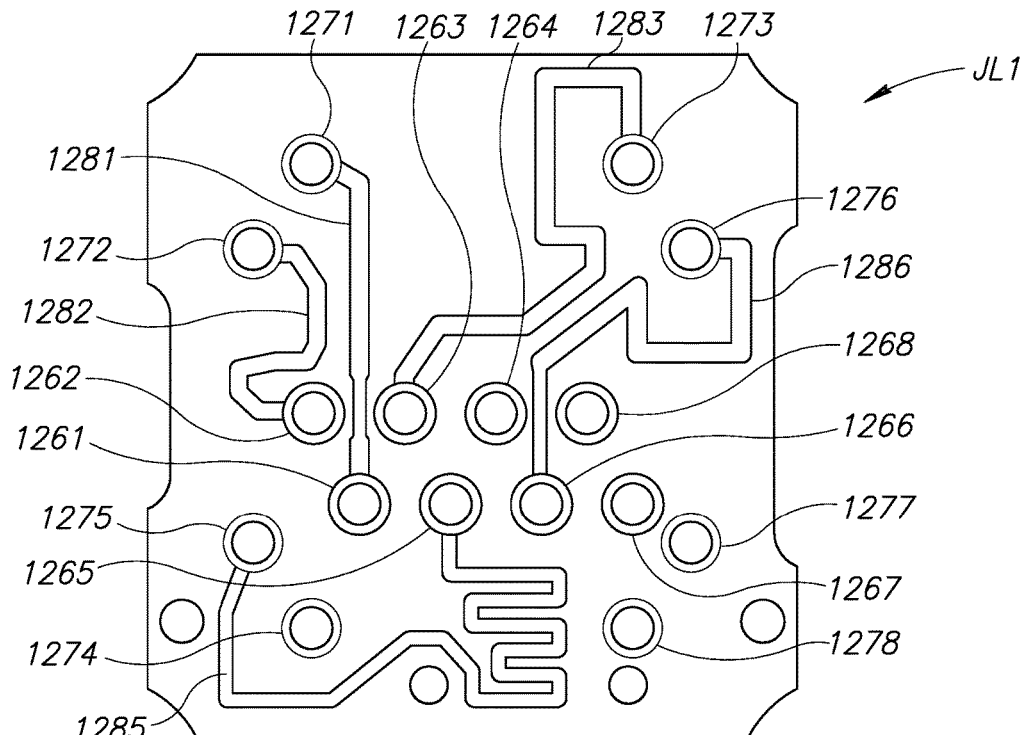
FIG. 30A is a top plan view of a first embodiment of a first layer of a substrate of the communication outlet of FIG. 27.
Figure 30B:
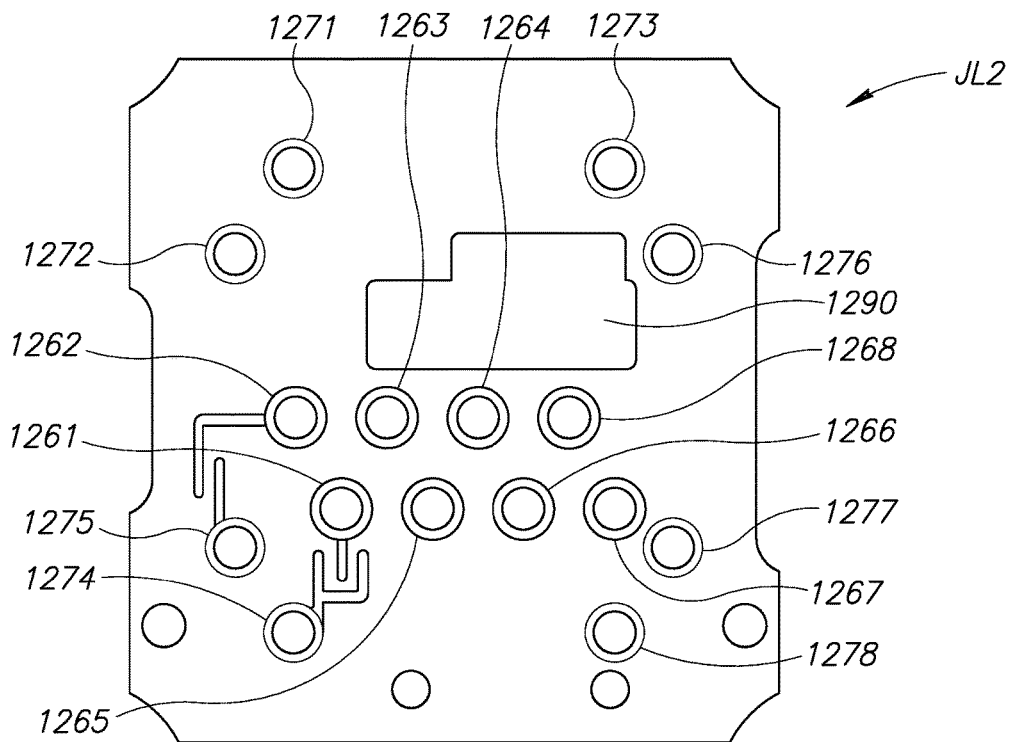
FIG. 30B is a top plan view of a first embodiment of a second layer of the substrate of the communication outlet with the substrate being illustrated as being transparent.

Referring to FIGS. 30A-30D, the substrate 1130 includes a plurality of first plated through-holes 1261-1268 configured to receive the outlet contacts J1-J8, respectively, and a plurality of second plated through-holes 1271-1278 configured to receive the wire contacts 1141-1148 (see FIGS. 28 and 29), respectively. The substrate 1130 includes a plurality of layers JL1-JL4 with a plurality of traces 1281-1288 that interconnect the first plated through-holes 1261-1268, respectively, with the second plated through-holes 1271-1278, respectively. In other words, the traces 1281-1288 connect the outlet contacts J1-J8 (see FIGS. 27 and 29), respectively, with the wires JW1-JW8, respectively, (via the wire contacts 1141-1148, respectively). As shown in FIG. 30B, the second layer JL2 includes an electrically conductive (e.g., plated) portion 1290 that functions as a conductive plane to control return loss and crosstalk.

Figure 31A:
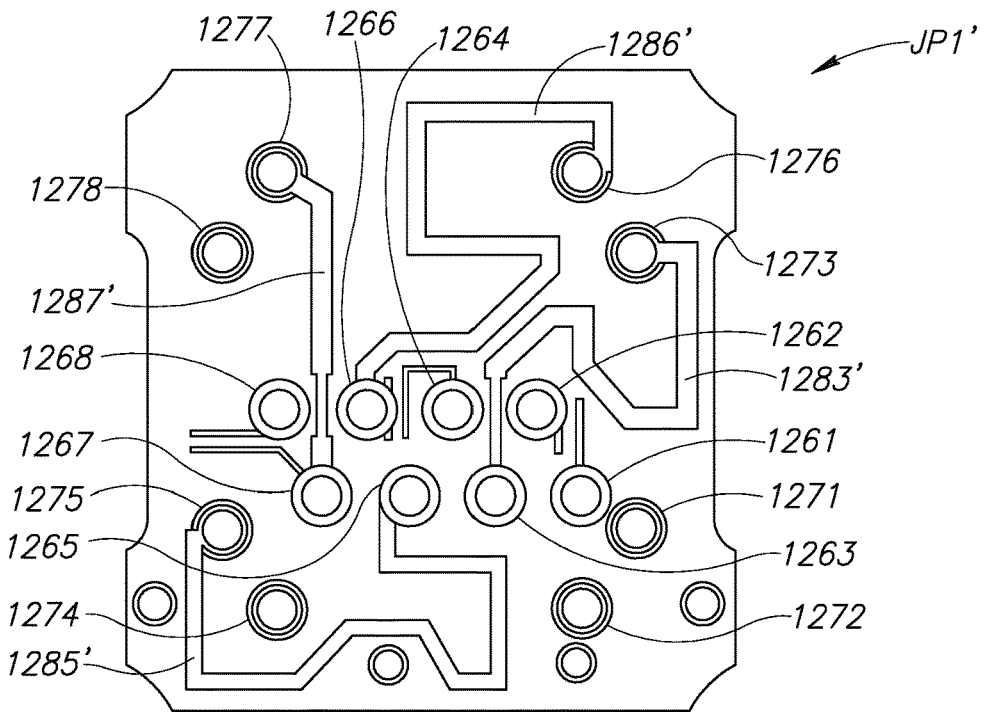
FIG. 31A is a top plan view of a second embodiment of the first layer of the substrate of the communication outlet.

FIG. 31A is an alternate embodiment of a layer JL1' that may be used instead and in place of the layer JL1 (see FIG. 30A). The layer JL1' includes a trace 1283' that electrically interconnects the first and second plated through-holes 1263 and 1273. The layer JL1' includes a trace 1285' that electrically interconnects the first and second plated through-holes 1265 and 1275. The layer JL1' includes a trace 1286' that electrically interconnects the first and second plated through-holes 1266 and 1276. The layer JL1' includes a trace 1287' that electrically interconnects the first and second plated through-holes 1267 and 1277.

Figure 31B:
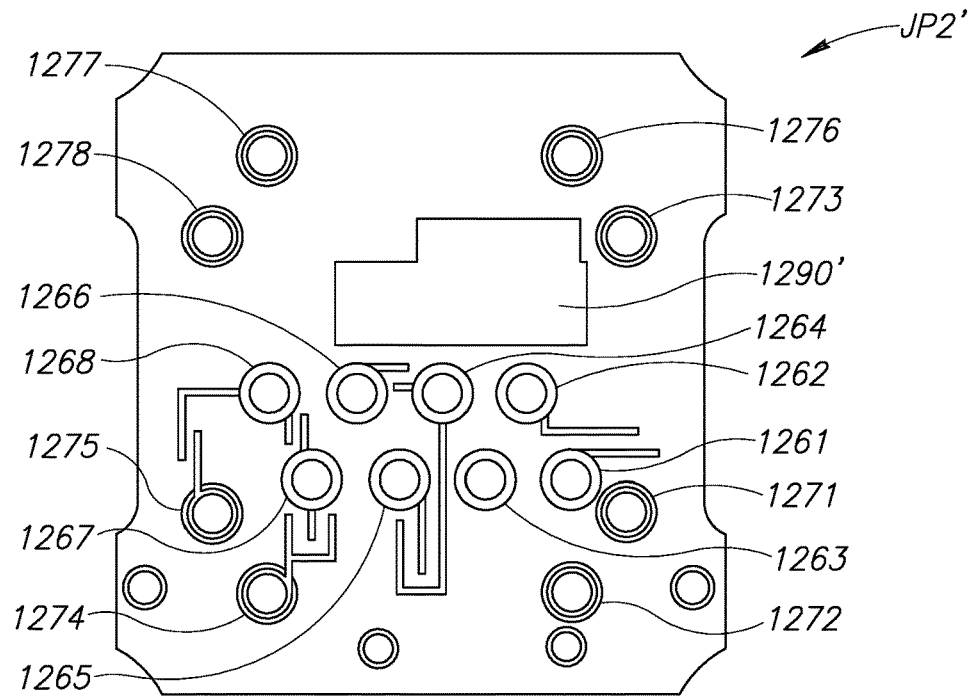
FIG. 31B is a top plan view of a second embodiment of the second layer of the substrate of the communication outlet with the substrate being illustrated as being transparent.

FIG. 31B is an alternate embodiment of a layer JL2' that may be used instead and in place of the layer JL2 (see FIG. 30B). As shown in FIG. 31B, the second layer JL2' includes an electrically conductive (e.g., plated) portion 1290' that functions as a conductive plane to control return loss and crosstalk. The second layer JL2' may also include capacitive or inductive elements configured to reduce or eliminate crosstalk.

Figure 30C:
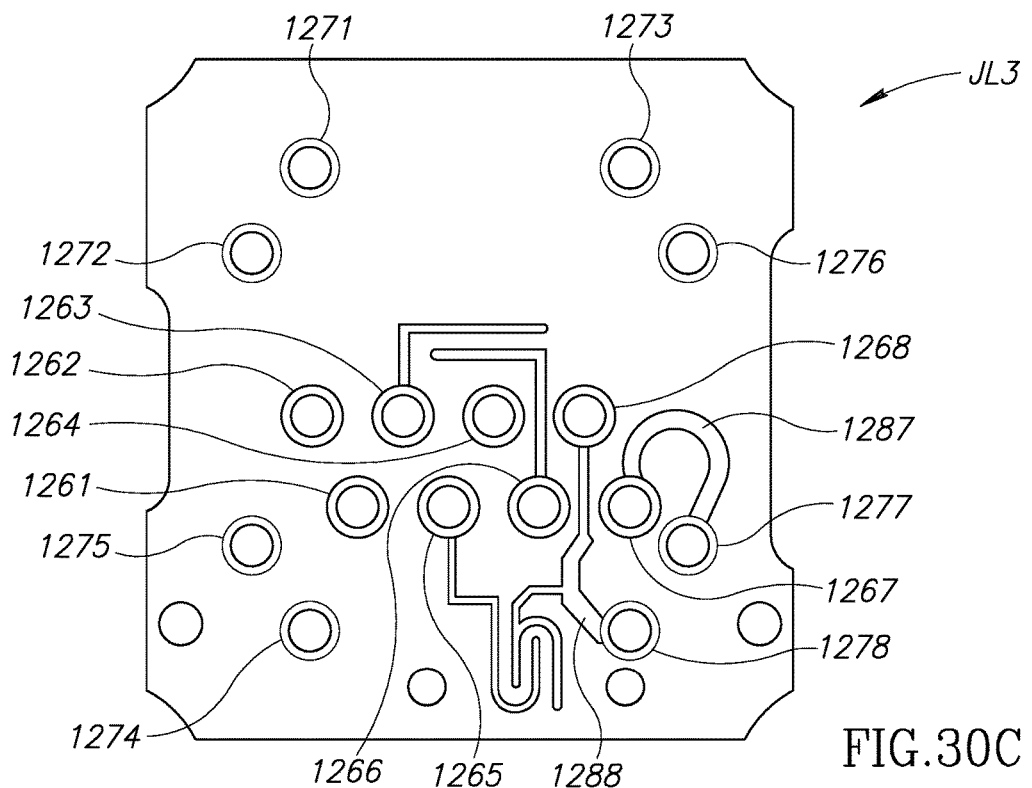
FIG. 30C is a top plan view of a first embodiment of a third layer of the substrate of the communication outlet with the substrate being illustrated as being transparent.
Figure 31C:
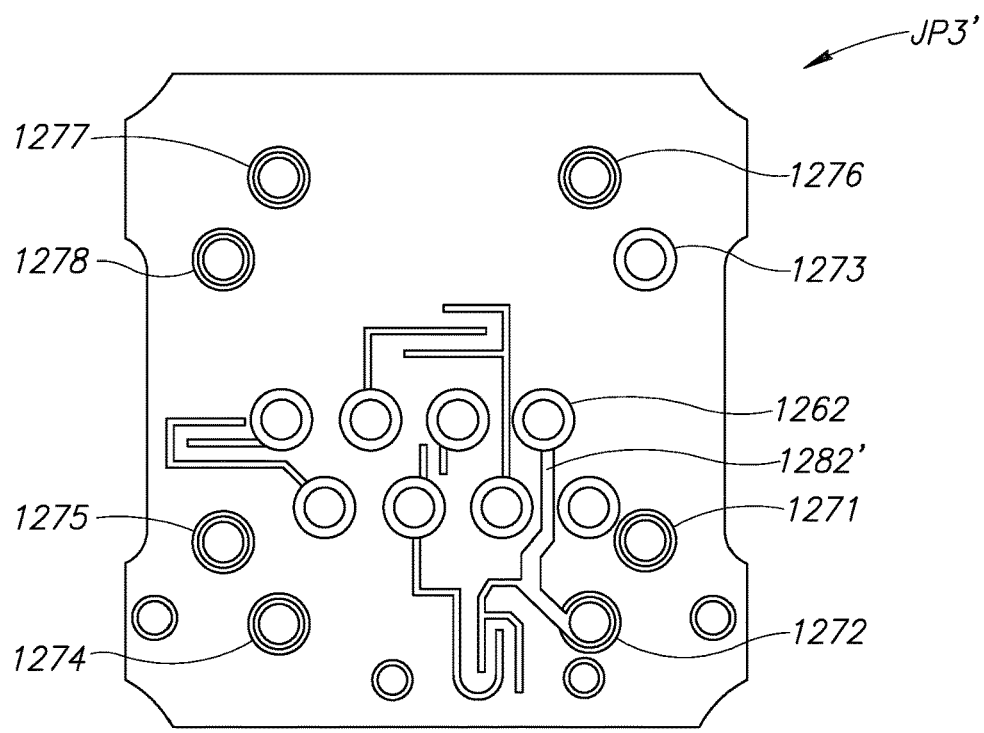
FIG. 31C is a top plan view of a second embodiment of the third layer of the substrate of the communication outlet with the substrate being illustrated as being transparent.

FIG. 31C is an alternate embodiment of a layer JL3' that may be used instead and in place of the layer JL3 (see FIG. 30C). The layer JL3' includes a trace 1282' that electrically interconnects the first and second plated through-holes 1262 and 1272.

Figure 30D:
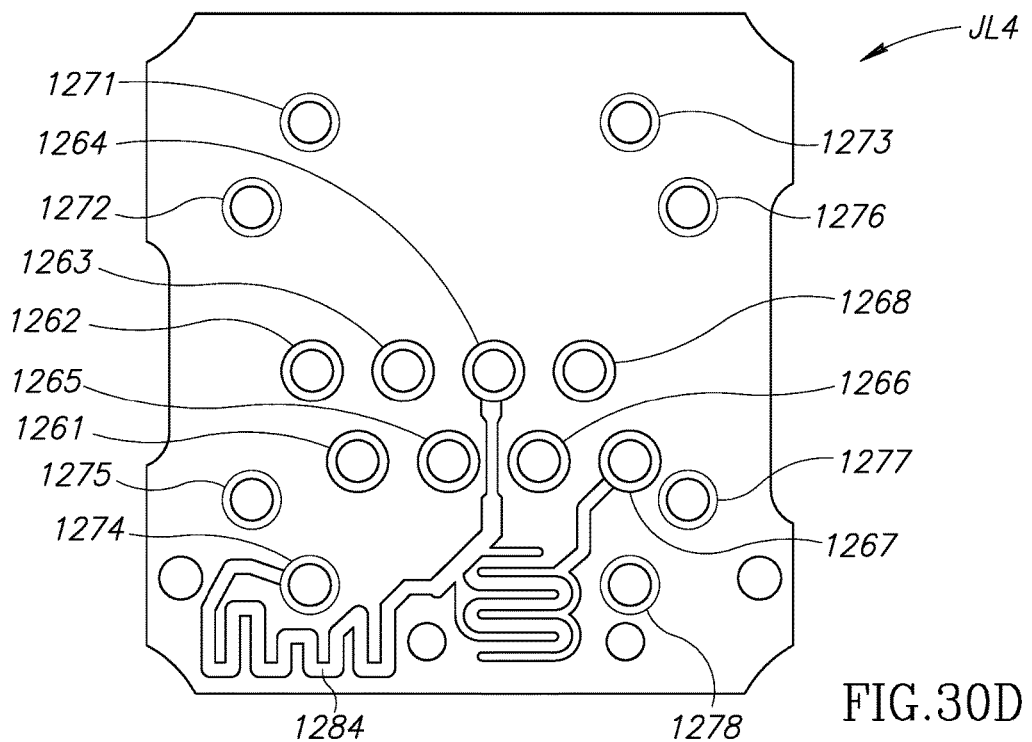
FIG. 30D is a top plan view of a first embodiment of a fourth layer of the substrate of the communication outlet with the substrate being illustrated as being transparent.
Figure 31D:
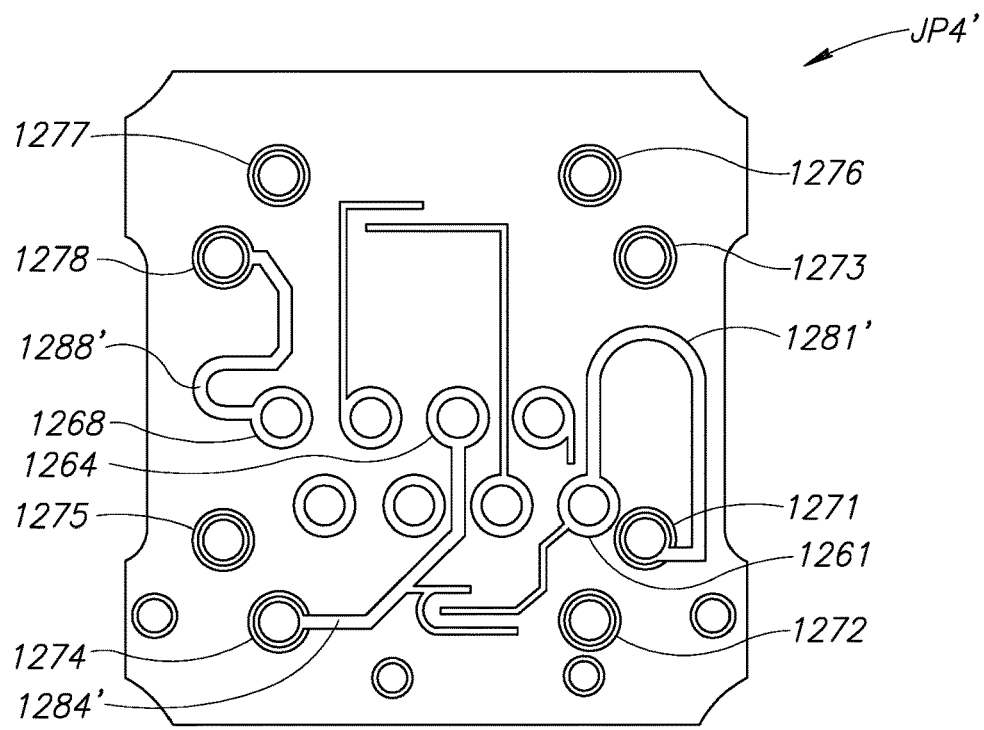
FIG. 31D is a top plan view of a second embodiment of the fourth layer of the substrate of the communication outlet with the substrate being illustrated as being transparent.

FIG. 31D is an alternate embodiment of a layer JL4' that may be used instead and in place of the layer JL4 (see FIG. 30D). The layer JL4' includes a trace 1281' that electrically interconnects the first and second plated through-holes 1261 and 1271. The layer JL4' includes a trace 1284' that electrically interconnects the first and second plated through-holes 1264 and 1274. The layer JL4' includes a trace 1288' that electrically interconnects the first and second plated through-holes 1268 and 1278.

Thus, the traces 1281'-1288' interconnect the first plated through-holes 1261-1268, respectively, with the second plated through-holes 1271-1278, respectively. In other words, the traces 1281'-1288' electrically connect the outlet contacts J1-J8 (see FIGS. 27 and 29), respectively, with the wires JW1-JW8, respectively, (via the wire contacts 1141-1148, respectively).

Figure 33A:
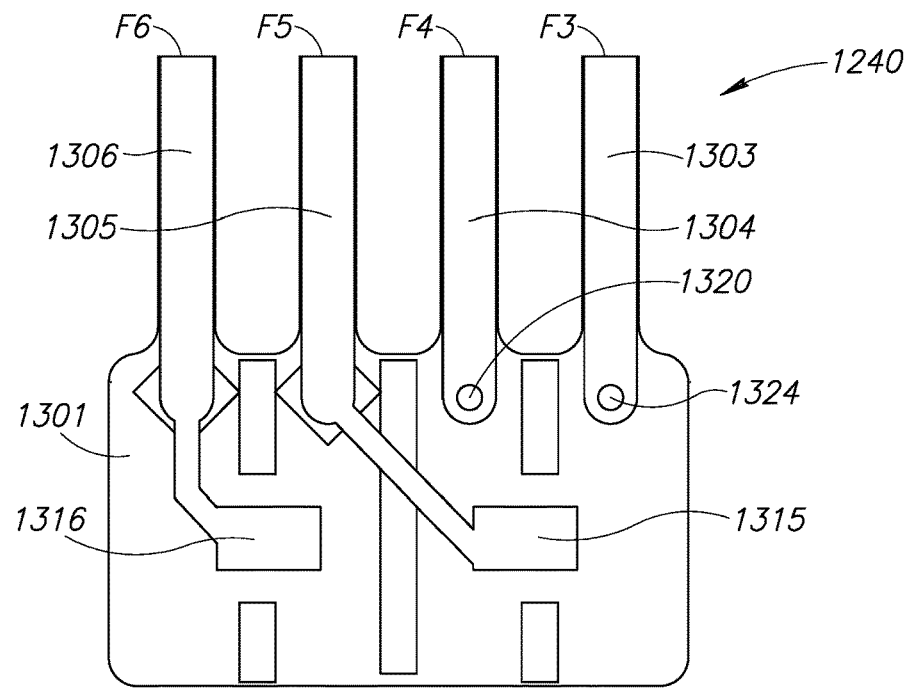
FIG. 33A is a top plan view of a first layer of the flexible printed circuit board.
Figure 33B:
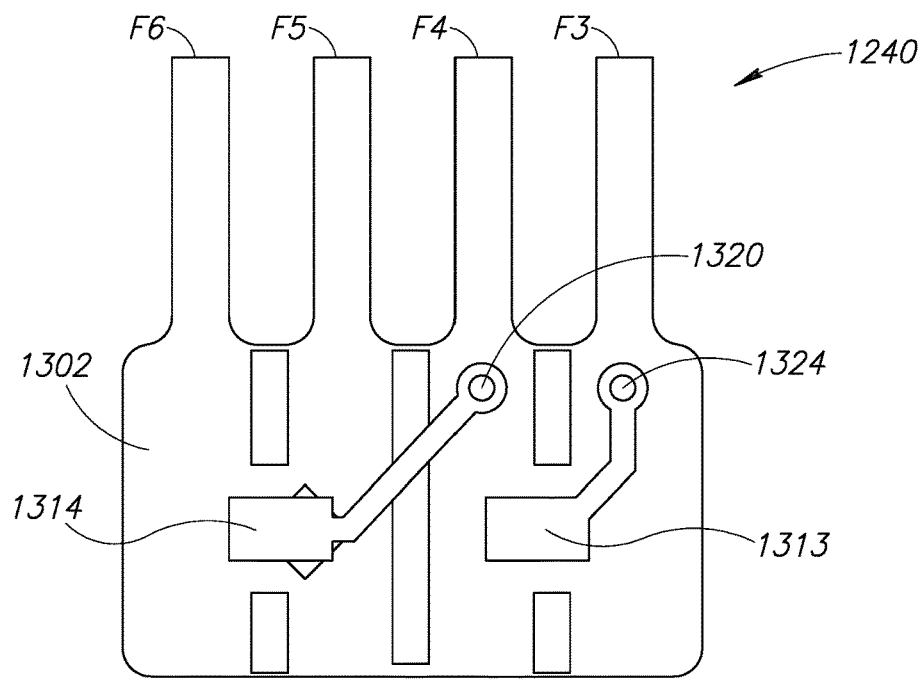
FIG. 33B is a top plan view of a second layer of the flexible printed circuit board with the flexible printed circuit board being illustrated as being transparent.

FIG. 33A is a top plan view of a first layer 1301 of the flexible PCB 1240 and FIG. 33B is a top plan view of a second layer 1302 of the flexible PCB 1240. Referring to FIG. 32, the flexible PCB 1240 includes the contacts F3-F6 configured to be connected (e.g., soldered) to one or more of the centermost outlet contacts J3-J6 (see FIG. 32), respectively. Referring to FIG. 33A, the second layer 1302 (see FIG. 33B) is positioned against the centermost outlet contacts J3-J6, respectively.

Referring to FIG. 33A, on the first layer 1301, the contacts F3-F6 include conductive portions 1303-1306, respectively. The conductive portions 1303-1306 are electrically and physically connected by solder to the centermost outlet contacts J3-J6, respectively. The conductive portion 1306 is electrically connected to a capacitor plate 1316 positioned on the first layer 1301. The conductive portion 1305 is electrically connected to a capacitor plate 1315 also on the first layer 1301. The conductive portion 1304 is electrically connected to a via 1320, and the conductive portion 1303 is electrically connected to a via 1324. Referring to FIG. 33B, on the second layer 1302, the via 1320 is electrically connected to a capacitor plate 1314 positioned on the second layer 1302. On the second layer 1302, the via 1324 is electrically connected to a capacitor plate 1313 positioned on the second layer 1302. Together, the capacitor plates 1316 and 1314 form a first capacitor and the capacitor plates 1315 and 1313 form a second capacitor. The first capacitor capacitively couples the outlet contacts J4 and J6 together and the second capacitor capacitively couples the outlet contacts J3 and J5 together.

The foregoing described embodiments depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Accordingly, the invention is not limited except as by the appended claims.

The invention claimed is:

1. A communication plug configured to be mated with a communication outlet, the communication outlet having a plurality of second contacts, the communication plug comprising:
    a plurality of first contacts configured to physically contact and form electrical connections with the plurality of second contacts; and
    a substrate comprising a plurality of wire contacts and first, second, third, and fourth layers,
    the first layer comprising a plurality of first conductors, the plurality of first conductors connecting a first portion of the plurality of first contacts with a first portion of the plurality of wire contacts,
    the fourth layer comprising a plurality of second conductors, the plurality of second conductors connecting a second portion of the plurality of first contacts with a second portion of the plurality of wire contacts,
    the second layer comprising a first plurality of capacitor plates electrically connected to first selected ones of the plurality of first contacts, and
    the third layer comprising a second plurality of capacitor plates electrically connected to second selected ones of the plurality of first contacts, each of the first plurality of capacitor plates forming a capacitor with at least one of the second plurality of capacitor plates.

2. The communication plug of claim 1, wherein the plurality of wire contacts comprise a plurality of plated through-holes configured to have a plurality of wires of a cable directly inserted one each therein to thereby physically and electrically connect together the plurality of plated through-holes and the plurality of wires.

3. The communication plug of claim 2 for use with a first pair of the plurality of wires being a first twisted pair of wires, and a different fourth pair of the plurality of wires being a fourth twisted pair of wires, wherein the substrate further comprises a first side opposite a second side,
    the communication plug further comprises a housing having a cover portion opposite a base portion, and
    the substrate is positioned between the cover and base portions such that the first twisted pair of wires is insertable into a first pair of the plated through-holes along the first side of the substrate, and the fourth twisted pair of wires insertable into a different fourth pair of the plated through-holes along the second side of the substrate.

4. The communication plug of claim 3 for use with a different second pair of the plurality of wires being a second twisted pair of wires, and a different third pair of the plurality of wires being a third twisted pair of wires, wherein the substrate is positioned between the cover and base portions such that the second twisted pair of wires is insertable into a second pair of the plated through-holes along the first side of the substrate, and the third twisted pair of wires is insertable into a different third pair of the plated through-holes along the second side of the substrate.

5. The communication plug of claim 4, wherein the first layer comprises a first capacitor capacitively coupling the third pair of the plated through-holes together, and
    the fourth layer comprises a second capacitor capacitively coupling the first pair of the plated through-holes together.

6. The communication plug of claim 4, wherein the second layer comprises a capacitor capacitively coupling the first pair of the plated through-holes together.

7. The communication plug of claim 4, further comprising:
    first, second, third, and fourth tube sections, the first, second, third, and fourth twisted pairs of wires being positioned inside the first, second, third, and fourth tube sections, respectively.

8. The communication plug of claim 7, wherein the first, second, third, and fourth tube sections comprise electrically conductive inner coatings that extend alongside the first, second, third, and fourth twisted pairs of wires, respectively.

9. The communication plug of claim 1, wherein the second layer is between the first and third layers,
    the third layer is between the second and fourth layers,
    the first plurality of capacitor plates comprises a second capacitor plate connected to a second one of the plurality of first contacts, a fourth capacitor plate connected to a fourth one of the plurality of first contacts, a sixth capacitor plate connected to a sixth one of the plurality of first contacts, and a first capacitor plate connected to the sixth contact, the second plurality of capacitor plates comprises a third capacitor plate connected to a third one of the plurality of first contacts, an eighth capacitor plate connected to the third contact, a fifth capacitor plate connected to a fifth one of the plurality of first contacts, and a seventh capacitor plate connected to a seventh one of the plurality of first contacts, the second capacitor plate on the second layer and the third capacitor plate on the third layer form a first capacitor, the fourth capacitor plate on the second layer and the eighth capacitor plate on the third layer form a second capacitor, the sixth capacitor plate on the second layer and the fifth capacitor plate on the third layer form a third capacitor, and the first capacitor plate on the second layer and the seventh capacitor plate on the third layer form a fourth capacitor.

10. The communication plug of claim 9, wherein the second and third layers comprise first and second electrically conductive portions, respectively, each configured to function as a conductive plane.

11. The communication plug of claim 10, wherein vias electrically and physically connect the first and second electrically conductive portions.

12. The communication plug of claim 1, wherein the second layer is between the first and third layers, the third layer is between the second and fourth layers, the first plurality of capacitor plates comprises a third capacitor plate connected to a third one of the plurality of first contacts, an eighth capacitor plate connected to the third contact, a fifth capacitor plate connected to a fifth one of the plurality of first contacts, and a seventh capacitor plate connected to a seventh one of the plurality of first contacts, the second plurality of capacitor plates comprises a second capacitor plate connected to a second one of the plurality of first contacts, a fourth capacitor plate connected to a fourth one of the plurality of first contacts, a sixth capacitor plate connected to a sixth one of the plurality of first contacts, and a first capacitor plate connected to the sixth contact, the second capacitor plate on the third layer and the third capacitor plate on the second layer form a first capacitor, the fourth capacitor plate on the third layer and the eighth capacitor plate on the second layer form a second capacitor, the sixth capacitor plate on the third layer and the fifth capacitor plate on the second layer form a third capacitor, and the first capacitor plate on the third layer and the seventh capacitor plate on the second layer form a fourth capacitor.

13. The communication plug of claim 12, wherein the second layer comprises first and second electrically conductive portions, the first electrically conductive portion is spaced apart from the second electrically conductive portion, the third layer comprises a third electrically conductive portion, and each of the first, second, and third electrically conductive portions is configured to function as a conductive plane.

14. The communication plug of claim 13, wherein the substrate comprises first and second vias, the first via electrically and physically connects the first and third electrically conductive portions, and the second via electrically and physically connects the second and third electrically conductive portions.

15. The communication plug of claim 1, wherein the substrate comprises a corresponding pair of plated through-holes for each of the plurality of first contacts, and each of the plurality of first contacts comprises:

a first leg configured to be inserted into a first plated through-hole of the corresponding pair of plated through-holes;

a second leg spaced apart from the first leg, the second leg being configured to be inserted into a second plated through-hole of the corresponding pair of plated through-holes; and a connecting portion extending between the first and second legs, the connecting portion having an overhang portion that extends outwardly beyond the first leg, the overhang portion having an outer contact portion configured to physically contact one of the plurality of second contacts.

16. The communication plug of claim 15, wherein the connecting portion has an intermediate portion adjacent the overhang portion, and the overhang portion extends outwardly away from the first and second legs further than the intermediate portion.

17. The communication plug of claim 15, wherein the connecting portion is solid and does not include any through holes.

18. The communication plug of claim 17, wherein the substrate has a front edge, and the overhang portion extends forwardly beyond the front edge of the substrate when the first and second legs are inserted into the first and second plated through-holes, respectively.

19. A substrate for use inside a communication plug, the substrate comprising:

a plurality of vias configured to receive a plurality of plug contacts;

a plurality of through-holes configured to receive a plurality of wires;

electrically conductive traces connecting the plurality of vias with the plurality of through-holes to define eight separate signal paths; and first, second, third, and fourth layers, at least a first portion of the traces being positioned on the first layer, at least a second portion of the traces being positioned on the fourth layer, a first conductive plane being positioned on the second layer, a second conductive plane being positioned on the third layer.

20. The substrate of claim 19, wherein the first and second conductive planes are electrically coupled to one another.

21. The substrate of claim 19, wherein the third layer comprises a second capacitor plate connected to a second one of the plurality of vias, a fourth capacitor plate connected to a fourth one of the plurality of vias, a sixth capacitor plate connected to a sixth one of the plurality of vias, and a first capacitor plate connected to the sixth via, the second layer comprises a third capacitor plate connected to a third one of the plurality of vias, an eighth capacitor plate connected to the third via, a fifth capacitor plate connected to a fifth one of the plurality of vias, and a seventh capacitor plate connected to a seventh one of the plurality of vias, the second capacitor plate on the third layer and the third capacitor plate on the second layer forming a first capacitor, the fourth capacitor plate on the third layer and the eighth capacitor plate on the second layer forming a second capacitor, the sixth capacitor plate on the third layer and the fifth capacitor plate on the second layer forming a third capacitor, and the first capacitor plate on the third layer and the seventh capacitor plate on the second layer forming a fourth capacitor.

22. The substrate of claim 19, wherein the second layer comprises a second capacitor plate connected to a second one of the plurality of vias, a fourth capacitor plate connected to a fourth one of the plurality of vias, a sixth capacitor plate connected to a sixth one of the plurality of vias, and a first capacitor plate connected to the sixth via, the third layer comprises a third capacitor plate connected to a third one of the plurality of vias, an eighth capacitor plate connected to the third via, a fifth capacitor plate connected to a fifth one of the plurality of vias, and a seventh capacitor plate connected to a seventh one of the plurality of vias, the second capacitor plate on the second layer and the third capacitor plate on the third layer forming a first capacitor, the fourth capacitor plate on the second layer and the eighth capacitor plate on the third layer forming a second capacitor, the sixth capacitor plate on the second layer and the fifth capacitor plate on the third layer forming a third capacitor, and the first capacitor plate on the second layer and the seventh capacitor plate on the third layer forming a fourth capacitor.

23. The substrate of claim 19, wherein the first conductive plane comprises first and second portions, and the first portion is separate and spaced apart from the second portion.

24. The substrate of claim 19, wherein the traces are positioned only on the first and fourth layers.

25. The substrate of claim 19, wherein the first layer comprises a first capacitor capacitively coupling third and sixth ones of the signal paths together, and the fourth layer comprises a second capacitor capacitively coupling fourth and fifth ones of the signal paths together.

26. The substrate of claim 19, wherein the second layer comprises a capacitor capacitively coupling fourth and fifth ones of the signal paths together.

* * * * *